(12) United States Patent
Atanackovic et al.

(10) Patent No.: US 10,153,395 B2
(45) Date of Patent: Dec. 11, 2018

(54) ADVANCED ELECTRONIC DEVICE STRUCTURES USING SEMICONDUCTOR STRUCTURES AND SUPERLATTICES

(71) Applicant: Silanna UV Technologies Pte Ltd, Singapore (SG)

(72) Inventors: Petar Atanackovic, Henley Beach South (AU); Matthew Godfrey, Sydney (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 0 days.

(21) Appl. No.: 15/853,379

(22) Filed: Dec. 22, 2017

(65) Prior Publication Data

US 2018/0122985 A1    May 3, 2018

Related U.S. Application Data

(60) Division of application No. 15/601,890, filed on May 22, 2017, now Pat. No. 9,871,165, which is a division
(Continued)

(30) Foreign Application Priority Data

May 27, 2014    (AU) .................................. 2014902008

(51) Int. Cl.
*H01L 33/06* (2010.01)
*H01L 27/15* (2006.01)
(Continued)

(52) U.S. Cl.
CPC .......... *H01L 33/06* (2013.01); *H01L 21/0242* (2013.01); *H01L 21/0251* (2013.01);
(Continued)

(58) Field of Classification Search
CPC combination set(s) only.
See application file for complete search history.

(56) References Cited

U.S. PATENT DOCUMENTS

| 732,956 A | 7/1903 | Palmer |
|---|---|---|
| 4,972,246 A | 11/1990 | Brodsky et al. |

(Continued)

FOREIGN PATENT DOCUMENTS

| CN | 102208511 A | 10/2011 |
|---|---|---|
| CN | 102534764 A | 7/2012 |

(Continued)

OTHER PUBLICATIONS

Bulashevich and Karpov, Heterojunctions between group-III nitride short-period superlattices, Phys. Stat. Solid. (c), Apr. 2005, 2(7) pp. 2394-8.

(Continued)

*Primary Examiner* — Telly Green
(74) *Attorney, Agent, or Firm* — The Mueller Law Office, P.C.

(57) ABSTRACT

Semiconductor structures and methods for forming those semiconductor structures are disclosed. For example, a p-type or n-type semiconductor structure is disclosed. The semiconductor structure has a polar crystal structure with a growth axis that is substantially parallel to a spontaneous polarization axis of the polar crystal structure. The semiconductor structure changes in composition from a wider band gap (WBG) material to a narrower band gap (NBG) material or from a NBG material to a WBG material along the growth axis to induce p-type or n-type conductivity.

4 Claims, 41 Drawing Sheets

Related U.S. Application Data of application No. 14/976,337, filed on Dec. 21, 2015, now Pat. No. 9,691,938, which is a continuation of application No. PCT/IB2015/053203, filed on May 1, 2015.

(51) Int. Cl.
*H01L 33/10* (2010.01)
*H01L 33/14* (2010.01)
*H01L 21/02* (2006.01)
*H01L 33/00* (2010.01)
*H01L 33/16* (2010.01)
*H01L 33/32* (2010.01)
*H01L 33/18* (2010.01)

(52) U.S. Cl.
CPC .... *H01L 21/0254* (2013.01); *H01L 21/02381* (2013.01); *H01L 21/02389* (2013.01); *H01L 21/02458* (2013.01); *H01L 21/02472* (2013.01); *H01L 21/02483* (2013.01); *H01L 21/02507* (2013.01); *H01L 21/02554* (2013.01); *H01L 21/02565* (2013.01); *H01L 27/15* (2013.01); *H01L 33/007* (2013.01); *H01L 33/10* (2013.01); *H01L 33/14* (2013.01); *H01L 33/16* (2013.01); *H01L 33/18* (2013.01); *H01L 33/32* (2013.01)

(56) References Cited

U.S. PATENT DOCUMENTS

| | | | |
|---|---|---|---|
| 5,060,030 A | 10/1991 | Hoke | |
| 5,248,890 A | 9/1993 | Luth et al. | |
| 5,932,899 A | 8/1999 | Schubert | |
| 6,266,355 B1 | 7/2001 | Sverdlov | |
| 6,546,034 B2 | 4/2003 | Komori et al. | |
| 6,593,589 B1 | 7/2003 | Osinski et al. | |
| 6,920,167 B2 | 7/2005 | Hoshi et al. | |
| 6,921,924 B2 | 7/2005 | Tsai et al. | |
| 6,958,497 B2 | 10/2005 | Emerson et al. | |
| 6,995,389 B2 | 2/2006 | Kim et al. | |
| 7,015,515 B2 | 3/2006 | Taki et al. | |
| 7,148,519 B2 | 12/2006 | Wu et al. | |
| 7,193,246 B1 | 3/2007 | Tanizawa et al. | |
| 7,265,374 B2 | 9/2007 | Lee et al. | |
| 7,498,182 B1 | 3/2009 | Sampath et al. | |
| 7,547,925 B2 | 6/2009 | Wong et al. | |
| 7,566,580 B2 | 7/2009 | Keller et al. | |
| 7,576,363 B2 | 8/2009 | Uemura et al. | |
| 7,807,917 B2 | 10/2010 | Atanackovic | |
| 7,825,418 B2 | 11/2010 | Chen | |
| 7,901,994 B2 | 3/2011 | Saxler et al. | |
| 7,910,935 B2 | 3/2011 | Seong | |
| 8,000,366 B2 | 8/2011 | Bour et al. | |
| 8,030,684 B2 | 10/2011 | Hu et al. | |
| 8,088,637 B1 | 1/2012 | Wong et al. | |
| 8,362,503 B2 | 1/2013 | Saxler et al. | |
| 8,405,064 B2 | 3/2013 | Yamaguchi et al. | |
| 8,421,107 B2 | 4/2013 | Shinohara et al. | |
| 8,426,887 B2 | 4/2013 | Son | |
| 8,507,357 B2 | 8/2013 | Lin et al. | |
| 8,518,806 B2 | 8/2013 | Okuno et al. | |
| 8,581,232 B2 | 11/2013 | Kim | |
| 8,592,841 B2 | 11/2013 | Nakamura et al. | |
| 8,633,468 B2 | 1/2014 | Gaska et al. | |
| 9,240,517 B2 | 1/2016 | Johnston et al. | |
| 9,240,533 B2 | 1/2016 | Lee et al. | |
| 9,246,311 B1 | 1/2016 | Raring et al. | |
| 9,252,329 B2 | 2/2016 | Northrup et al. | |
| 9,269,788 B2 | 2/2016 | Gaska et al. | |
| 9,281,439 B2 | 3/2016 | Niwa et al. | |
| 9,281,441 B2 | 3/2016 | Shur et al. | |
| 9,281,445 B2 | 3/2016 | Donofrio | |
| 9,287,442 B2 | 3/2016 | Shatalov et al. | |
| 9,287,449 B2 | 3/2016 | Gaska et al. | |
| 9,287,455 B2 | 3/2016 | Shur et al. | |
| 9,293,670 B2 | 3/2016 | Toita et al. | |
| 9,299,880 B2 | 3/2016 | Grandusky et al. | |
| 9,312,428 B2 | 4/2016 | Shatalov et al. | |
| 9,312,448 B2 | 4/2016 | Lunev et al. | |
| 9,318,650 B2 | 4/2016 | Zhang | |
| 9,318,652 B1 | 4/2016 | Liao et al. | |
| 9,330,906 B2 | 5/2016 | Shatalov et al. | |
| 9,331,240 B2 | 5/2016 | Khan et al. | |
| 9,331,244 B2 | 5/2016 | Shatalov et al. | |
| 9,331,246 B2 | 5/2016 | Kneissl et al. | |
| 9,337,387 B2 | 5/2016 | Shatalov et al. | |
| 9,356,192 B2 | 5/2016 | Pernot et al. | |
| 9,368,580 B2 | 6/2016 | Shatalov et al. | |
| 9,368,582 B2 | 6/2016 | Kizilyalli et al. | |
| 9,385,271 B2 | 7/2016 | Shur et al. | |
| 9,397,260 B2 | 7/2016 | Jain et al. | |
| 9,397,269 B2 | 7/2016 | Chae et al. | |
| 9,401,452 B2 | 7/2016 | Northrup et al. | |
| 9,401,456 B2 | 7/2016 | Lee et al. | |
| 9,412,901 B2 | 8/2016 | Shur et al. | |
| 9,412,902 B2 | 8/2016 | Shatalov et al. | |
| 9,412,922 B2 | 8/2016 | Jang et al. | |
| 9,437,430 B2 | 9/2016 | Schowalter et al. | |
| 9,437,774 B2 | 9/2016 | Gaska et al. | |
| 9,437,775 B2 | 9/2016 | Takeuchi et al. | |
| 9,444,224 B2 | 9/2016 | Chua et al. | |
| 9,450,157 B2 | 9/2016 | Yamada et al. | |
| 9,455,300 B1 | 9/2016 | Collins et al. | |
| 9,461,198 B2 | 10/2016 | Liao et al. | |
| 9,466,761 B2 | 10/2016 | Choi et al. | |
| 9,468,695 B2 | 10/2016 | Liao et al. | |
| 9,496,455 B2 | 11/2016 | Park et al. | |
| 9,502,509 B2 | 11/2016 | Shatalov et al. | |
| 9,502,606 B2 | 11/2016 | Pernot et al. | |
| 2002/0149033 A1 | 10/2002 | Wojtowicz | |
| 2003/0205711 A1 | 11/2003 | Tanizawa et al. | |
| 2004/0004223 A1 | 1/2004 | Nagahama et al. | |
| 2005/0029506 A1 | 2/2005 | Lee et al. | |
| 2005/0104088 A1 | 5/2005 | Niwa | |
| 2005/0156183 A1 | 7/2005 | Tsai et al. | |
| 2006/0108603 A1 | 5/2006 | Uemura et al. | |
| 2007/0158640 A1 | 7/2007 | Halilov et al. | |
| 2008/0002750 A1 | 1/2008 | Onishi et al. | |
| 2008/0054248 A1 | 3/2008 | Chua et al. | |
| 2008/0112452 A1 | 5/2008 | Chakraborty et al. | |
| 2008/0295879 A1 | 12/2008 | Atanackovic | |
| 2009/0045392 A1 | 2/2009 | Park et al. | |
| 2009/0194784 A1 | 8/2009 | Kaji et al. | |
| 2010/0213436 A1 | 8/2010 | Khan | |
| 2010/0276710 A1 | 11/2010 | Sampath et al. | |
| 2011/0180778 A1 | 7/2011 | Lin et al. | |
| 2011/0193063 A1 | 8/2011 | Mears et al. | |
| 2011/0235665 A1 | 9/2011 | Simon et al. | |
| 2012/0037881 A1 | 2/2012 | Kim et al. | |
| 2012/0068152 A1 | 3/2012 | Hwang et al. | |
| 2012/0091435 A1 | 4/2012 | Ikuta et al. | |
| 2012/0104360 A1 | 5/2012 | Hardy et al. | |
| 2012/0145991 A1 | 6/2012 | Nam et al. | |
| 2012/0175589 A1 | 7/2012 | Ooshika et al. | |
| 2012/0201264 A1 | 8/2012 | Shatalov et al. | |
| 2012/0313076 A1 | 12/2012 | Nakamura et al. | |
| 2012/0313077 A1 | 12/2012 | Nakamura et al. | |
| 2013/0026480 A1 | 1/2013 | Fenwick et al. | |
| 2013/0026482 A1 | 1/2013 | Fenwick | |
| 2013/0043458 A1 | 2/2013 | Chen et al. | |
| 2013/0048939 A1 | 2/2013 | Zhang et al. | |
| 2013/0082274 A1 | 4/2013 | Yang et al. | |
| 2013/0221320 A1 | 8/2013 | Li et al. | |
| 2013/0285065 A1 | 10/2013 | Zhu et al. | |
| 2013/0299778 A1 | 11/2013 | Okuno et al. | |
| 2013/0320296 A1 | 12/2013 | Yu et al. | |
| 2014/0024159 A1 | 1/2014 | Jain | |

(56) References Cited

U.S. PATENT DOCUMENTS

| | | |
|---|---|---|
| 2014/0084241 A1 | 3/2014 | Okuno et al. |
| 2016/0163920 A1 | 6/2016 | Atanackovic |

FOREIGN PATENT DOCUMENTS

| | | |
|---|---|---|
| CN | 102569484 A | 7/2012 |
| CN | 103682002 A | 3/2014 |
| CN | 102945902 B | 12/2014 |
| EP | 1065705 A2 | 1/2001 |
| EP | 1301947 B1 | 9/2007 |
| EP | 2037509 A1 | 3/2009 |
| EP | 2362437 A1 | 8/2011 |
| JP | S6027692 A | 2/1985 |
| JP | 2002540618 A | 11/2002 |
| JP | 2006261688 A | 9/2006 |
| JP | 2010021576 A | 1/2010 |
| JP | 2010287882 A | 12/2010 |
| JP | 2012164749 | 8/2012 |
| JP | 2005150531 A | 6/2015 |
| KR | 1020080060053 A | 7/2008 |
| TW | 201320390 A1 | 5/2013 |
| WO | 2004008552 A2 | 1/2004 |
| WO | 2012067687 A2 | 5/2012 |
| WO | 2013096821 A1 | 6/2013 |

OTHER PUBLICATIONS

Chiou et at., The Effect of the Intrinsic Layer on Reliability of Nitride-based p-i-n Photodetectors, Optical Fiber Communication & Optoelectronic Exposition & Conference, 2008. AOE 2008. Asia, Oct. 2008, pp. 1-3.

III-Nitride Based Optoelectronics, Final Report, Northwestern University, Jan. 2010, 64 pages.

International Preliminary Report on Patentability dated Dec. 8, 2016 for PCT Patent Application No. PCT/IB2015/053203.

International Search Report and Written Opinion dated Aug. 13, 2015 for PCT Patent Application No. PCT/IB2015/053179.

International Search Report and Written Opinion dated Jul. 23, 2015 for PCT Patent Application No. PCT/IB2015/053203.

International Search Report and Written Opinion dated Jul. 9, 2015 for PCT Patent Application No. PCT/IB2015/052480.

Jawagi, Study of Analytical Determination of Parasitic Resistances in Gallium Nitride (GaN) MESFETs, California State University, Northridge, May 2012, 78 pages.

Jena et al., Polarization-Engineering in III-V Nitride Heterostructures: New Opportunities for Device Design, Dec. 3, 2011, Phys. Status Solidi A, 208: 1511-1516, pp. 1-7.

Katsumasa et al., Structural Design of AlN/GaN Superlattices for Deep-Ultraviolet Light-Emitting Diodes with High Emission Efficiency, Applied Physics Letters 99, 151108, Oct. 2011, 3 pages.

Kipshidze, et al., AlN/AlGaInN superlattice light-emitting diodes at 280 nm, J. Appl. Phys. 93(3), Feb. 2003, pp. 1363-1366.

Nikishin et al., Deep Ultraviolet Light Emitting Diodes Based on Short Period Superlattices of AlN/AlGa(In)N, Jpn. J. Appl. Phys. 42, Nov. 2003, pp. L 1362-L 1365.

Nikishin et al., Digital Alloys of AlN/AlGaN for Deep UV Light Emitting Diodes, Jpn. J. Appl. Phys. 44(10), Oct. 2005, pp. 7221-7226.

Notice of Allowance dated Feb. 21, 2017 for U.S. Appl. No. 14/976,208.

Notice of Allowance dated Mar. 1, 2017 for U.S. Appl. No. 14/976,337.

Notice of Allowance dated Sep. 18, 2017 for U.S. Appl. No. 15/601,890.

Office Action dated Jun. 9, 2016 for U.S. Appl. No. 14/976,208.

Office Action dated Nov. 3, 2016 for U.S. Appl. No. 14/976,208.

Restriction Requirement dated Nov. 28, 2016 for U.S. Appl. No. 14/976,337.

Saengkaew, Epitaxial growth and properties of AlGaN-based UV-LEDs on Si(111) substrates, Mar. 2010, 227 pages.

Simon, Polarization-Engineered III-V Nitride Heterostructure Devices by Molecular Beam Epitaxy, University of Notre Dame, Apr. 2009, 140 pages.

Taniyasu et al, Aluminum Nitride Deep-Ultraviolet Light-Emitting Diodes, NTT Technical Review, Dec. 2006, vol. 4, No. 12, pp. 54-58.

Taniyasu et al., An aluminium nitride light-emitting diode with a wavelength of 210 nanometres, Nature 441, 325-328 May 18, 2006, pp. 1-6. Accessed on Aug. 22, 2013, file://S:\CJP\LETTERS.htm.

Wang, A Gadolinium Doped Superlattice GaN Schottky Diode for Neutron Detection, Transactions of the American Nuclear Society, vol. 104, Hollywood, Florida, Jun. 26-30, 2011.

Yoo, Growth and Characterization of III-Nitrides Materials System for Photonic and Electronic Devices by Metalorganic Chemical Vapor Deposition, Georgia Institute of Technology, Aug. 2007, 173 pages.

Office Action dated Mar. 9, 2018 for U.S. Appl. No. 15/594,015.

Chung, J.W., E.L. Piner, and T. Palacios, "N-Face GaN/AlGaN HEMTs Fabricated Through Layer Transfer Technology.", Electron Device Letters, IEEE 30.2 (Feb. 2009): 113-116. © 2009 Institute of Electrical and Electronics Engineers.

Nath et al., "Molecular beam epitaxy of N-polar InGaN," Aug. 2010, Applied Physics Letters 97, 071903.

Notice of Allowance dated Jul. 3, 2018 for U.S. Appl. No. 15/594,015.

Office Action dated Jul. 27, 2018 for U.S. Appl. No. 14/976,814.

Office Action dated Jun. 25, 2018 for China Patent Application Serial No. 201580027680.9.

Office Action dated May 9, 2018 for People's Republic of China Patent Application No. 201580027679.6.

Park et al, "Spontaneous polarization effects in wurtzite GaN/AlGaN quantum wells and comparison with experiment," Apr. 2000, Appl. Phys. Lett. 76, pp. 1981-1983.

Pereira et al., "Strain and composition distributions in wurtzite InGaN/GaN layers extracted from x-ray reciprocal space mapping," May 2002, Appl. Phys. Lett. 80, pp. 3913-3915.

Smith et al., "Determination of Wurtzite GaN Lattice Polarity Based on Surface Reconstruction", Feb. 1998, Appl. Phys. Lett., 72, 2114, pp. 1-7.

Wang et al., A Gadolinium Doped Superlattice GaN Schottky Diode for Neutron Detection, Innovation in Radiation Detectors: New Designs, Improvements, and Applications, Jun. 26-30, 2011, 209-210, vol. 104, Transactions of the American Nuclear Society, Hollywood, Florida.

Official Letter and Search report dated Aug. 2, 2018 for Taiwan Patent App. No. 104116463.

Official Letter and Search report dated Jul. 30, 2018 for Taiwan Patent App. No. 104116670.

Office Action dated Aug. 20, 2018 for Taiwan Patent Application Serial No. 104113397.

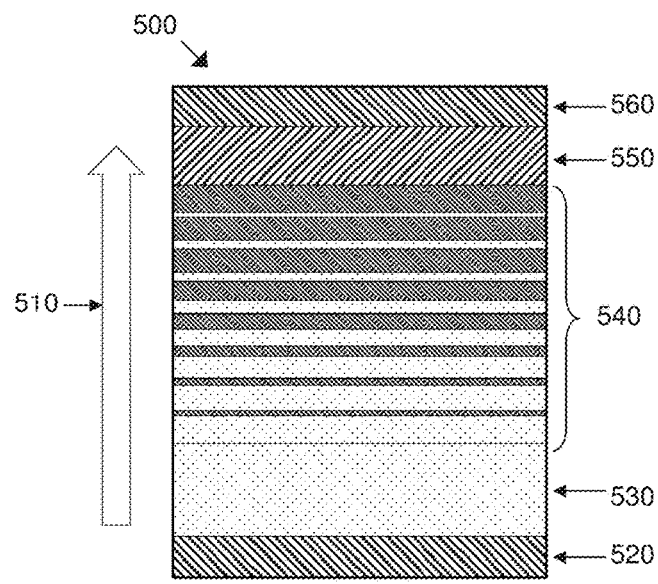
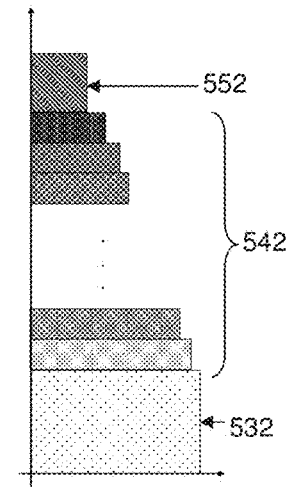
FIGURE 5A  FIGURE 5B
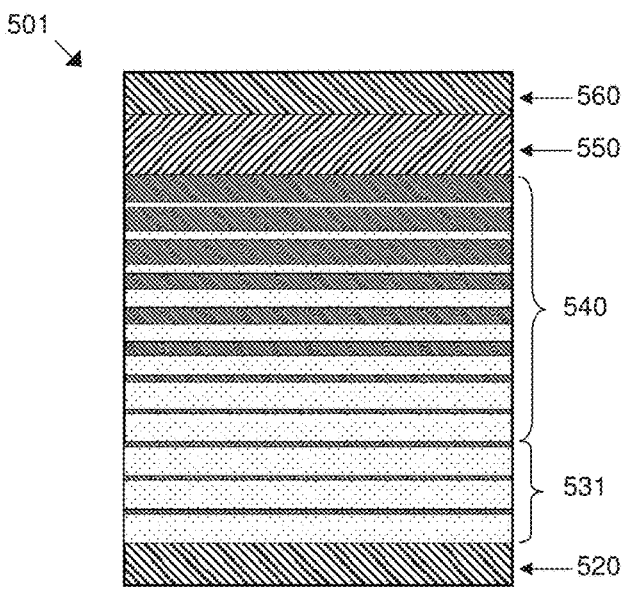
FIGURE 5C

ADVANCED ELECTRONIC DEVICE STRUCTURES USING SEMICONDUCTOR STRUCTURES AND SUPERLATTICES

CROSS-REFERENCE TO RELATED APPLICATION

This application is a divisional of U.S. patent application Ser. No. 15/601,890, filed May 22, 2017, which is a divisional of U.S. patent application Ser. No. 14/976,337, filed Dec. 21, 2015, which is a continuation of International Patent Application number PCT/IB2015/053203, filed May 1, 2015, which claims priority from Australian Provisional Patent Application number 2014902008 filed on May 27, 2014 and entitled "Advanced Electronic Device Structures Using Semiconductor Structures and Superlattices", which are all incorporated herein by reference in their entirety.

FIELD OF THE INVENTION

The invention relates generally to advanced electronic device structures, typically using polar III-N semiconductor structures and superlattices. In particular, the invention relates, but is not limited, to semiconductor structures that are particularly suited to light emitting diode (LED) structures, preferably for ultraviolet (UV) and deep UV (DUV) LEDs operating in the wavelength range of 190-280 nm. Although the invention is primarily described with reference to UV and DUV LEDs, it will be appreciated that these are preferred applications only, and that other applications may be apparent to persons skilled in the art.

BACKGROUND TO THE INVENTION

Wide band gap semiconductors, such as Aluminium-Gallium-Nitride (AlGaN) have a well known limitation of poor conductivity p-type or n-type creation, especially for p-type materials using an impurity atom substitutional doping method. At present the highest p-type acceptor density is achieved in p-GaN, with a substantial reduction in available hole concentrations with increasing band gap as the aluminium mole fraction is increased. This limits DUV LED development in relation to achieving electronic grade high n-type and p-type donor and acceptor concentrations in sufficiently wide band gap compositions of, for example, AlGaN, and more generally AlGaInN semiconductors.

DUV LEDs typically achieve light emission by advantageous spatial recombination of electrons and holes within a direct band gap crystalline structure. They fundamentally operate as a two electrical port device and are built from at least one of a p-i-n or p-n heterojunction diode with the emission region confined substantially to a region between the p-type and n-type regions. If the emission energy is smaller than the bandgap energy of at least one of the p-type and n-type cladding layers comprising the diode, then the photocarrier generated light can escape from within the device.

SUMMARY OF INVENTION

P-type doping limitations in III-N device development are one of the greatest restraints in developing commercially viable DUV LEDs. Accordingly, there is a need for improved impurity dopants, especially for p-type characteristics in III-N materials.

In one form, although it need not be the only or indeed the broadest form, there is provided a method of forming a p-type or n-type semiconductor structure. The method comprises:

growing along a growth axis a semiconductor having a polar crystal structure, the growth axis being substantially parallel to a spontaneous polarization axis of the crystal structure; and changing the composition of the semiconductor monotonically from a wider band gap (WBG) material to a narrower band gap (NBG) material or from a NBG material to a WBG material along the growth axis to induce p-type or n-type conductivity.

Preferably, the composition of the semiconductor comprises: at least two types of metal atom cation; and a non-metal atom anion.

Preferably, the non-metal atom anion is nitrogen or oxygen.

Preferably, changing the composition of the semiconductor comprises: changing a molar fraction of one or more of the at least two types of metal atom cation in the composition along the growth axis.

Preferably, the p-type conductivity is induced by:

growing the semiconductor with a cation-polar crystal structure and changing the composition of the semiconductor monotonically from a WBG material to a NBG material along the growth axis; or growing the semiconductor with an anion-polar crystal structure and changing the composition of the semiconductor monotonically from a NBG material to a WBG material along the growth axis.

Preferably, the n-type conductivity is induced by:

growing the semiconductor with a cation-polar crystal structure and changing the composition of the semiconductor monotonically from a NBG material to a WBG material along the growth axis; or growing the semiconductor with an anion-polar crystal structure and changing the composition of the semiconductor monotonically from a WBG material to a NBG material along the growth axis.

Preferably, the polar crystal structure is a polar wurtzite crystal structure.

Preferably, the composition of the semiconductor is changed in a continuous manner or a stepwise manner along the growth axis.

Suitably, the composition of the semiconductor is selected from group-III metal nitride compositions.

Suitably, the composition of the semiconductor is selected from the following: aluminium gallium nitrides ($Al_xGa_{1-x}N$) where $0 \leq x \leq 1$; aluminium gallium indium nitrides ($Al_xGa_yIn_{1-x-y}N$) where $0 \leq x \leq 1$, $0 \leq y \leq 1$ and $0 \leq (x+y) \leq 1$; and magnesium zinc oxides ($Mg_xZn_{x-1}O$) where $0 \leq x \leq 1$.

Suitably, the method further comprises: including impurity dopants in the composition of the semiconductor to enhance the induced p-type or n-type conductivity.

In another form, there is provided a method of forming a p-type or n-type semiconductor superlattice comprising a plurality of unit cells each comprising at least two distinct layers formed of a substantially single crystal semiconductor. The method comprises:

growing along a growth axis the superlattice having a polar crystal structure, the growth axis being substantially parallel to a spontaneous polarization axis of the crystal structure; and changing an average composition of the unit cells of the superlattice monotonically from an average composition corresponding to a wider band gap (WBG) material to an average composition corresponding to a narrower band gap (NBG) material or from an average composition corresponding to a NBG material to an average composition corresponding to a WBG material along the growth axis to induce p-type or n-type conductivity.

Preferably, the p-type conductivity is induced by:

growing the superlattice with a cation-polar crystal structure and changing the average composition of the unit cells monotonically from an average composition corresponding to a WBG material to an average composition corresponding to a NBG material along the growth axis; or growing the superlattice with an anion-polar crystal structure and changing the average composition of the unit cells monotonically from an average composition corresponding to a NBG material to an average composition corresponding to a WBG material along the growth axis.

Preferably, the n-type conductivity is induced by:

growing the superlattice with a cation-polar crystal structure and changing the average composition of the unit cells monotonically from an average composition corresponding to a NBG material to an average composition corresponding to a WBG material along the growth axis; or growing the superlattice with an anion-polar crystal structure and changing the average composition of the unit cells monotonically from an average composition corresponding to a WBG material to an average composition corresponding to a NBG material along the growth axis.

Preferably, the anion-polar crystal structure is a nitrogen-polar crystal structure or an oxygen-polar crystal structure.

Preferably, the cation-polar crystal structure is a metal-polar crystal structure.

Preferably, the average composition of the unit cells is changed in a continuous manner or a stepwise manner along the growth axis.

Suitably, the average composition of the unit cells is changed by changing a thickness of one or more of the at least two distinct layers of the unit cells.

Suitably, a thickness of the unit cells is constant along the growth axis.

Suitably, a composition of one or more of the at least two distinct layers of the unit cells is selected from the following:
gallium nitride (GaN);
aluminium nitride (AlN);
aluminium gallium nitride ($Al_xGa_{1-x}N$) where $0 \leq x \leq 1$;
boron aluminium nitride $B_xAl_{1-x}N$ where $0 \leq x \leq 1$; and
aluminium gallium indium nitride ($Al_xGa_yIn_{1-x-y}N$) where $0 \leq x \leq 1$, $0 \leq y \leq 1$ and $0 \leq (x+y) \leq 1$.

Suitably, a composition of one or more of the at least two distinct layers of the unit cells is selected from the following:
magnesium oxide (MgO);
zinc oxide (ZnO); and
magnesium zinc oxide ($Mg_xZn_{1-x}O$) where $0 \leq x \leq 1$.

Preferably, the at least two distinct layers of each unit cell each have a thickness that is less than the de Broglie wavelength of a charge carrier in the respective layer.

Preferably, the at least two distinct layers of each unit cell each have a thickness that is less than or equal to a critical layer thickness required to maintain elastic strain.

Suitably, the method further comprises: including impurity dopants in one or more of the least two distinct layers of each unit cell to enhance the induced p-type or n-type conductivity.

In another form, there is provided a method of forming a complex semiconductor structure. The method comprises: forming two or more contiguous semiconductor structures and/or semiconductor superlattices, wherein the semiconductor structures and/or semiconductor superlattices are each formed according to a method previously described herein.

Suitably, the method of forming a complex semiconductor structure further comprises flipping the polarity-type of the material between two of the two or more contiguous semiconductor structures and/or semiconductor superlattices.

Suitably, a first of the two or more contiguous semiconductor structures and/or semiconductor superlattices has a larger change in composition along the growth axis and a second of the two or more contiguous semiconductor structures and/or semiconductor superlattices has a smaller change in composition along the growth axis.

Suitably, a first of the two or more contiguous semiconductor structures and/or semiconductor superlattices induces a heavy p-type conductivity, and a second of the two or more contiguous semiconductor structures and/or semiconductor superlattices induces a light p-type conductivity.

In another form, there is provided a method of forming a light emitting diode (LED) structure. The method comprises:

growing along a growth axis, between a wider band gap (WBG) n-type region and a narrower band gap (NBG) p-type region, a semiconductor structure having a polar crystal structure in which a spontaneous polarization axis is parallel to the growth axis, the semiconductor structure comprising a semiconductor that changes in composition monotonically from a wider band gap (WBG) material adjacent the WBG n-type region to a narrower band gap (NBG) material adjacent the NBG p-type region.

In another form, there is provided a method of forming a light emitting diode (LED) structure. The method comprises:

growing along a growth axis, between a wider band gap (WBG) n-type region and a narrower band gap (NBG) p-type region, a superlattice comprising a plurality of unit cells each comprising at least two distinct layers formed of a substantially single crystal semiconductor, the superlattice having a polar crystal structure in which a spontaneous polarization axis is parallel to the growth axis, and the unit cells changing in average composition monotonically from an average composition corresponding to a wider band gap (WBG) material in a unit cell adjacent the WBG n-type region to an average composition corresponding to a narrower band gap (NBG) material in a unit cell adjacent the NBG p-type region.

Preferably, a buffer or dislocation filter region is grown on a substrate preceding the WBG n-type region or NBG p-type region.

Suitably, the substrate is selected as a sapphire ($Al_2O_3$) substrate or an aluminium nitride (AlN) substrate if the WBG n-type region is grown before the NBG p-type region; or the substrate is selected as a silicon substrate or a gallium nitride (GaN) substrate if the NBG p-type region is grown before the WBG n-type region.

In another form, there is provided a p-type or n-type semiconductor structure formed in accordance with a method previously described herein.

In another form, there is provided a p-type or n-type semiconductor superlattice formed in accordance with a method previously described herein.

In another form, there is provided a complex semiconductor structure formed in accordance with a method previously described herein.

In another form, there is provided a light emitting diode (LED) structure formed in accordance with a method previously described herein.

In another form, there is provided a p-type or n-type semiconductor structure having a polar crystal structure with a growth axis that is substantially parallel to a spontaneous polarization axis of the polar crystal structure, the semiconductor structure changing in composition monotonically from a wider band gap (WBG) material to a narrower band gap (NBG) material or from a NBG material to a WBG material along the growth axis to induce p-type or n-type conductivity.

In another form, there is provided a p-type or n-type semiconductor superlattice comprising a plurality of unit cells each comprising at least two distinct layers formed of a substantially single crystal semiconductor, the superlattice having a polar crystal structure with a growth axis being substantially parallel to a spontaneous polarization axis of the polar crystal structure, the average composition of the unit cells of the superlattice changing monotonically from an average composition corresponding to a wider band gap (WBG) material to an average composition corresponding to a narrower band gap (NBG) material or from an average composition corresponding to a NBG material to an average composition corresponding to a WBG material along the growth axis to induce p-type or n-type conductivity.

In another form, there is provided a complex semiconductor structure comprising two or more contiguous semiconductor structures and/or semiconductor superlattices previously described herein.

In another form, there is provided a light emitting diode (LED) structure comprising: a semiconductor structure formed between a wider band gap (WBG) n-type region and a narrower band gap (NBG) p-type region, the semiconductor structure having a polar crystal structure in which a spontaneous polarization axis is parallel to the growth axis of the crystal structure, and the semiconductor structure comprising a semiconductor that changes in composition monotonically from a wider band gap (WBG) material adjacent the WBG n-type region to a narrower band gap (NBG) material adjacent the NBG p-type region.

In another form, there is provided a light emitting diode (LED) structure comprising: a superlattice formed between a wider band gap (WBG) n-type region and a narrower band gap (NBG) p-type region, the superlattice comprising a plurality of unit cells each comprising at least two distinct layers formed of a substantially single crystal semiconductor, the superlattice having a polar crystal structure in which a spontaneous polarization axis is parallel to the growth axis of the crystal structure, and the unit cells changing in average composition monotonically from an average composition corresponding to a wider band gap (WBG) material in a unit cell adjacent the WBG n-type region to an average composition corresponding to a narrower band gap (NBG) material in a unit cell adjacent the NBG p-type region.

In another form, there is provided a semiconductor structure comprising:
  a p-type superlattice region;
  an i-type superlattice region; and
  an n-type superlattice region;
  wherein at least one of the p-type superlattice region, the i-type superlattice region and the n-type superlattice region comprises a monotonic change in average composition from an average composition corresponding to a wider band gap (WBG) material to an average composition corresponding to a narrower band gap (NBG) material, or from an average composition corresponding to a NBG material to an average composition corresponding to a WBG material, such that there are no abrupt changes in polarisation at the interfaces between each region.

Preferably, the semiconductor structure further comprises a p-type GaN region adjacent the p-type superlattice region.

Further features and advantages of the present invention will become apparent from the following detailed description.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 5A illustrates a structure having a not-intentionally doped linearly chirped superlattice composition with a fixed period.

FIG. 5B illustrates a bandgap diagram for the structure illustrated in FIG. 5A.

FIG. 5C illustrates a variation of the structure illustrated in FIG. 5A.

Figure 1:
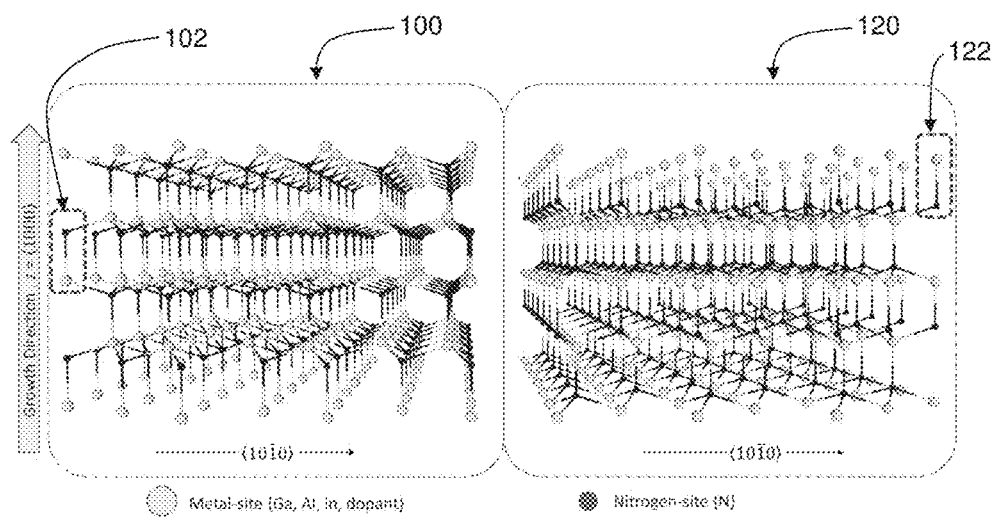
FIG. 1 illustrates a sectional view through slabs of wurtzitic group-III-metal-nitride crystals with either a metal polar orientation (on the left) or a nitrogen polar orientation (on the right).

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The components in the drawings have been represented where appropriate by conventional symbols, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE DRAWINGS

Generally, the present invention relates to growth of a semiconductor structure or a semiconductor superlattice that has a polar crystal structure, such as a wurtzite polar crystal structure, and is grown along a growth axis (growth direction), with a spontaneous polarization axis of the crystal structure substantially parallel to the growth axis. Such polar crystal structures are typically characterized as having a crystal lattice possessing a non-inversion symmetry, a spontaneous polarization axis and a distinct growth orientation when deposited along a polarization axis.

The superlattice comprises a plurality of unit cells each comprising at least two distinct layers formed of a substantially single crystal semiconductor. In preferred embodiments, the semiconductor superlattice is a short period superlattice (SPSL). Properties of the semiconductor structure or the semiconductor superlattice are engineered by changing a composition of a semiconductor in the semiconductor structure, or a bulk or an average composition of a unit cell of the superlattice, monotonically along the growth axis. Such a change in composition is also referred to herein as a grading pattern or grading region. For example, the composition of the semiconductor in the semiconductor structure or the average composition of the unit cells is changed in a continuous manner or a stepwise manner along the growth axis.

In preferred embodiments, the composition of the semiconductor comprises at least one type, and preferably at least two types, of metal atom cation and a non-metal atom anion. However, in some embodiments, the composition of the semiconductor comprises more than one type of non-metal atom anion. For example, the non-metal atom anion can be nitrogen or oxygen. In some embodiments, the composition of the semiconductor is changed by changing a molar fraction of one or more of the at least two types of metal atom cation in the composition along the growth axis. In some embodiments, the average composition of the unit cells in the superlattice is changed by changing a thickness of one or more of the at least two distinct layers of the unit cells. In preferred embodiments, the at least two distinct layers of each unit cell each have a thickness that is less than the de Broglie wavelength of a charge carrier, for example, an electron or a hole, in the respective layer. In preferred embodiments, the at least two distinct layers of each unit cell also each have a thickness that is less than or equal to a critical layer thickness required to maintain elastic strain.

In preferred embodiments, the composition of the semiconductor structure is changed monotonically from a wider band gap (WBG) material to a narrower band gap (NBG) material or from a NBG material to a WBG material along the growth axis. This can induce p-type or n-type conductivity and make the semiconductor structure p-type or n-type.

For example, p-type conductivity can be induced by growing the semiconductor with a cation-polar crystal structure, such as a metal-polar crystal structure, and changing the composition of the semiconductor monotonically from a WBG material to a NBG material along the growth axis. Alternatively, p-type conductivity can be induced by growing the semiconductor with an anion-polar crystal structure, such as a nitrogen-polar crystal structure or an oxygen-polar crystal structure, and changing the composition of the semiconductor monotonically from a NBG material to a WBG material along the growth axis.

For example, n-type conductivity can be induced by growing the semiconductor with a cation-polar crystal structure, such as a metal-polar crystal structure, and changing the composition of the semiconductor monotonically from a NBG material to a WBG material along the growth axis. Alternatively, n-type conductivity can be induced by growing the semiconductor with an anion-polar crystal structure, such as a nitrogen-polar crystal structure or an oxygen-polar crystal structure, and changing the composition of the semiconductor monotonically from a WBG material to a NBG material along the growth axis.

Similarly, in preferred embodiments, a semiconductor superlattice is engineered, for example to induce p-type or n-type conductivity, by changing an average composition of the unit cells of the superlattice monotonically from an average composition corresponding to a wider band gap (WBG) material to an average composition corresponding to a narrower band gap (NBG) material or from an average composition corresponding to a NBG material to an average composition corresponding to a WBG material along the growth axis.

For example, p-type conductivity can be induced by growing the superlattice with a cation-polar crystal structure, such as a metal-polar crystal structure, and changing the average composition of the unit cells monotonically from an average composition corresponding to a WBG material to an average composition corresponding to a NBG material along the growth axis. Alternatively, p-type conductivity can be induced by growing the superlattice with an anion-polar crystal structure, such as a nitrogen-polar crystal structure or an oxygen-polar crystal structure, and changing the average composition of the unit cells monotonically from an average composition corresponding to a NBG material to an average composition corresponding to a WBG material along the growth axis.

For example, n-type conductivity can be induced by growing the superlattice with a cation-polar crystal structure, such as a metal-polar crystal structure, and changing the average composition of the unit cells monotonically from an average composition corresponding to a NBG material to an average composition corresponding to a WBG material along the growth axis. Alternatively, n-type conductivity can be induced by growing the superlattice with an anion-polar crystal structure, such as a nitrogen-polar crystal structure or an oxygen-polar crystal structure, and changing the average composition of the unit cells monotonically from an average composition corresponding to a WBG material to an average composition corresponding to a NBG material along the growth axis.

A complex semiconductor structure, for example, for use in a semiconductor device, such as an LED, can be formed from two or more semiconductor structures and/or semiconductor superlattices. For example, a complex semiconductor structure can be formed by stacking two or more semiconductor structures and/or semiconductor superlattices contiguously on top of one another. If necessary, a polarity-type of the material can be flipped between two of the two or more contiguous semiconductor structures and/or semiconductor superlattices.

A light emitting diode (LED) structure can be formed using a grading region, for example, as an i-type region, between a WBG n-type region and a NBG p-type region and/or by using the grading region as an n-type region or a p-type region. In such a way, a light emitting diode (LED) structure can be formed such that there are no abrupt changes in polarisation at the interfaces between each region.

In preferred embodiments, the semiconductor structure or semiconductor superlattice is formed from Group-III metal nitride (III-N) compounds, for example, gallium nitride (GaN), aluminium nitride (AlN), aluminium gallium nitride ($Al_xGa_{1-x}N$) where $0 \le x \le 1$, boron aluminium nitride $B_xAl_{1-x}N$ where $0 \le x \le 1$; or aluminium gallium indium nitride ($Al_xGa_yIn_{1-x-y}N$) where $0 \le x \le 1$, $0 \le y \le 1$ and $0 \le (x+y) \le 1$. However, the semiconductor structure or semiconductor superlattice can be formed of other compounds, for example, magnesium oxide (MgO), zinc oxide (ZnO) and magnesium zinc oxide ($Mg_xZn_{1-x}O$) where $0 \le x \le 1$. In some embodiments, impurity dopants are also included in the composition of the semiconductor or in one or more of the least two distinct layers of each unit cell to enhance the induced p-type or n-type conductivity.

III-N compounds readily crystallize in stable hexagonal crystal structures classified as Wurtzite-type structures. These III-N wurtzite structures can be deposited on a substrate. For example, they can be deposited epitaxially on an atomically flat two-dimensional hexagonal crystal substrate surface that may be formed by an advantageously terminated plane of a 3-dimensional bulk crystal. Ideally, the substrate is atomically flat and composed of the topmost atomic layer of homogenous atomic species. Furthermore, the surface layer atom bonding type and in-plane lattice constant is commensurate with forming lattice matched or pseudomorphic epitaxial growth.

A distinguishing property of wurtzitic III-N crystals is the highly polar nature of the metal-nitrogen bond which forces asymmetry in the wurtzite crystal structure perpendicular to the substrate surface plane (often known as 'crystal-plane' or 'c-plane'). Depending upon the first atomic species (e.g. nitrogen or metal) forming the epitaxial layer on a nonnative crystal surface, there exists two unique and physically distinguishable wurtzite crystal orientations as shown in FIG. 1. The two crystal orientations shown in FIG. 1 are known as metal-polar 100 or nitrogen-polar 120 having metal-polar epitaxy 102 or nitrogen polar epitaxy 122, respectively.

The polarization effect within the crystal planes can be utilised to manipulate different properties in heterostructures for the present invention. Alternatively, wurtzite III-N (wz-III-N) bulk-like substrates or thick III-N film can be formed having a preferred crystalline polarity orientation relative to a direction perpendicular to the c-plane.

Figure 2:
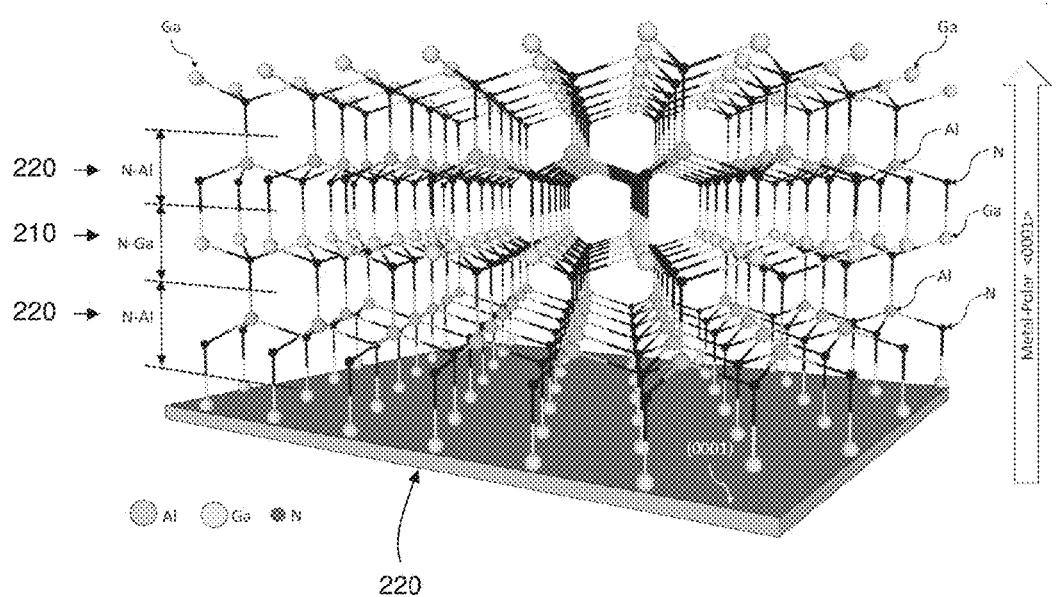
FIG. 2 illustrates a periodic structure for a metal-polar wurtzite structure representing an ordered bulk alloy or bilayered superlattice of equal AlN and GaN proportions.

An intentionally ordered pseudo-alloy can be formed using accurately controlled deposition processes to form monolayered (ML) or fractional monolayered films of, for example, GaN 210 and AlN 220 on a substrate 200 as shown in FIG. 2. An ideal superlattice formed using repetitive unit cells of 0.5 ML GaN 210 to 0.5 ML AlN 220 can form an ideal ordered $Al_{0.5}Ga_{0.5}N$ alloy as illustrated. It will be appreciated, however, that other layer thicknesses of GaN and AlN comprising the unit cell could also be deposited. The structure illustrated in FIG. 2 is considered ideal, exhibiting superior piezoelectric and pyroelectric polarization compared to an equivalent randomly arranged metal cations in a bulk alloy.

Figure 3A:
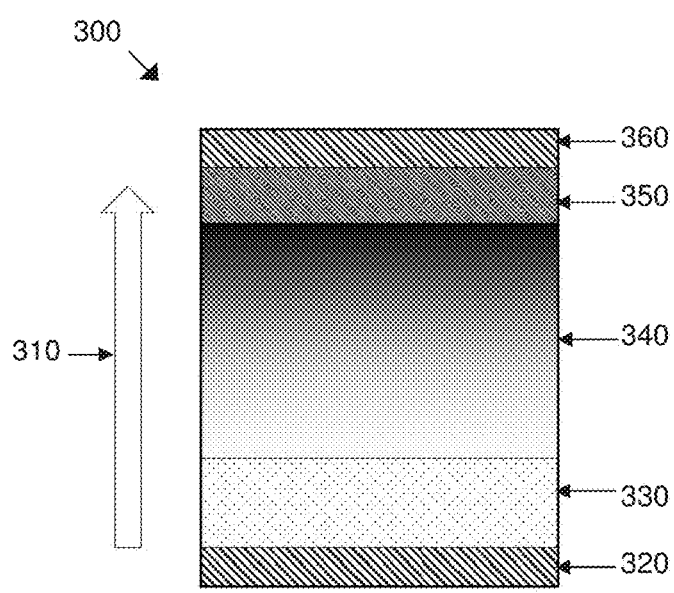
FIG. 3A illustrates a structure having a linear gradient region of bulk materials.

FIG. 3A illustrates a semiconductor structure in the form of a diode 300 formed with bulk-like materials. The diode 300 has, in order along a growth axis 310, a lower wurtzite metal layer 320 with a metal-polar growth including an n-type $Al_{0.8}Ga_{0.2}N$ WBG emitter 330, a gradient region in the form of an intrinsic $Al_xGa_{1-x}N$ alloy 340 with a linear variation of composition along the growth axis that linearly transitions from the WBG wurtzite metal layer 320 to a NBG p-type GaN contact layer 350, and finally, an upper wurtzite metal layer 360. The lower wurtzite metal layer 320 and the upper wurtzite metal layer 360 are effective ohmic metal contacts to form two electrical contacts for the diode 300.

Figure 3B:
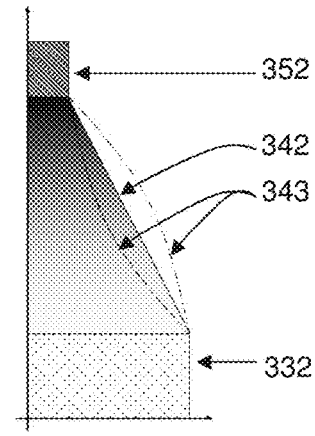
FIG. 3B illustrates a bandgap diagram for the structure illustrated in FIG. 3A.

FIG. 3B illustrates a spatial composition or bandgap energy corresponding to the diode 300 of FIG. 3A, showing how the bandgap transitions linearly over a gradient region 342 from a WBG material 332 to a NBG material 352. Indicator lines 343 illustrate example variations that may be achieved in the gradient region 342 for continuous transitions that are non-linear. As will be appreciated, the WBG material 332, gradient region 342, and NBG material 352 in FIG. 3B correspond to the WBG emitter 330, linearly graded alloy 340, and the NBG contact layer 350 of FIG. 3A.

Figure 3C:
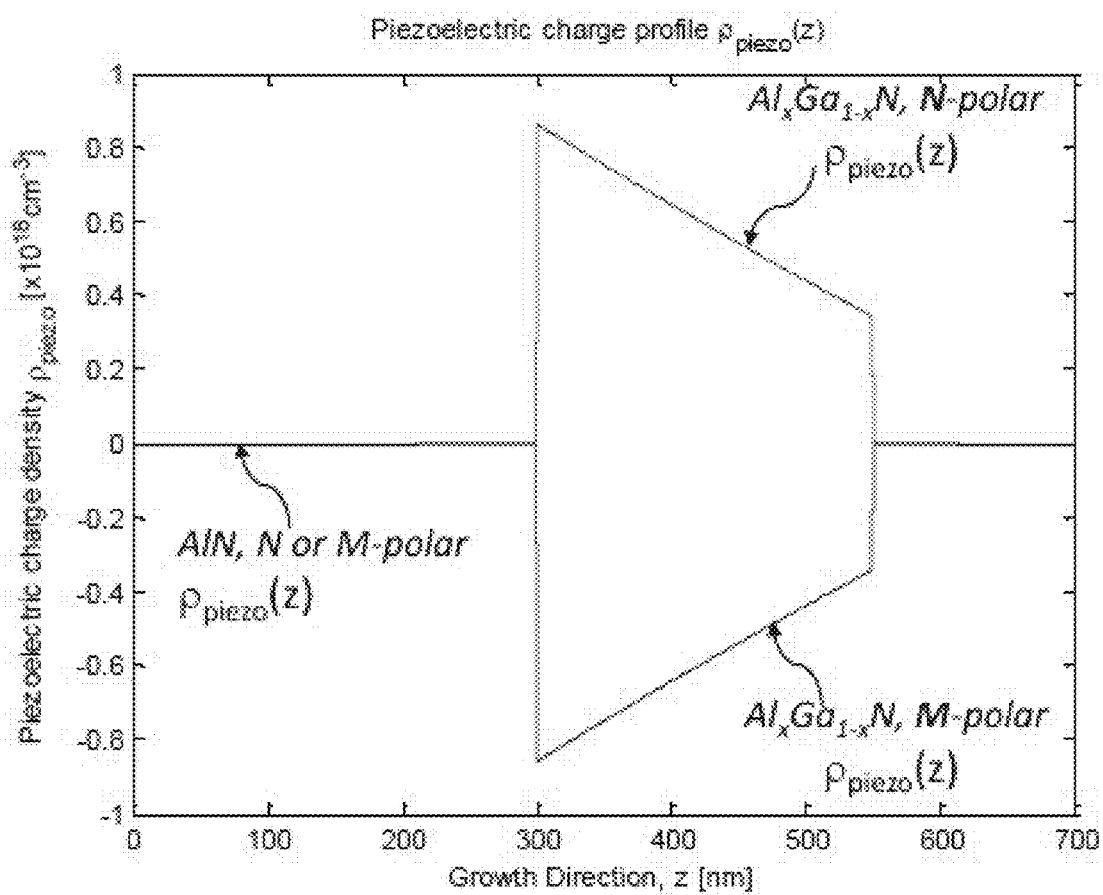
FIG. 3C illustrates spatial variation of induced piezoelectric charge density for the structure illustrated in FIG. 3A.
Figure 3D:
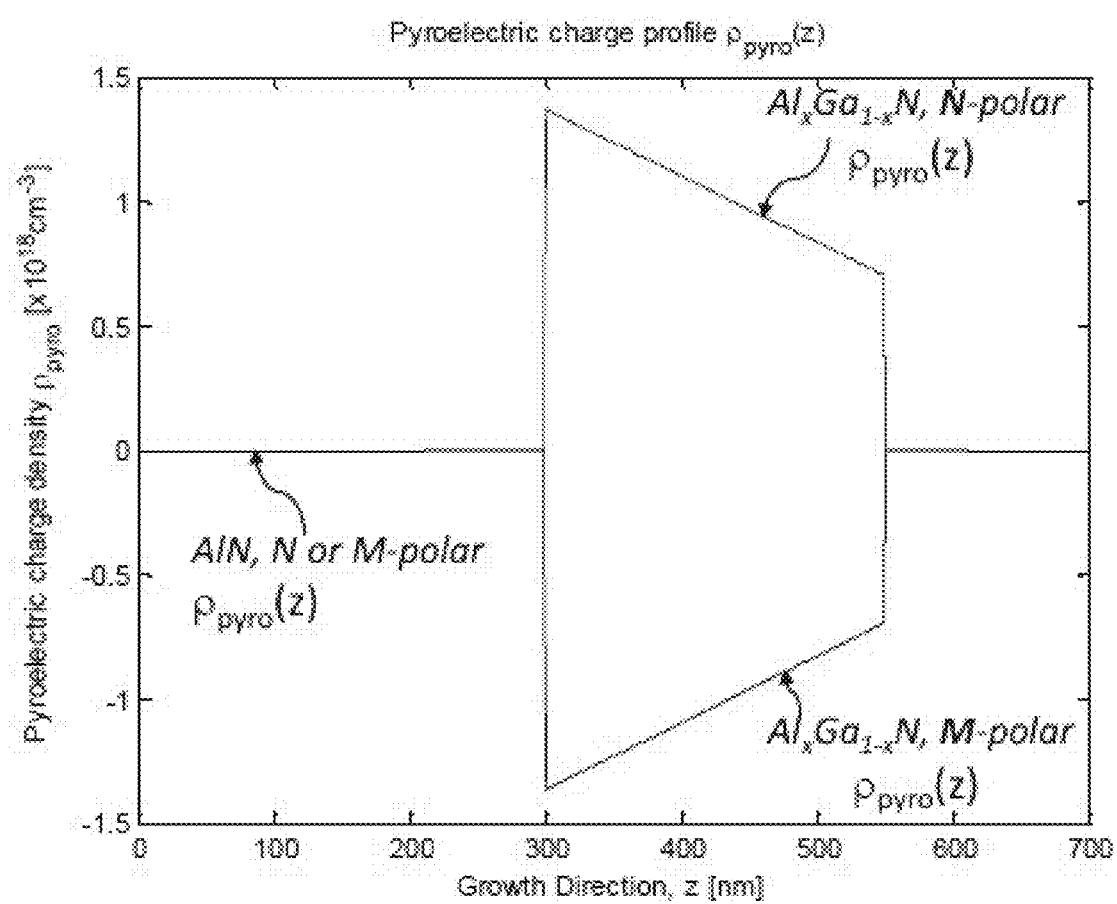
FIG. 3D illustrates spatial variation of induced pyroelectric charge density for the structure illustrated in FIG. 3A.

From an understanding of the fundamental behaviour of polarization fields within wz-III-N materials, the induced piezoelectric (due to lattice deformation) and pyroelectric (due to spontaneous polarization) charge profiles along the growth axis can be determined for the diode 300 illustrated in FIG. 3A, as shown in FIGS. 3C and 3D, respectively.

For a linear Al % variation in $Al_{x(z)}Ga_{1-x(z)}N$ having composition profile given by x(z) in the transition region, the piezoelectric and pyroelectric charge densities vary as a function of z with diminishing charge approaching the NBG p-GaN layer.

The two cases of metal-polar and nitrogen-polar epitaxial structures deposited along the spontaneous polarization axis, being the c-axis, generate contrasting polarisation fields. This correlation of charge sign with film polarity-type is used advantageously to improve the electron and/or hole carrier concentration.

While not obvious, the implications of such an areal charge density, which varies along the growth axis 310, is that warping of the conduction and valence band edges effectively 'pins' or shifts the conduction band or valence band edge to the Fermi-level depending upon the growth polarity of the film. The variation in x(z) produces a commensurate variation in the position dependent strain tensor, due to the difference in the in-plane lattice constant for each material composition. This change in the bulk crystal lattice constant produces a bi-axial strain and is assumed to generate an elastic deformation of the crystal, and thus induces a piezoelectric charge. In these examples the epitaxial stack is assumed to be deposited pseudomorphically on a thick and relaxed AlN buffer, and thus the stack is strained to the free standing bulk in-plane lattice constant of AlN. Other buffer layers and lattice constants are also possible. However, it is the critical layer thickness (CLT) which limits the thickness to which a lattice mismatched material can be pseudomorphically deposited. This limitation can be ameliorated using a superlattice comprising unit cells with each unit cell comprising at least two layers of lattice mismatched compositions, where the thickness of each layer is below the CLT of that layer with respect to the buffer in-plane lattice constant. That is, a superlattice can improve the ability to form large changes in average composition spatially according to embodiments of the present invention.

Figure 3E:
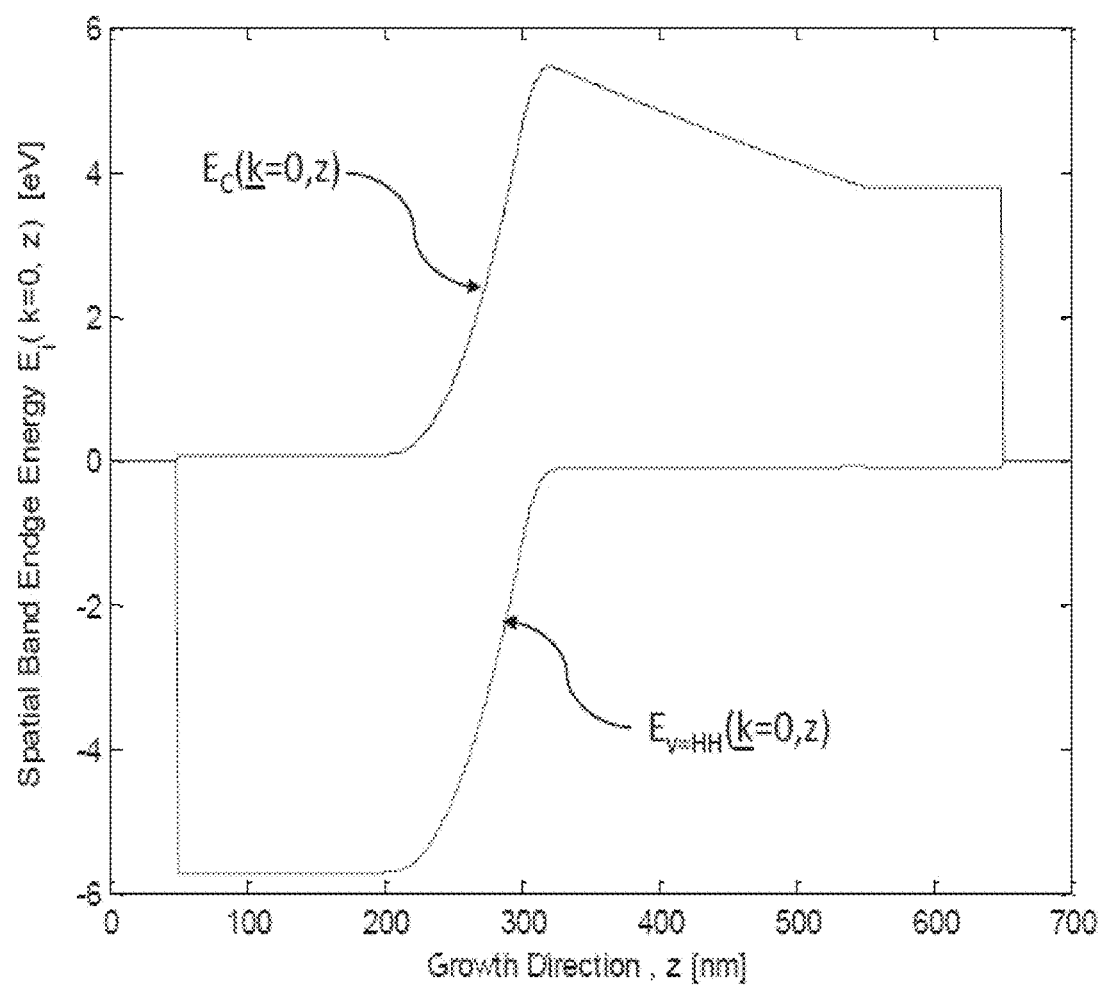
FIG. 3E illustrates spatial band structure for the structure illustrated in FIG. 3A.

FIG. 3E illustrates full spatial (k=0) energy band structure for the diode 300 illustrated in FIG. 3A showing the effect of a linear compositional variation of a WBG to a NBG transition provided by linearly graded alloy 340. The not-intentionally doped compositionally varied region is sandwiched between n-type WBG and p-type NBG slabs. The induced depletion region is localised toward the n-type WBG or i-compositionally varied region producing Fermi level pinning of the valence band for the case of a metal-polar oriented growth.

Figure 3F:
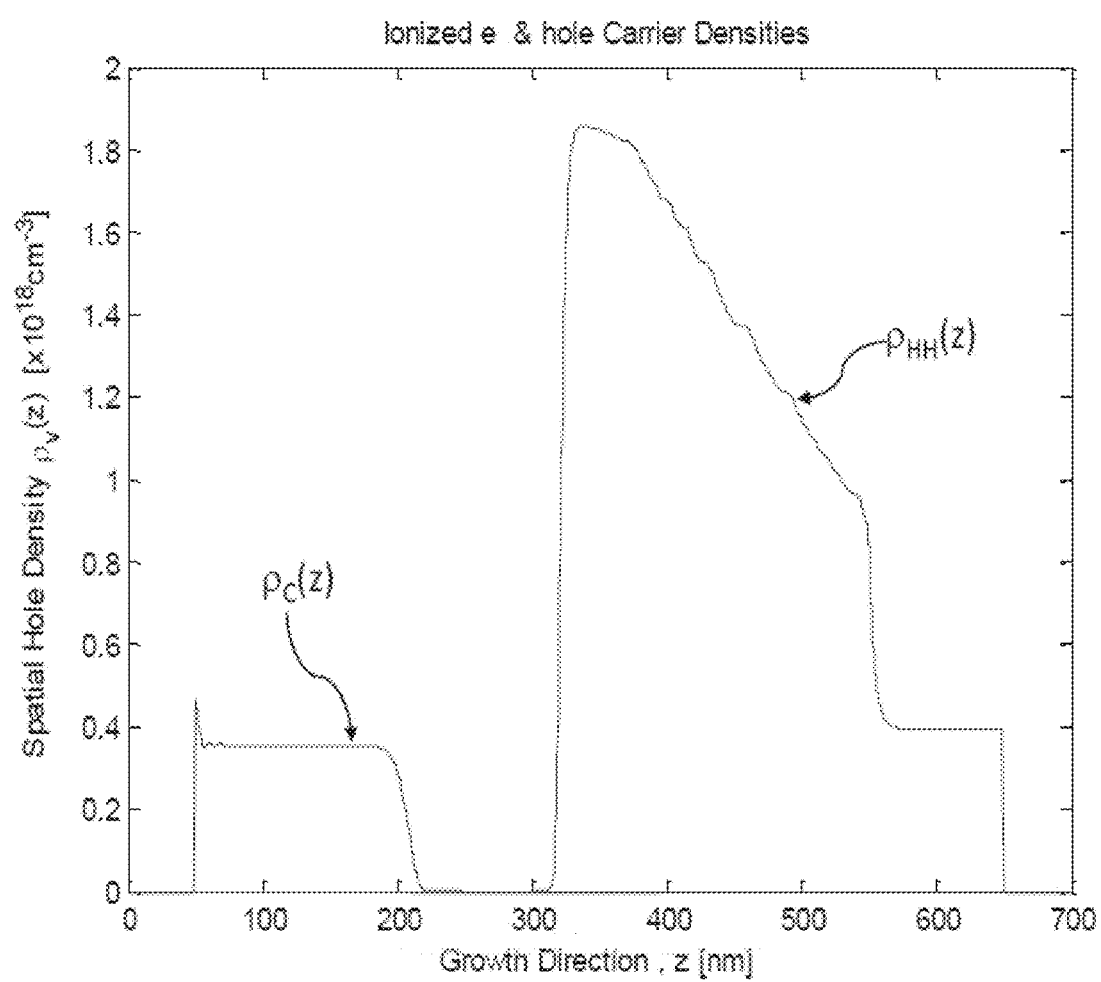
FIG. 3F illustrates estimated spatial variation of the areal electron concentration and the areal heavy-hole (HH) concentrations for the structure illustrated in FIG. 3A.

FIG. 3F illustrates spatial variation of the areal electron concentration and the areal heavy-hole concentrations for the diode 300 illustrated in FIG. 3A. The linear spatial variation in the AlGaN alloy composition x(z) induces a large hole carrier concentration in the otherwise not-intentionally doped region. Holes would therefore be supplied by the p-GaN contact region and transported into the induced p-type region. The depletion region extends into the n-type WBG region indicating that the induced p-type behaviour of the linear composition region is higher than the intentional ionized donor concentration.

Figure 3G:
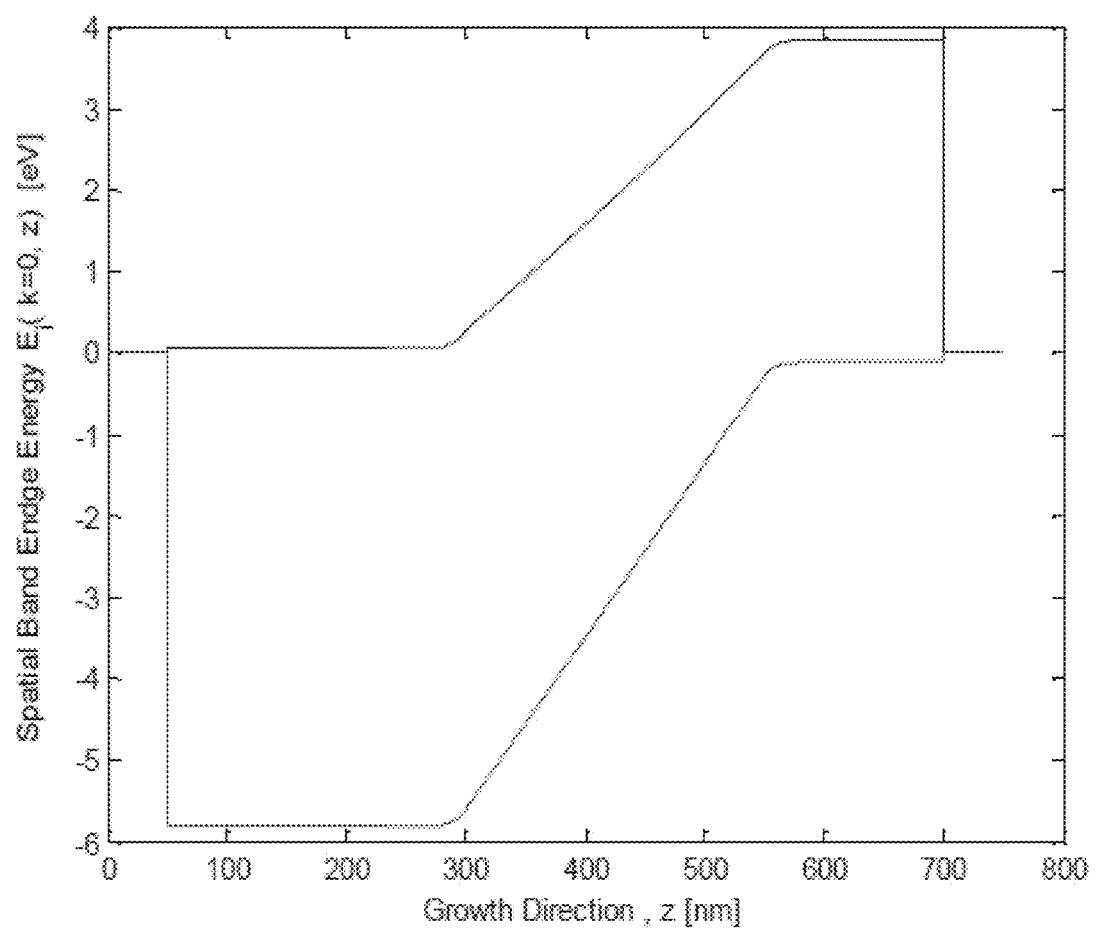
FIG. 3G illustrates a detail plot of zone centre variation in the lowest energy conduction band edge for the structure illustrated in FIG. 3A.
Figure 3H:
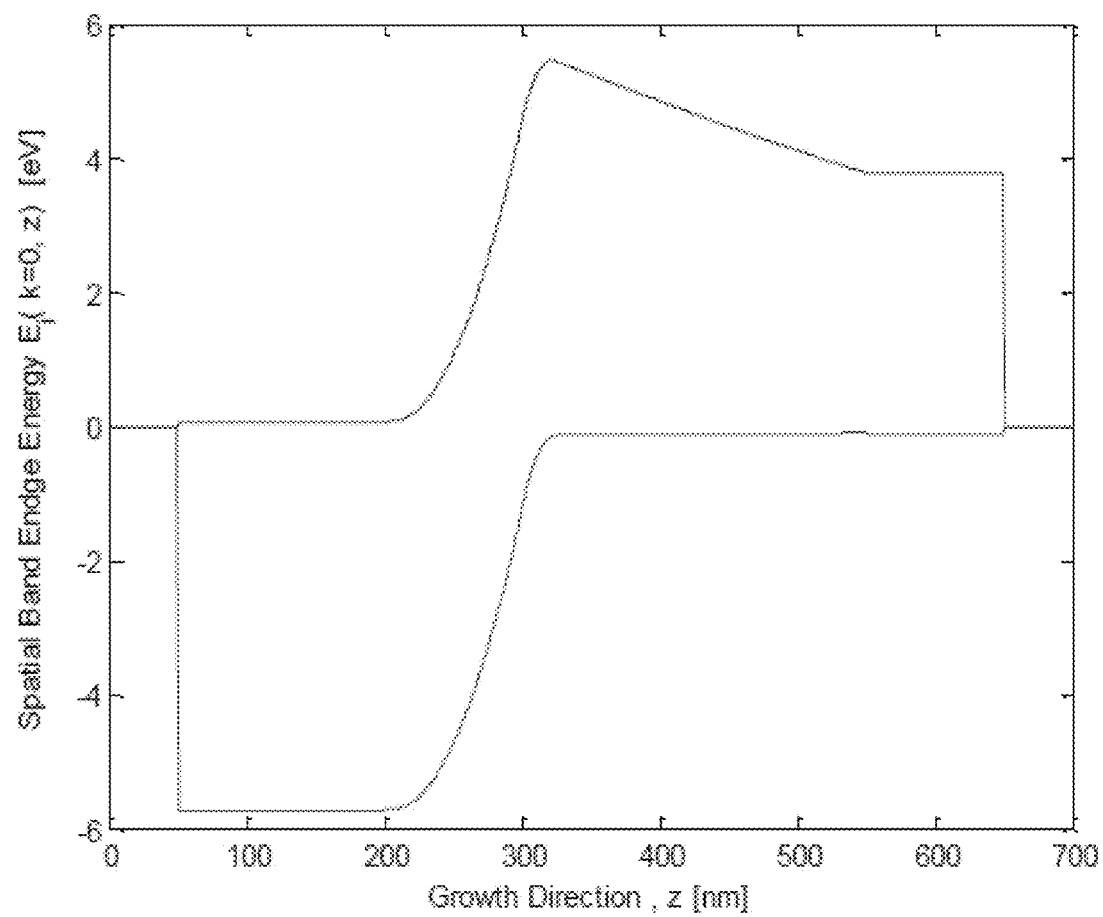
FIG. 3H illustrates a detail plot for zone centre variation in the three highest lying valence band edges.
Figure 3I:
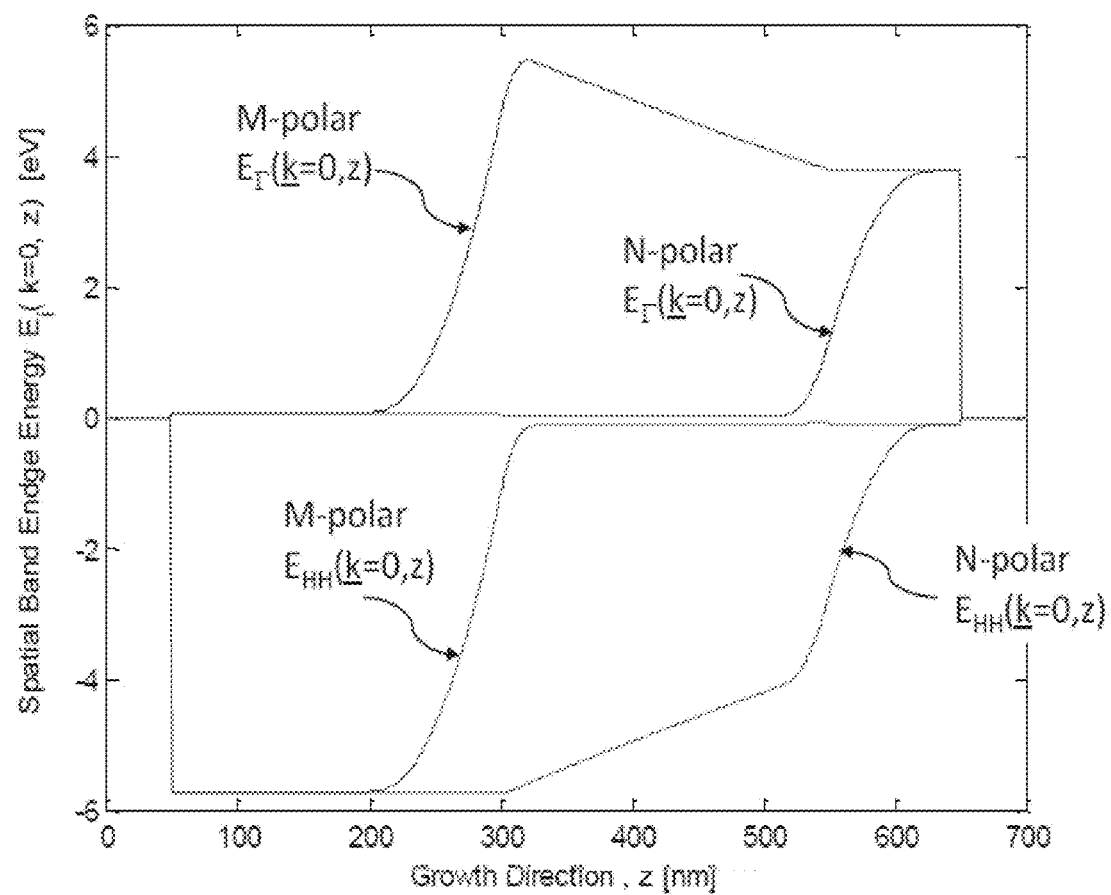
FIG. 3I illustrates full spatial zone centre bandstructure for the structure illustrated in FIG. 3A.

FIGS. 3G and 3H illustrate plots of the epitaxial structure of the diode 300 of FIG. 3A for the zone centre spatial variation in the lowest energy conduction band edge $E_C(k=0,z)$ (FIG. 3G) and the three highest lying valence band edges $E_v(\underline{k}=0,z)$, where v=HH, LH & CH (FIG. 3H). FIG. 3G shows the p-i-n diode formed using AlGaN but for the case of piezoelectric and pyroelectric charges set to zero. FIG. 3H shows the result for comparison with the piezo-electric and pyroelectric charges taken into account. It can be seen that the polarization charges should be accounted for when designing polar devices. Note also that the variation in Al % in $Al_{x(z)}Ga_{1-x(z)}N$ due to the x(z) for the range $0.0 \leq x(z) \leq 0.8$ for bulk-like material will have a cross-over in the lowest energy valence band at k=0 occurring at x(z)~0.65. For values less x<0.65, the material will have the heavy-hole valence band as the dominant hole type, whereas for x>0.65, the crystal field split valence band will dominate. FIG. 3I illustrates a full spatial zone centre band structure of diode 300 of FIG. 3A for two contrasting cases of epitaxial growth, namely with metal-polar or nitrogen-polar orientation relative to the grown axis 310. The result shows that a composition transition from a WBG to a NBG along the growth axis induces a p-type behaviour for metal-polar growth or an n-type behaviour for nitrogen-polar growth.

Figure 3J:
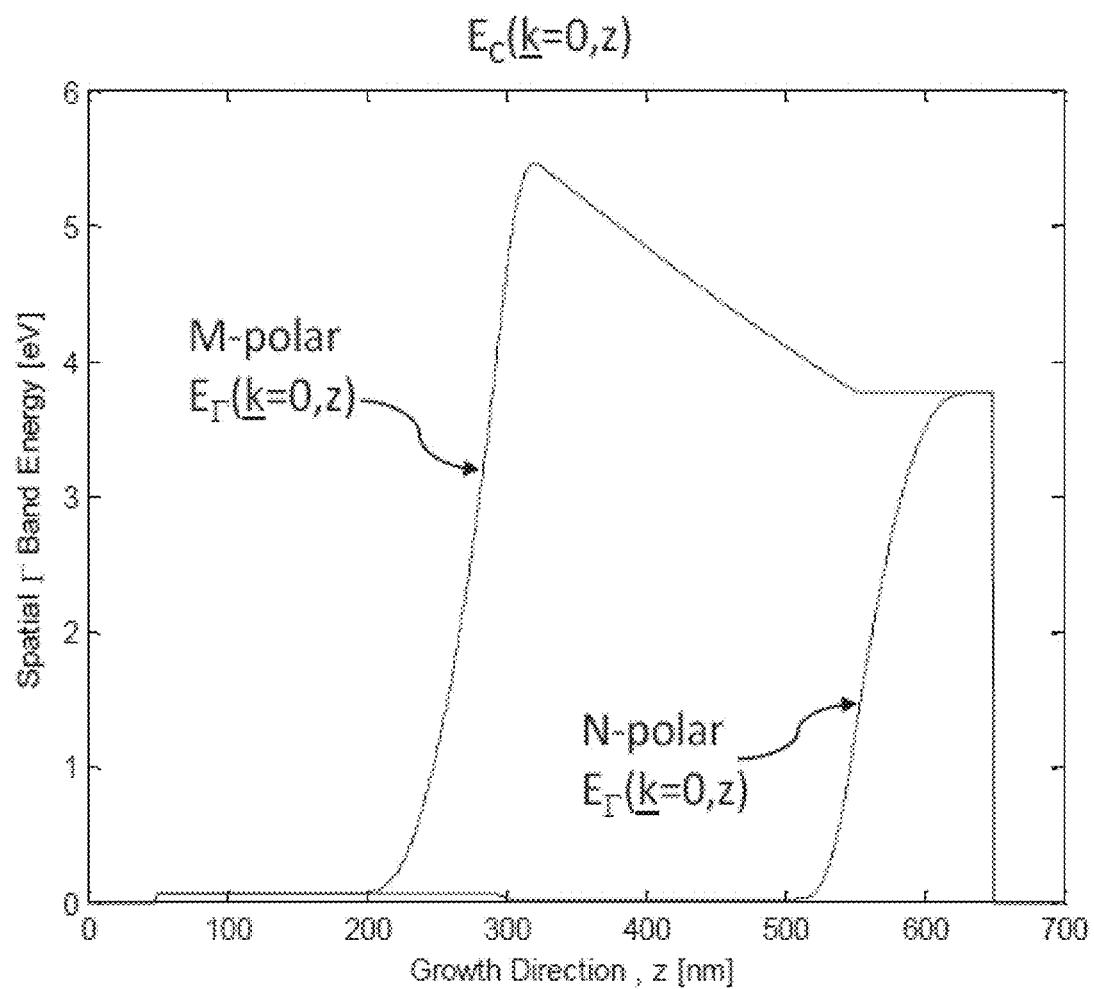
FIG. 3J illustrates a detail plot of estimated conduction contrasting metal-polar or nitrogen-polar orientation for the structure illustrated in FIG. 3A.
Figure 3K:
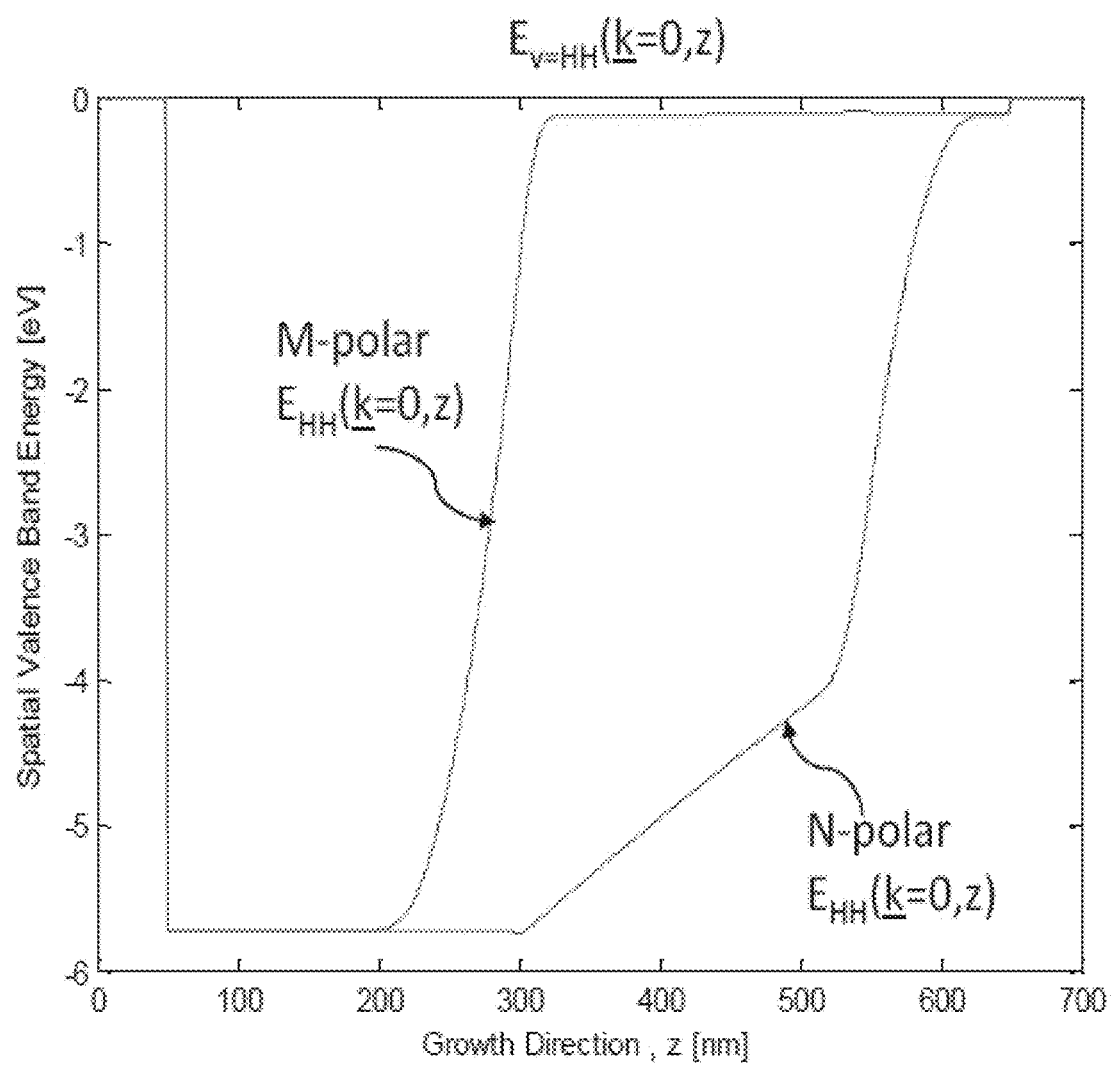
FIG. 3K illustrates a detail plot of estimated valence heavy-hole (HH) contrasting metal-polar or nitrogen-polar orientation for the structure illustrated in FIG. 3A.

FIGS. 3J and 3K illustrate plots of conduction and valence heavy-hole spatial zone-centre bandstructure, respectively, of the diode 300 of FIG. 3A for two contrasting cases of epitaxial growth, namely metal-polar or nitrogen-polar orientation relative to the grown axis 310. The illustrated effect of film polarity dramatically influences the electronic behaviour of the device. For a metal-polar film the not-intentionally doped linear alloy composition variation x(z) induces p-type behaviour, whereas the nitrogen-polar orientation induces n-type behaviour. The respective depletion regions are contrasted and dictate the device operation. This fundamental effect can be used advantageously for semiconductor structures, particularly LED structures.

Figure 3L:
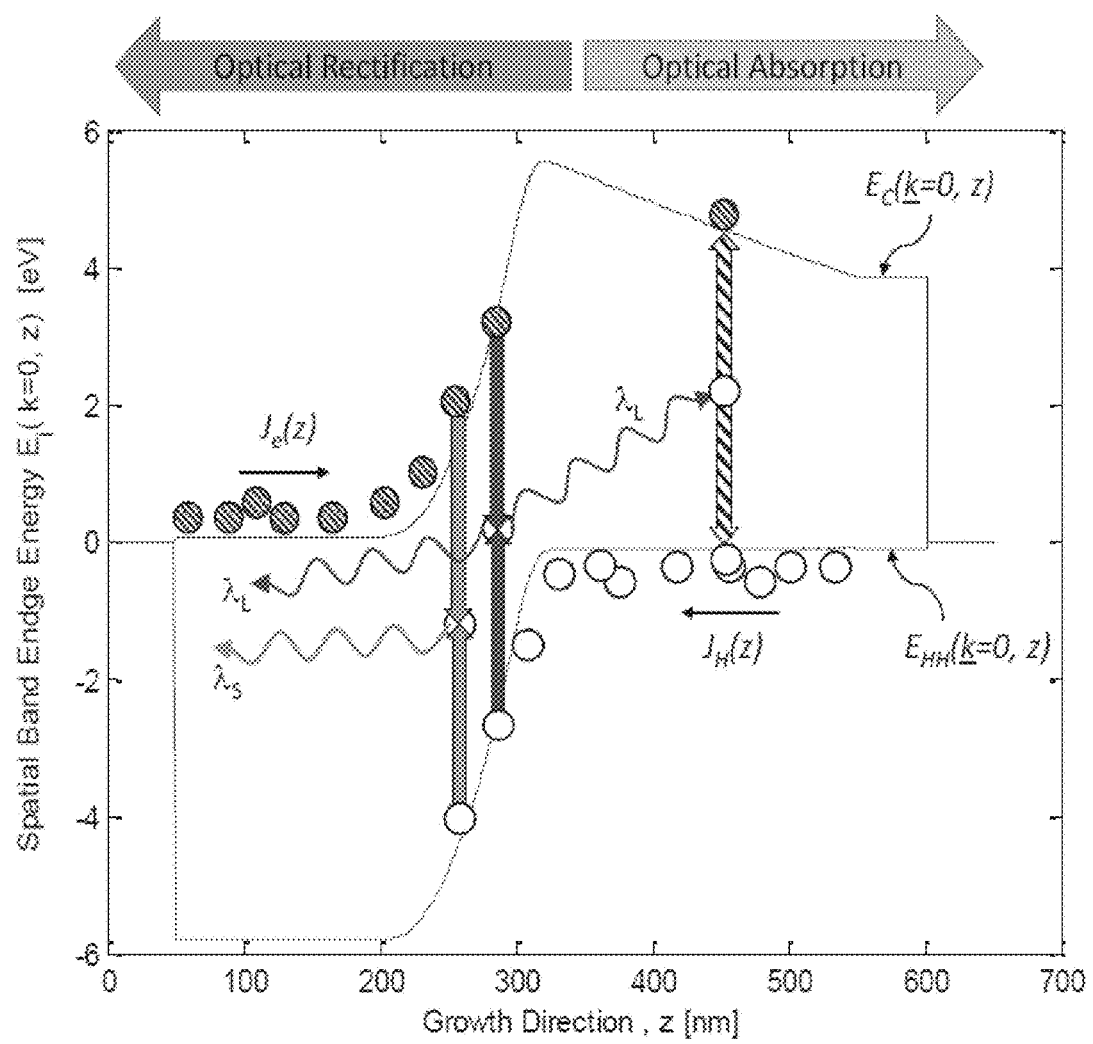
FIG. 3L illustrates an optical rectification effect for a linearly graded bandgap, such as for the structure illustrated in FIG. 3A, showing a preferred direction for outcoupling of photons from the structure.

FIG. 3L illustrates an optical rectification effect for a linearly graded bandgap region, as issued in diode 300, schematically showing a preferred direction for outcoupling of photons from the structure. Electrons and holes injected into the recombination region can generate a broad optical emission spectrum due to the spatially dependent bandgap. Preferably, the recombination region is spatially coincident with the depletion region of the diode. High energy photons (i.e. short wavelength $\lambda_S$) generated within the depletion region with energy less than the n-type WBG region can propagate with low-loss through the n-type WBG material 330 and substrate 320, whereas forward propagating photons will be reabsorbed within the spatially decreasing bandgap toward the p-NBG material 350. Longer wavelength photons ($\lambda_L$) are therefore preferentially emitted through the topmost NBG layer. The large and asymmetrical built-in conduction band potential impedes free transport $J_e(z)$ of electrons across the structure. This photon recycling through absorption process can improve the p-type region performance.

Figure 3M:
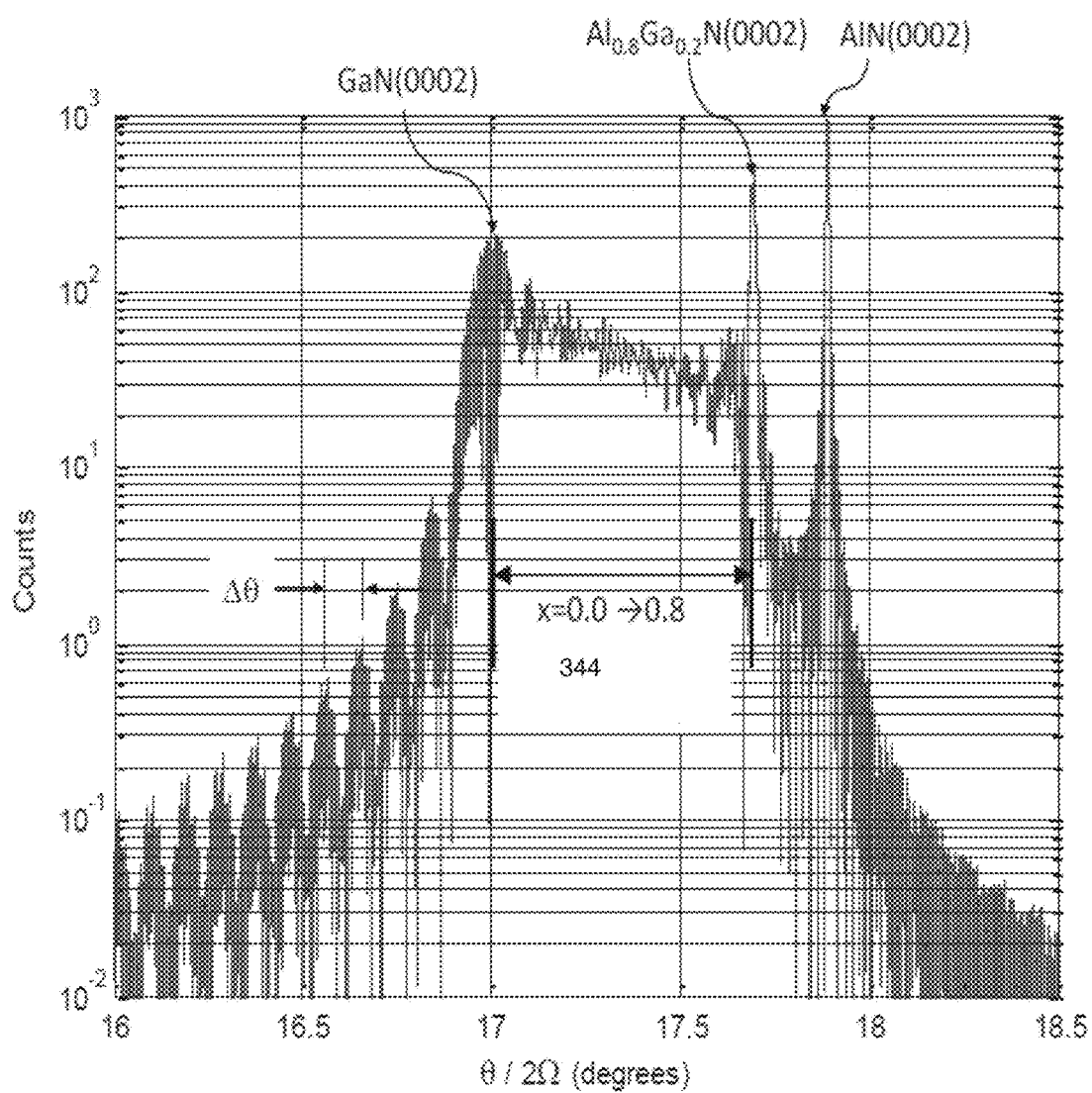
FIG. 3M illustrates an XRD simulation of the structure illustrated in FIG. 3A.

FIG. 3M shows an X-ray diffraction (XRD) estimate of the diode 300 of FIG. 3A illustrating gradient region characteristics 344 of the linearly graded alloy. XRD analysis, particularly when looking at the gradient region characteristics 344, can be used to confirm epitaxial grown sequences and tailor the spatial composition variation.

Figure 4A:
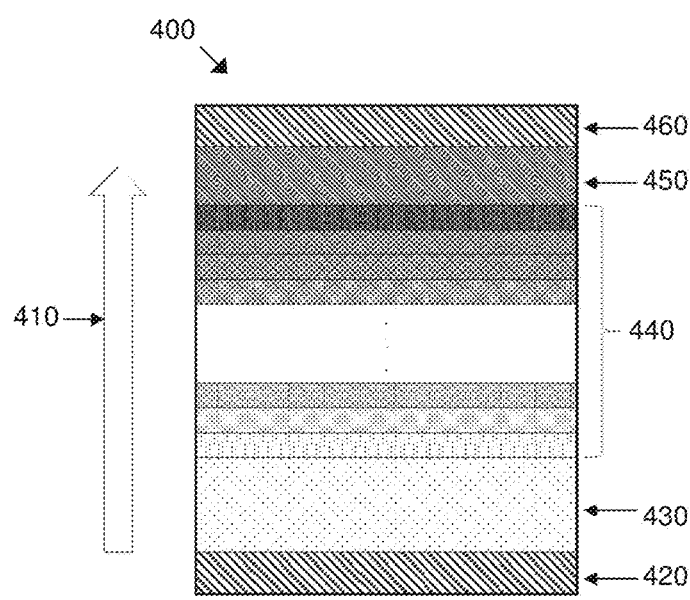
FIG. 4A illustrates a structure having a stepwise gradient region of bulk materials.

FIG. 4A illustrates a semiconductor structure in the form of a diode 400 formed with a stepwise change in bulk-like materials. The diode 400 has, in order along a growth axis 410, a lower wurtzite metal layer 420 with a metal-polar growth including an n-type $Al_{0.8}Ga_{0.2}N$ WBG emitter 430, a gradient region in the form of an intrinsic $Al_xGa_{1-x}N$ alloy 440 with a stepwise variation of composition along the growth axis that transitions from the WBG wurtzite metal layer 420 to a NBG p-type GaN contact layer 450 in discrete steps, and finally, an upper wurtzite metal layer 460. The lower wurtzite metal layer 420 and the upper wurtzite metal layer 460 are effective ohmic metal contacts to form two electrical contacts for the diode 400.

Figure 4B:
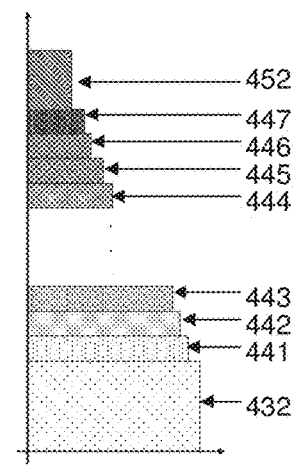
FIG. 4B illustrates a bandgap diagram for the structure illustrated in FIG. 4A.

FIG. 4B illustrates a bandgap diagram corresponding to the diode 400 of FIG. 4A, showing how the bandgap transitions in steps 441 to 447 from a WBG material 432 to a NBG material 452. As will be appreciated, the WBG material 432, gradient region 441-447, and NBG material 452 in FIG. 4B correspond to the WBG emitter 430, stepwise graded alloy 440, and the NBG contact layer 450. The steps in the gradient region 441 to 447 may be large or small but, for example, they could be graded with the first step 441 being $Al_{0.792}Ga_{0.208}N$, second step 442 being $Al_{0.784}Ga_{0.216}N$, stepping incrementally over many steps up to the second to last step 446 being $Al_{0.016}Ga_{0.984}N$, and the last step 447 being $Al_{0.008}Ga_{0.992}N$.

Figure 4C:
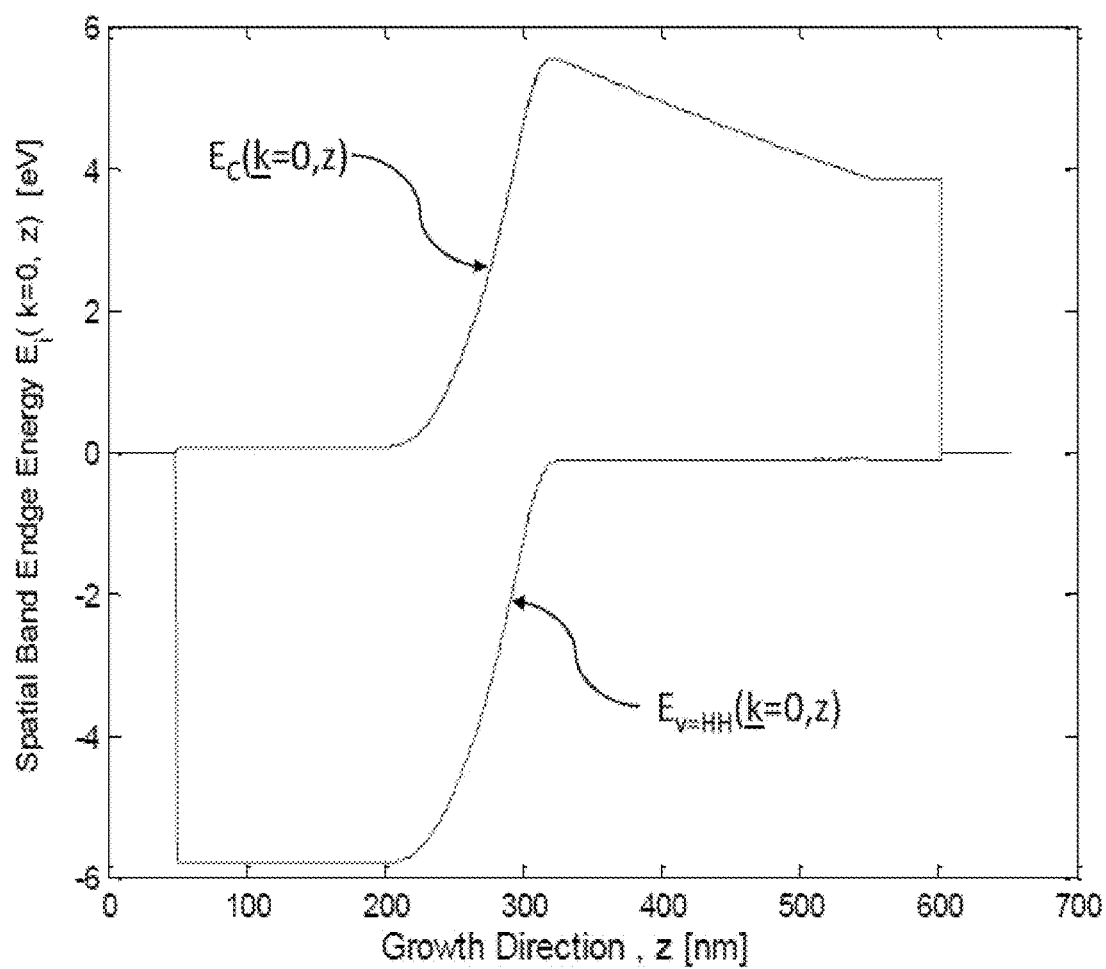
FIG. 4C illustrates a spatial dependence full bandstructure for the structure illustrated in FIG. 4A.
Figure 4D:
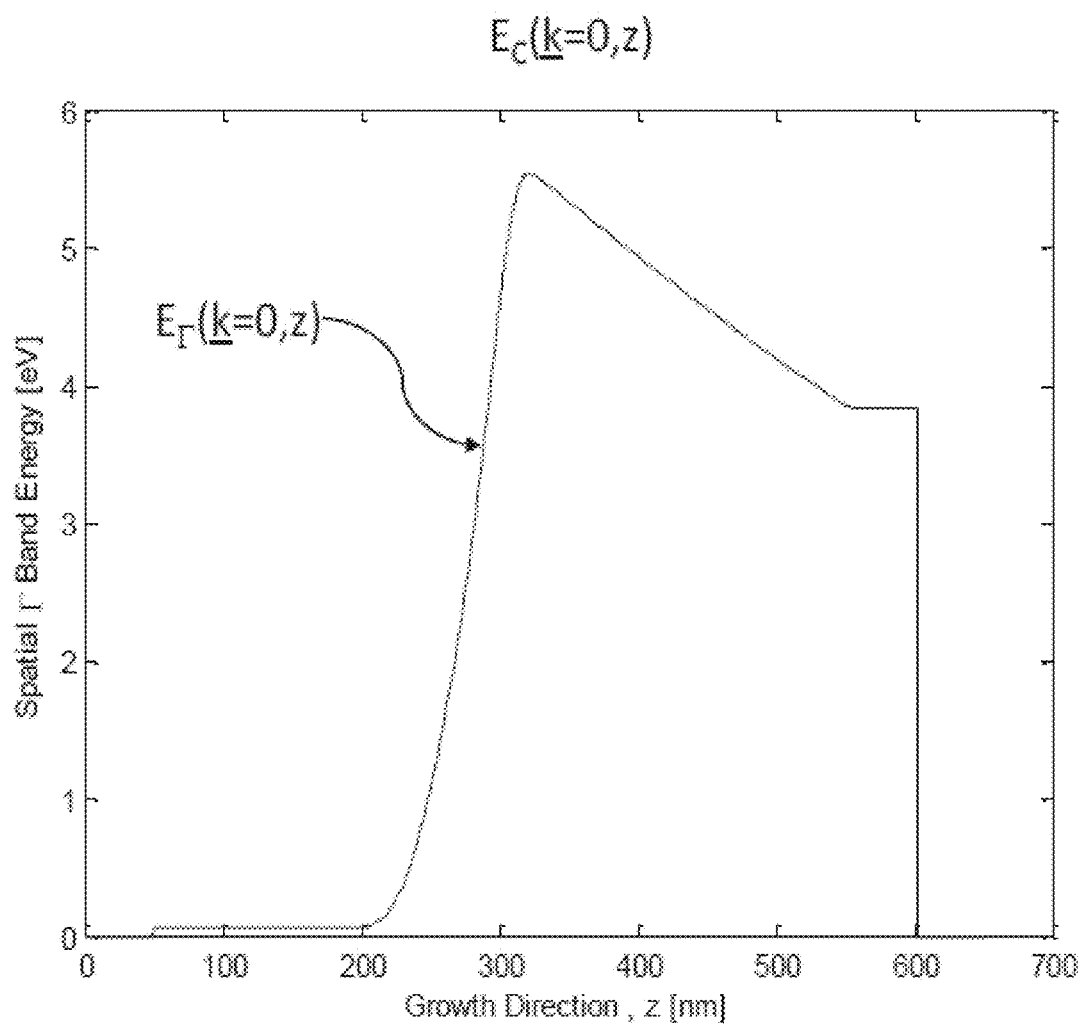
FIG. 4D illustrates zone centre conduction band variation as a function of growth distance for the structure illustrated in FIG. 4A.

FIG. 4C illustrates full spatial bandstructure of the diode 400 illustrated in FIG. 4A showing the effect of a stepwise compositional variation of a WBG to a NBG transition provided by the stepwise graded alloy 440. The depletion region is formed at the n-$Al_{0.8}Ga_{0.2}N$ interface with the linearly chirped $x_{ave}(z)$ region having an induced p-type characteristic. FIG. 4D illustrates the conduction band variation of FIG. 4C, and FIG. 4E illustrates the valence band variation of FIG. 4C.

Figure 4E:
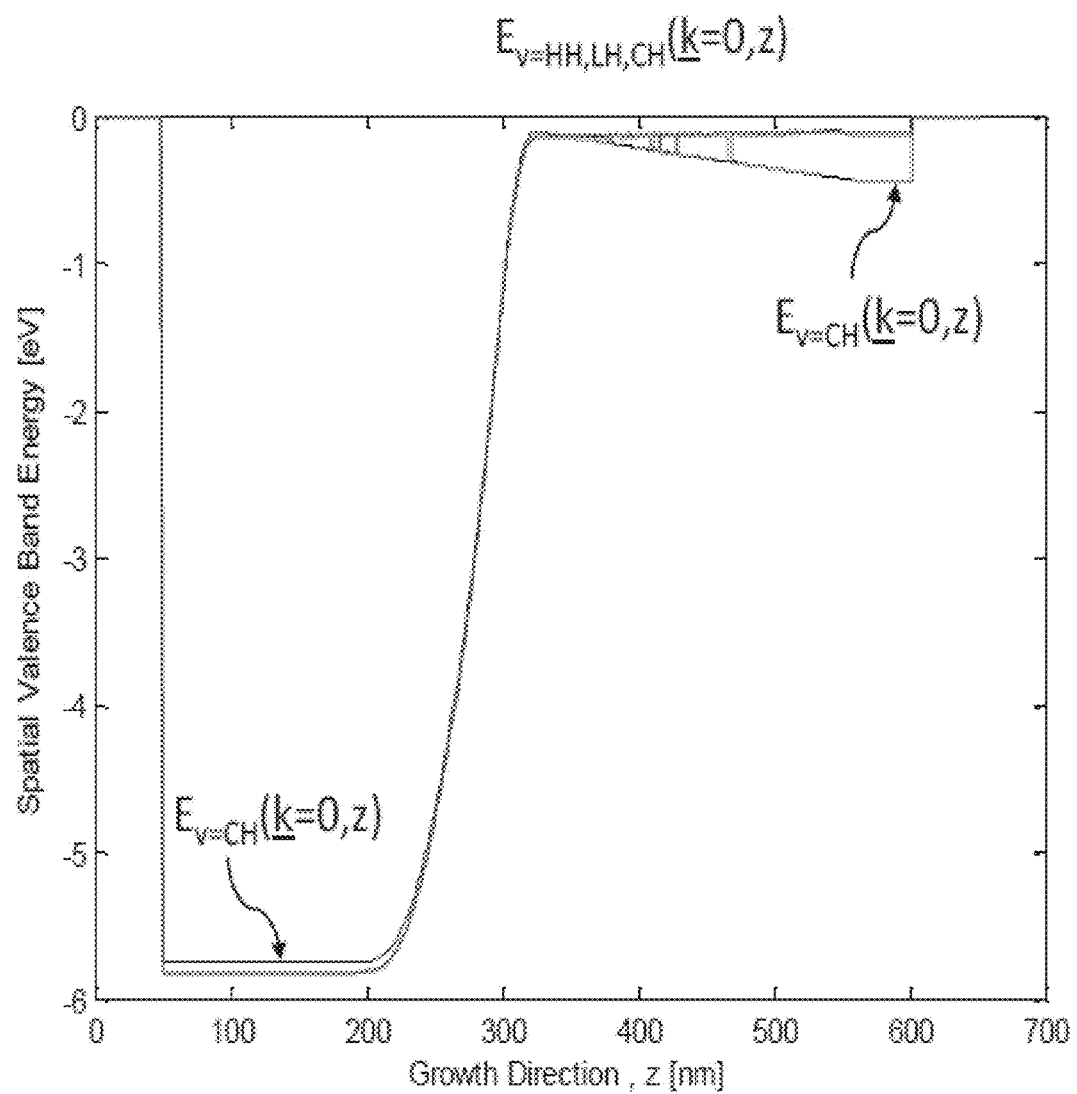
FIG. 4E illustrates zone centre valence band edge variation as a function of growth distance for HH, LH, and CH bands structure illustrated in FIG. 4A.

FIG. 4E further shows the cross over in the energy ordering of the v=HH, LH and CH valence bands spatially in the structure. For application to LED function it is advantageous for transverse electric (TE) polarized light to be generated for light emission substantially perpendicular to the plane of the layers. The high Al % portions with x(z)>0.65 would be dominated by the CH valence and thus be transverse magnetic (TM) polarized. This issue can be resolved by using superlattices to define the effective alloy of the material. For example, using AlN and GaN layers exclusively within a superlattice unit cell selects the TE optical emission to be dominant for all values of the average composition $x_{ave}$.

Figure 4F:
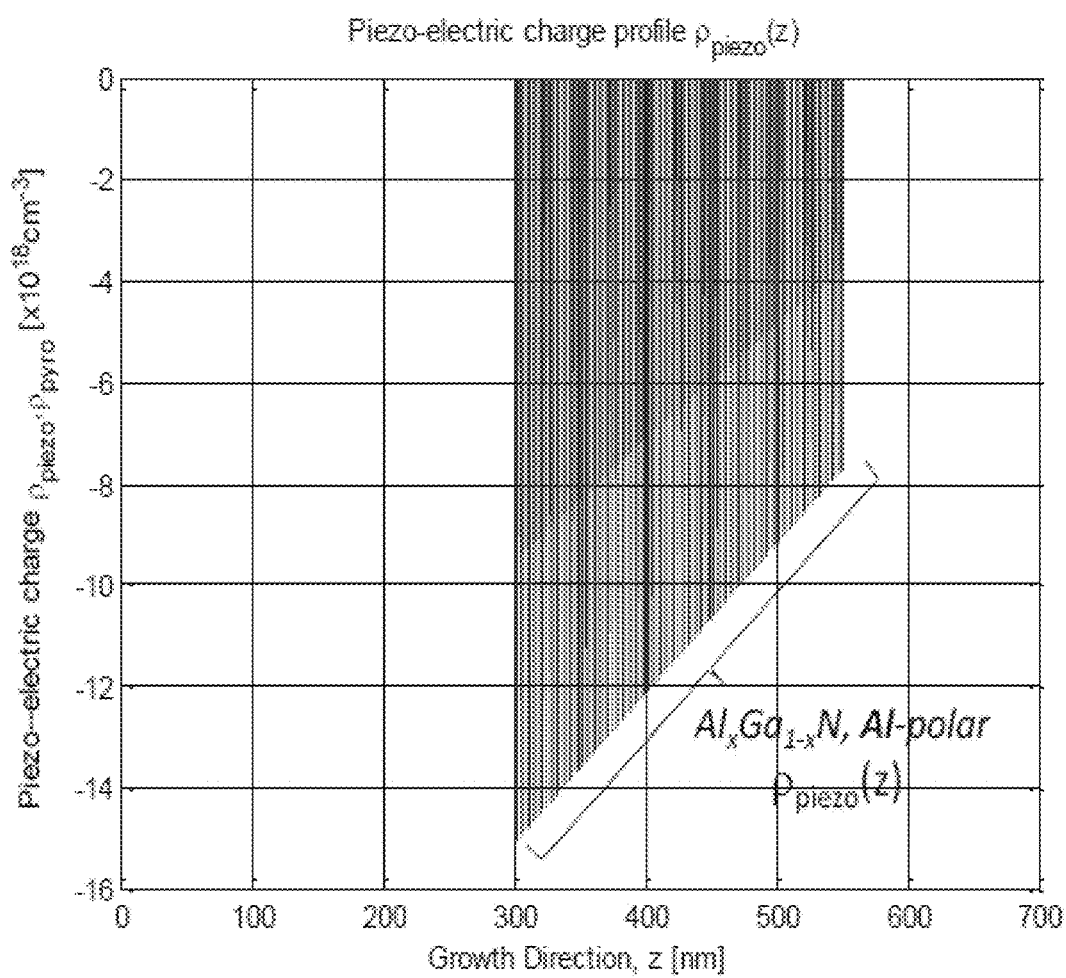
FIG. 4F illustrates spatial variation of induced piezoelectric charge density for the structure illustrated in FIG. 4A.
Figure 4G:
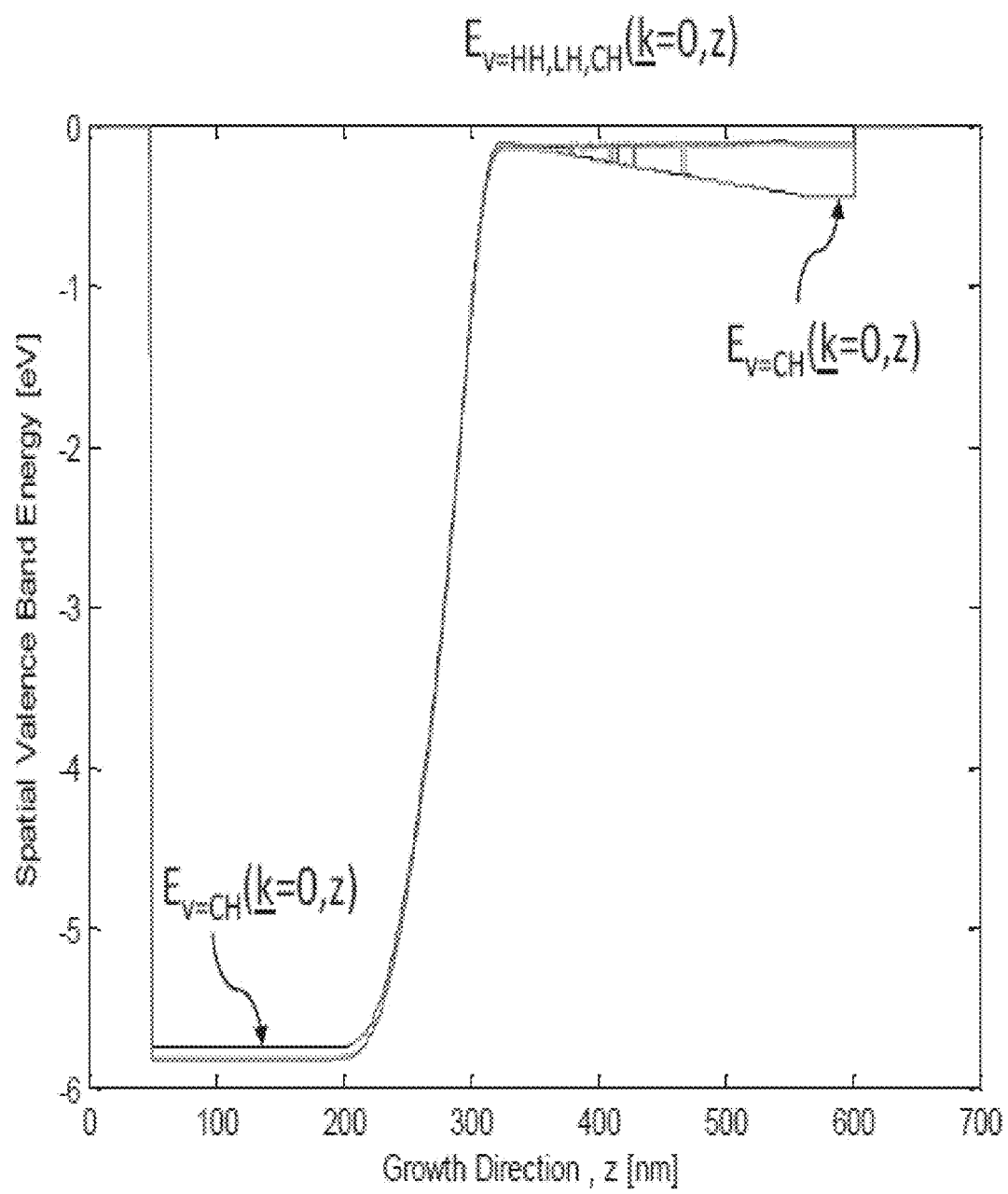
FIG. 4G illustrates spatial variation of induced pyroelectric charge density structure illustrated in FIG. 4A.
Figure 4H:
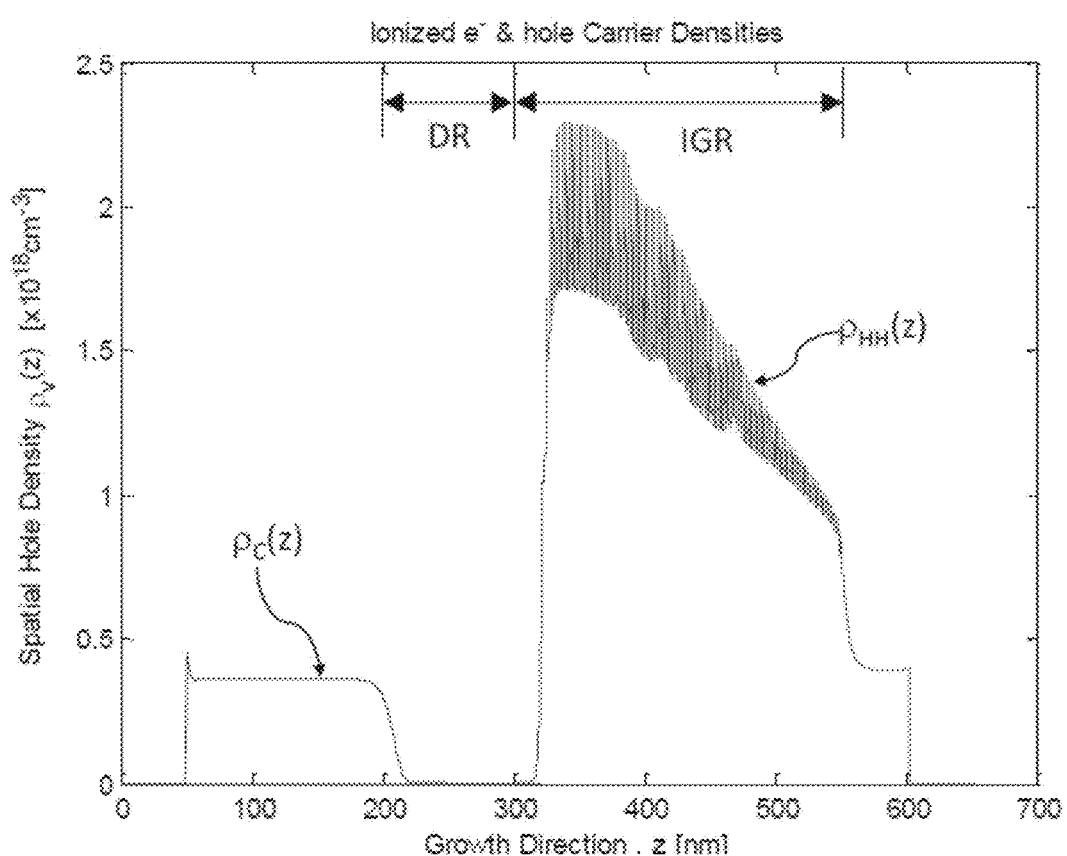
FIG. 4H illustrates electron and heavy-hole (HH) carrier concentrations generated within the structure illustrated in FIG. 4A.

FIG. 4F illustrates spatial variation of induced piezoelectric charge density due to the accommodation of lattice mismatch between different AlGaN compositions. FIG. 4G illustrates spatial variation of induced pyroelectric charge density due to the variation in the alloy composition for the diode 400 of FIG. 4A. FIG. 4H illustrates electron and heavy-hole carrier concentrations generated within the diode 400 of FIG. 4A.

It can be seen that the induced hole concentration within an otherwise not-intentionally doped material is substantially larger than the small intentionally doped contact layer of p-GaN. This in part solves a long standing problem in the prior art wherein typically a semiconductor is required to be heavily doped to create a sufficiently low ohmic contact with a metal contact electrode. Such a heavy doping density reduces the host material quality and typically the carrier mobility and the crystal structure are disadvantageously compromised. The induced doping region of FIG. 4H shows a high activated hole density without the use of substitutional dopants and thus represents an improved hole injector or reservoir which is not impeded by low hole mobilities or poor hole transport. Furthermore, the band diagram shows an induced depletion region starting at about z=200 nm and ending at about z=300 nm, that is positioned advantageously between the intentionally doped n-type WBG region and the induced p-type region.

FIG. 5A illustrates a semiconductor structure in the form of a diode 500 formed with a bilayered superlattice. In particular, the diode 500 has, in order along a growth axis 510, a lower wurtzite ohmic contact or metal layer 520 with a metal-polar growth including a WBG emitter 530 in the form of an n-type $Al_{0.8}Ga_{0.2}N$ material, a gradient region in the form of a bilayered superlattice 540 that transitions from the WBG emitter 530 to an NBG contact layer 550 formed of p-type GaN, and an upper wurtzite metal layer 560. The lower wurtzite metal layer 520 and the upper wurtzite metal layer 560 are effective ohmic metal contacts to form two electrical contacts for the diode 500.

The bilayered superlattice 540 preferably comprises two dissimilar binary compositions chosen from extreme III-N endpoints of AlN and GaN. Other combinations are also possible, for example $Al_xGa_{1-x}N/GaN$ or $Al_xGa_{1-x}N/AlN$ $Al_yGa_{1-y}N/Al_xGa_{1-x}N$ where $x \neq y$. It is also possible to use three or more layers per unit cell, for example trilayered stacks of the form of $AlN/Al_xGa_{1-x}N/GaN$. The use of binary constituent materials produces the largest areal charge sheet density at each heterojunction interface. Each bilayered period within the bilayered superlattice 540 has a fixed thickness of, for example 5 nm ($L_{GaN}$ of 1 nm and $L_{AlN}$ of 4 nm) and varying composition such that it transitions from an [AlN/GaN] unit cell having an $x_{ave}$ of 0.8, adjacent the WBG emitter 530, to an $x_{ave}$ of 0.01, adjacent the NBG contact layer. The unit cell thickness can be held constant throughout and the ratio of the GaN and AlN thickness $L_{GaN}$ and $L_{AlN}$ selected to produce the desired $x_{ave}$, where the unit cell behaves as an equivalent bulk-like alloy of composition $Al_{x_{ave}}Ga_{1-x_{ave}}N \equiv [L_{GaN}/L_{AlN}]x_{ave}$.

FIG. 5B illustrates the magnitude of the spatial bandgap corresponding to the diode 500 of FIG. 5A, showing how the bandgap transitions over a gradient region 542 from a WBG material 532 to a NBG material 552. As will be appreciated, the WBG material 532, gradient region 542, and NBG material 552 in FIG. 5B correspond to the WBG emitter 530, bilayered superlattice 540, and the NBG contact layer 550.

Figure 5D:
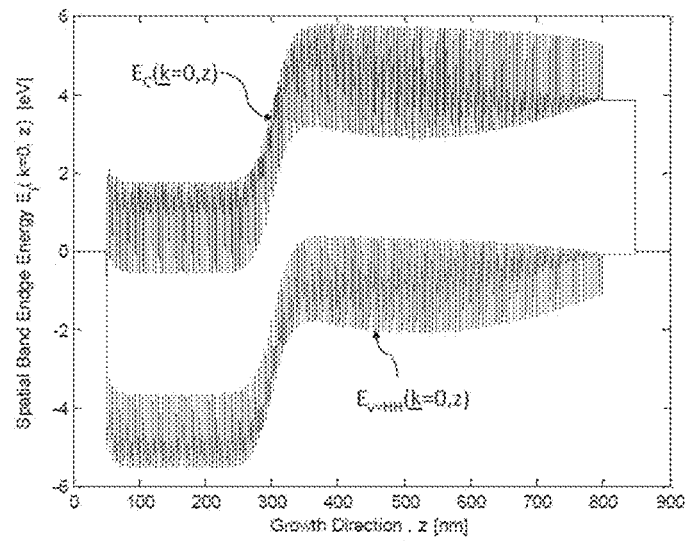
FIG. 5D illustrates a full zone centre spatial bandstructure of the structure illustrated in FIG. 5C.

FIG. 5C illustrates a semiconductor structure in the form of a diode 501 which is a variation of the diode 500 in FIG. 5A. The difference between diode 501 of FIG. 5C and diode 500 of FIG. 5A is that the WBG emitter 530 of diode 500 is replaced with an n-type superlattice (n:SL) 531, preferably a SPSL, of $x_{ave}$=0.8. The n:SL 531 has a constant period and is doped for n-type conductivity. Although illustrated as only a few periods, the n:SL 531 may comprise over, for example, 50 periods while the gradient region, i.e. the bilayered superlattice 540, may comprise over 1000 periods. FIG. 5D illustrates a full spatial bandstructure of the diode 501 illustrated in FIG. 5C showing the effect of the grading of the bilayered superlattice 540. The conduction and valence band edges are modulated along the growth axis with each heterojunction between the AlN and GaN layers. The n:SL 531 forms a depletion region between the induced p-type region of the graded SL and is capped with a p-GaN layer. The i:SL graded region induces a hole density that is almost five times greater than can be achieved using a bulk-like composition grading.

Based on an understanding of how wurtzite III-N film polarity operates with respect to heterojunctions and superlattices, preferred epitaxial structures can be determined for specific polarity types. If a design goal is to achieve an increased hole-carrier concentration by the use of alloy or effective alloy composition grading, then the epitaxial growth sequence may be selected from one of a 'p-UP' or 'p-DOWN' design for a metal-polar or nitrogen-polar orientation, respectively.

Figure 6:
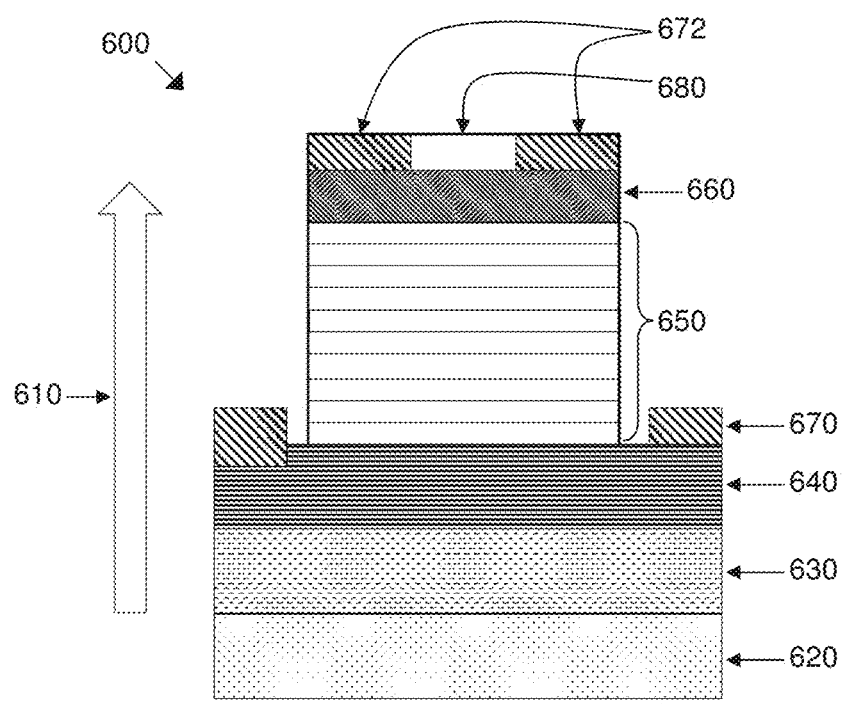
FIG. 6 illustrates a P-UP LED structure.

FIG. 6 illustrates a metal-polar 'p-UP' LED structure 600 for a metal-polar film growth with respect to a growth axis 610 (sometimes referred to as a growth direction 'z'). To achieve an induced hole concentration beyond that achievable with impurity doping alone, the centre portion of the LED structure 600 has a gradient region 650 that transitions from a WBG composition to a NBG composition with increasing growth along the growth axis 610, which is parallel to the spontaneous polarization axis, in this case the c-axis of the wurtzite crystal structure.

In order along the growth axis 610, the LED structure 600 comprises a substrate 620, a buffer or dislocation filter region 630, an n-type WBG region 640, the gradient region 650, and a NBG p-type region 660. Preferably, the substrate is a substantially transparent sapphire ($Al_2O_3$) substrate, for example, with a c-plane oriented sapphire (0001) surface or is a native III-N substrate, such as wurtzite AlN. Ohmic metal contacts 670 and 672 are provided and an optical window 680 may be provided to allow transmission of light from the top of LED structure 600. It will be appreciated that light may instead, or additionally, be transmitted through the substrate 620. Furthermore, the buffer region 630 may instead, or as well, be a dislocation filter region.

The n-type WBG region 640 is preferably in the form of a doped region as an n-type WBG layer or an n-doped superlattice of constant period and constant effective alloy composition. The gradient region 650 can then be formed on the n-type WBG region 640 with an effective alloy composition which varies as a function of distance along the growth axis 610. The gradient region 650 forms the desired variation in bandstructure to form a transition from a WBG composition to a NBG composition. Optionally, at least a portion of the gradient region 650 can be doped with an impurity dopant. For example, a p-type impurity dopant could be optionally integrated into the gradient region 650. In preferred forms the gradient region 650 comprises $Al_{x(z)}Ga_{1-x(z)}$ or an [AlN/GaN] superlattice with a composition profile 'k' selected to achieve the spatial profile of the average alloy composition of each unit cell given by: $x_{ave}=x(z)=x_{WBG}-[x_{WBG}-x_{NBG}]*(z-z_s)^k$, where $z_s$ is the start position of the grading.

The NBG p-type region 660 is deposited upon the gradient region 650, ideally having a similar effective alloy composition as the final composition achieved by the gradient region 650. This mitigates a potential barrier being induced at a heterojunction interface between the gradient region 650 and the NBG p-type region 660. In preferred forms the NBG p-type region 660 is a doped superlattice or bulk type III-N layer.

A cap layer, such as a p-GaN layer, can optionally be deposited as a final cap layer to provide an improved ohmic contact and a source of holes.

The optically transparency of the substrate 620 of the LED structure 600 allows optical radiation generated from within the gradient region 650 to advantageously propagate out of the device through the n-type WBG region 640, through the buffer region 630, and finally out through the substrate 620 which has low absorptive losses. Light can also escape vertically out through the top of the structure 600, but the NBG p-type region 660 effectively filters shorter wavelengths of light and, accordingly, there can be an asymmetry in the wavelength response for light output through the top and bottom of the LED structure 600. Light generated from within the gradient region 650 can also escape laterally as a 'waveguided' mode with a gradient refractive index, as a function of the growth axis 610, further confining light to within the plane.

Figure 7:
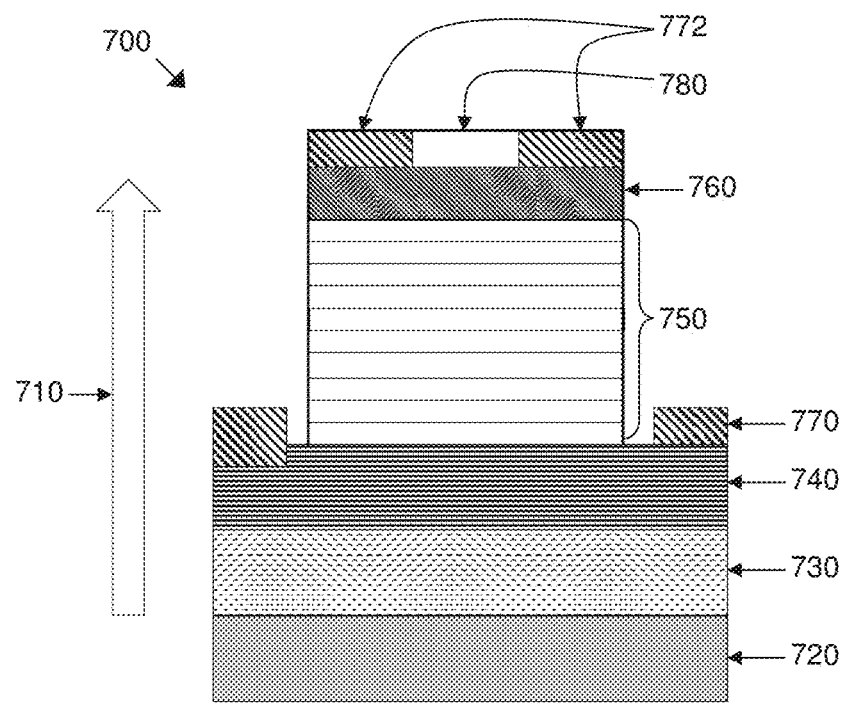
FIG. 7 illustrates a P-DOWN LED structure.

FIG. 7 illustrates a nitrogen-polar 'p-DOWN' LED structure 700 for a nitrogen-polar film growth with respect to a growth axis 710. To achieve an induced hole concentration beyond that achievable with impurity doping alone, the centre portion of the LED structure 700 has a gradient region 750 that transitions from a NBG composition to a WBG composition with increasing growth along the growth axis 710, which is substantially parallel to the spontaneous polarization axis, in this case the c-axis of the wurtzite crystal structure.

In order along the growth axis 710, the LED structure 700 comprises a substrate 720 which is in the form of a substantially opaque substrate such as Si(111) or a NBG native III-N substrate such as GaN, a buffer region 730, a NBG p-type region 740, the gradient region 750, and an WBG n-type region 760. Ohmic metal contacts 770 and 772 are provided and an optical window 780 may be provided to allow transmission of light from the top of LED structure 700. It will be appreciated that the buffer region 730 may instead, or as well, be a dislocation filter region.

The NBG p-type region 740 is preferably in the form of a p-type NBG layer or a p-doped superlattice of constant period and constant effective or average alloy composition (with $x_{ave}$=NBG composition). The gradient region 750 is then formed on the NBG p-type region 740 with an effective alloy composition which varies as a function of growth axis 710. The gradient region 750 forms the desired variation in bandstructure to form a transition from a NBG composition to a WBG composition. Optionally, at least a portion of the gradient region 750 can be doped with an impurity dopant. In preferred forms the gradient region 750 comprises $Al_{x(z)}Ga_{1-x(z)}$ or an [AlN/GaN] superlattice with a composition profile 'k' of $x_{ave}=x(z)=x_{NBG}+[x_{WBG}-x_{NBG}]*(z-z_s)^k$.

The WBG n-type region 760 is deposited upon the said gradient region 750, ideally having a similar effective alloy composition as the final composition achieved by the gradient region 750. This mitigates a potential barrier being induced at the heterojunction interface between the gradient region 750 and the WBG n-type region 760. In preferred forms, the WBG region is a doped superlattice or bulk type III-N layer.

A cap layer, such as an n-$Al_xGa_{1-x}N$ ($x\geq0$) layer, can optionally be deposited to provide an improved ohmic contact and a source of electrons.

The LED structure 700 illustrated in FIG. 7 can be formed using opaque substrates 720, such as Si(111), which have a high absorption coefficient for optical wavelengths generated from within the gradient region 750. Light can escape vertically through an optical outlet, preferably in the form of an aperture and/or window 780 in a suitable ohmic contact material 772. Shorter wavelength light is preferentially absorbed in the NBG regions creating further electron & holes through re-absorption. It is anticipated that high quality p-GaN native substrates or p-type SiC substrates can also be used.

Superlattice structures are preferably used to improve material structural crystal quality (lower defect density), improve electron and hole carrier transportation, and produce quantum effects that are only accessible at such small length scales. Unlike bulk type III-N materials, superlattices introduce new and advantageous physical properties, particularly in relation to diode and LED structures, such as those illustrated in FIGS. 6 and 7. A homogeneous period superlattice comprising at least two dissimilar semiconductor compositions, such as bilayered pairs of AlN and GaN, can be engineered to provide both (i) superlattice quantized miniband transport channels substantially along the growth axis (z), both in the tunnel barrier regime and above barrier regime; and (ii) improved carrier mobility within the plane of the superlattice layers by virtue of both periodicity inducted and bi-axial strain induced band deformation so as to warp the energy-momentum dispersion. The superlattice can also mitigate strain accumulation by depositing the constituent layers below their critical layer thickness. The superlattice having tailored conduction and valence band allowed energies and spatial wavefunction probabilities can be manipulated by the large built-in electric fields, such as the depletion fields described herein. For example, a constant period SL can be grown to exhibit a highly coupled structure and generate an efficient carrier transport channel through the structure along the growth axis. The highly coupled nature of the partially delocalized wavefunctions can be readily broken by large internal electric fields, rendering the coupled NBG regions essentially isolated (that is no communication between adjacent NBG regions). This can be advantageous for LED applications.

The superlattice quantized miniband transport channels improve transport along the growth axis (z) and can be used to generate selective energy filters. The improved carrier mobility can be used to dramatically reduce current crowding limitations in conventional device designs comprising mesa type structures. Conversely, the same superlattice structure can be altered in operation by the being subjected to large electric fields, such as the depletion regions generated in the structures disclosed herein.

Bulk III-N semiconductors can be characterised by a direct band structure which is defined by specific reference to the energy-momentum dispersion of the material which is dictated by the underlying atomic symmetry. A direct bandgap III-N material is therefore a structure which produces simultaneously a lowest energy conduction band dispersion with minimum energy at zone centre k=0, as well as a highest lying valence band dispersion, with its maximum also positioned at zone centre k=0.

Optical absorption and emission processes therefore occur as vertical transitions in the energy-momentum space and primarily as first order processes without phonon momentum conservation. The superlattice periodic potential, which is also on the length scale of the de Broglie wavelength, modulates the atomic crystal periodicity with a superposed superlattice potential which thereby modifies the energy-momentum bandstructure in a non-trivial way.

Figure 8:
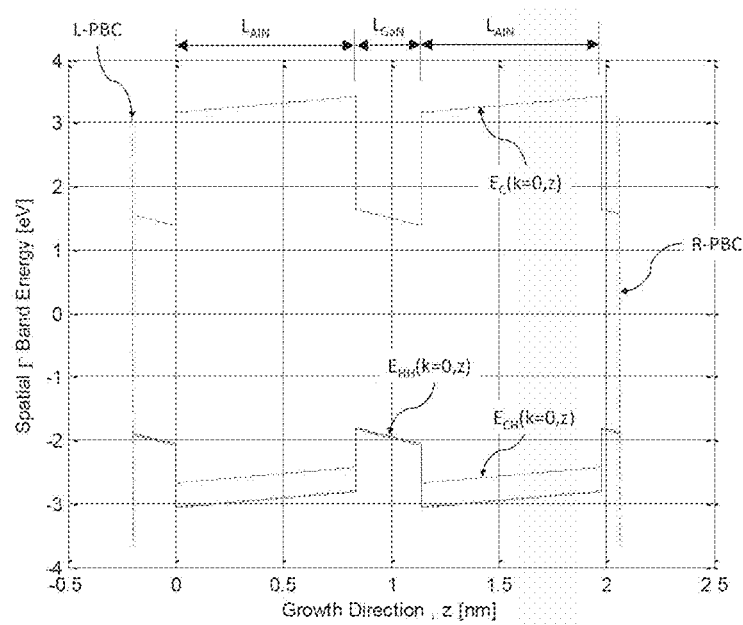
FIG. 8 illustrates a spatial band energy plot for a semi-infinite superlattice built from two repetitions of AlN/GaN.
Figure 9:
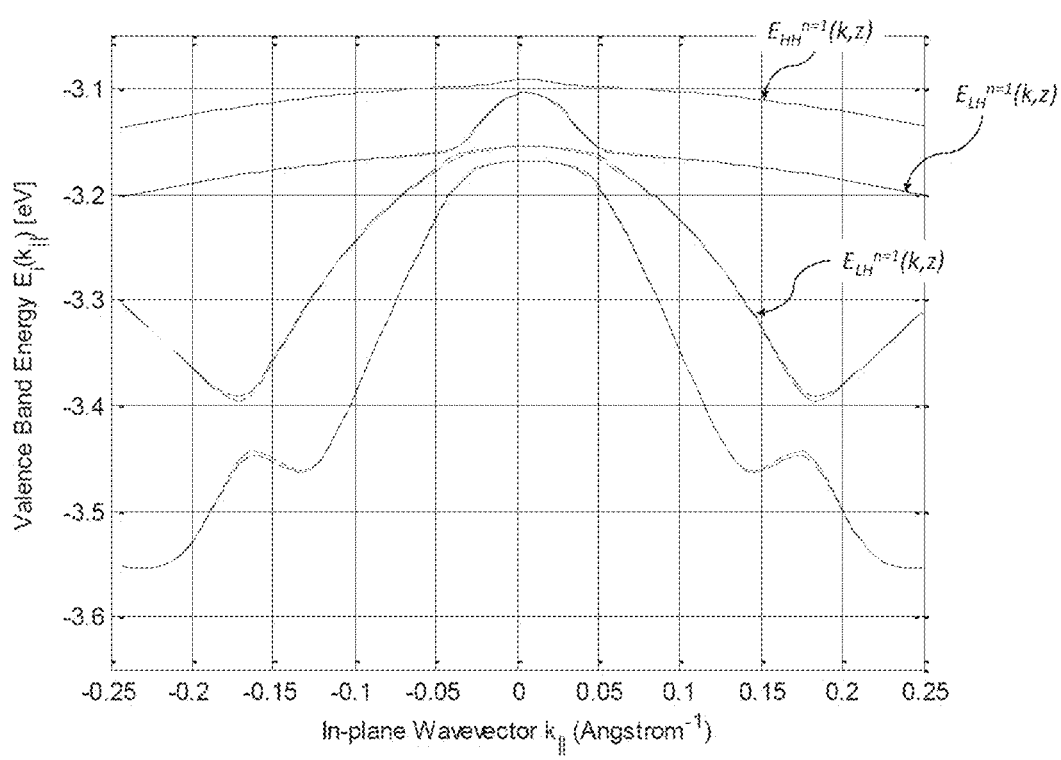
FIG. 9 illustrates a valence band dispersion for an intentionally ordered superlattice comprising a binary bilayered superlattice.

FIG. 8 illustrates estimated spatial band energy of a semi-infinite bilayered binary superlattice comprising a repeating unit cell of one monolayer of GaN to 3 monolayers of AlN. The superlattice is shown with periodic boundary conditions to simplify the calculation, and is strained to a fully relaxed AlN buffer. FIG. 9 illustrates estimated valence band energy-momentum dispersion, with the quasi-delocalized $n_{SL}$=1 HH, LH, and CH bands exhibiting highly warped departure from parabolic dispersions used in bulk approximations. The effective masses of the valence band carriers, namely, the HH, LH and CH are thereby modified from their equivalents in bulk-like alloys. An important aspect of the superlattice as described is that the HH remains the dominant band for optical emission transitions between the lowest energy quantized conduction states and the lowest energy quantized HH states. Therefore, the superlattice preserves a TE character for $0 \leq x_{ave} < 1$, unlike for bulk-like $Al_xGa_{1-x}N$ where there is a transition in TE to TM for x~0.65. This property is essential for vertically emissive devices.

Short period superlattices with the period less than or equal to 10× the free lattice constant of the constituent bulk materials form a new pseudo-alloy with pronounced differences in in-plane energy-momenta from their equivalent bulk-like random metal distribution alloy counterparts. Furthermore, binary AlN/GaN superlattices form a new class of ordered alloys capable of producing new and improved properties over equivalent bulk-like alloys. Optical absorption and emission processes typically require accounting for the off-zone centre ($k \neq 0$) contributions of the superlattice band structure. For the present cases only the $k=0$ and lowest energy quantized and spatial wavefunction (labelled herein as the $n_{SL}=1$ states) are used and are found experimentally to be sufficient.

Figure 10A:
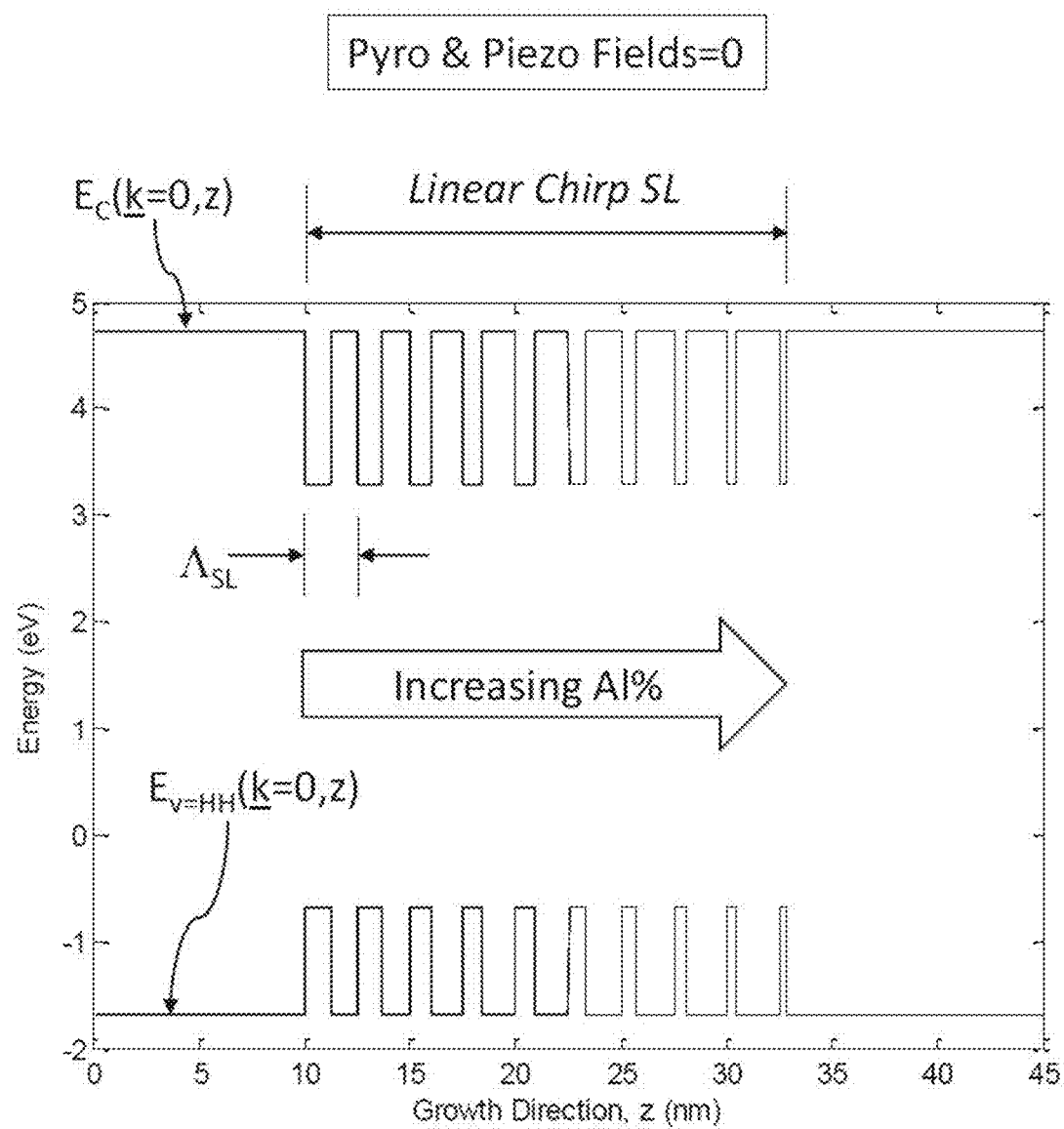
FIG. 10A illustrates a spatial band structure for a linearly chirped superlattice with piezoelectric and pyroelectric fields absent.
Figure 10B:
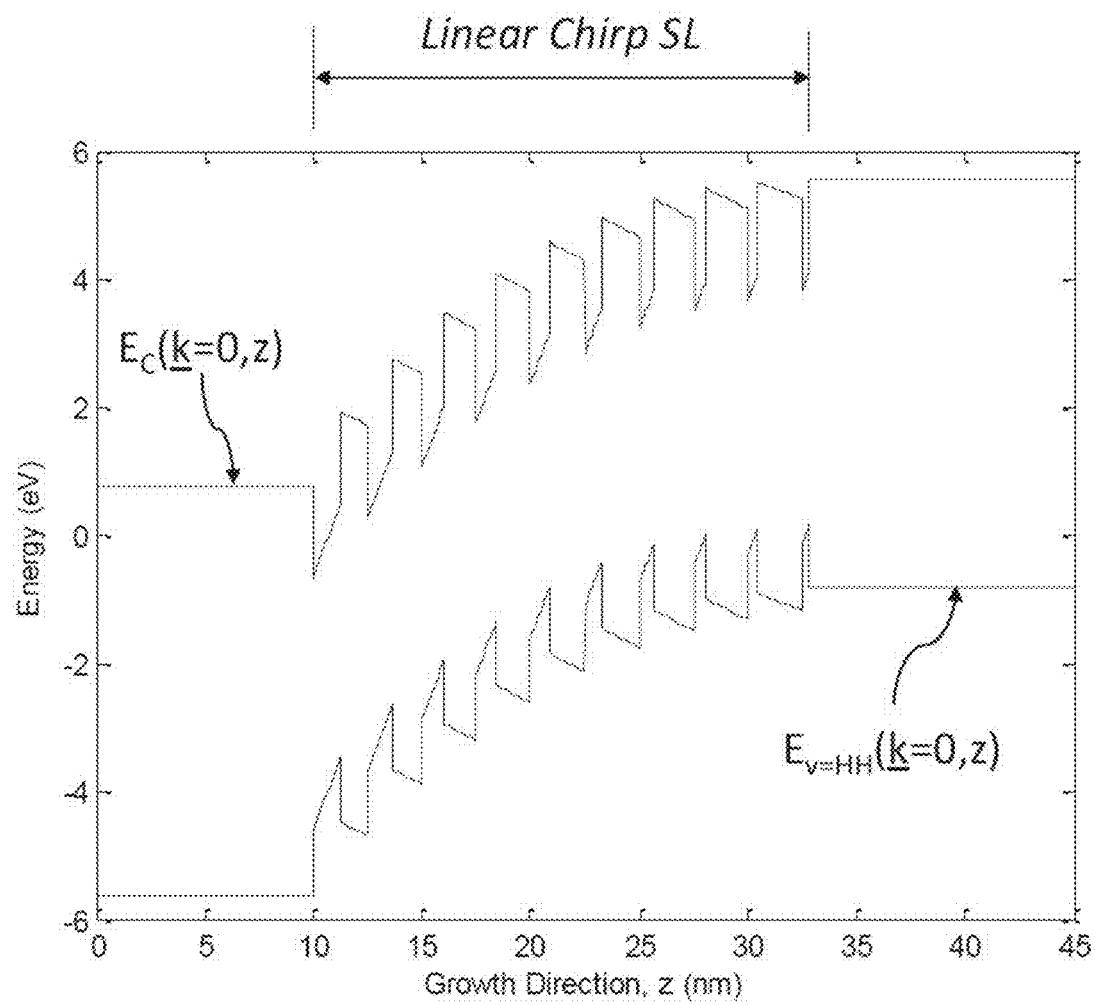
FIG. 10B illustrates a spatial band structure for a linearly chirped superlattice with polarization fields applied.

Electric polarization fields can have an effect on the optical properties of chirped or intentionally profiled bandstructure. For example, consider a linearly chirped bilayered [AlN/GaN] superlattice, sandwiched between two oppositely positioned AlN cladding layers. FIGS. 10A and 10B illustrate estimated spatial bandstructure of this not intentionally doped structure. Specifically, FIG. 10A illustrates zone centre bandstructure with piezoelectric and pyroelectric fields absent, and FIG. 10B illustrates it with polarization fields applied generating complex built-in electric fields along the growth axis (z). The resulting built-in electric field along the growth axis (z) is solely due to charges induced at each heterojunction due to pyroelectric (spontaneous) and piezoelectric effects. Each period of the superlattice is held constant and the average alloy content with the $i^{th}$ period having thickness $L^i_{AlN}(z)$ and $L^i_{GaN}(z)$, such that $A^i_{SL}=L^i_{AlN}(z)+L^i_{GaN}(z)$. The abrupt spatial modulation in the conduction and heavy-hole valence band edges (i.e., at zone center wavevector k=0) are indicative of atomically abrupt interfaces formed at the heterojunction of each AlN and GaN transition. An atomically rough interface would effectively broaden the potential wells but otherwise results in similar behaviour. In alternative embodiments, interfacial roughness at each heterojunction can be accounted for using an equivalent AlGaN interlayer, thus forming a trilayered unit cell.

Figure 11A:
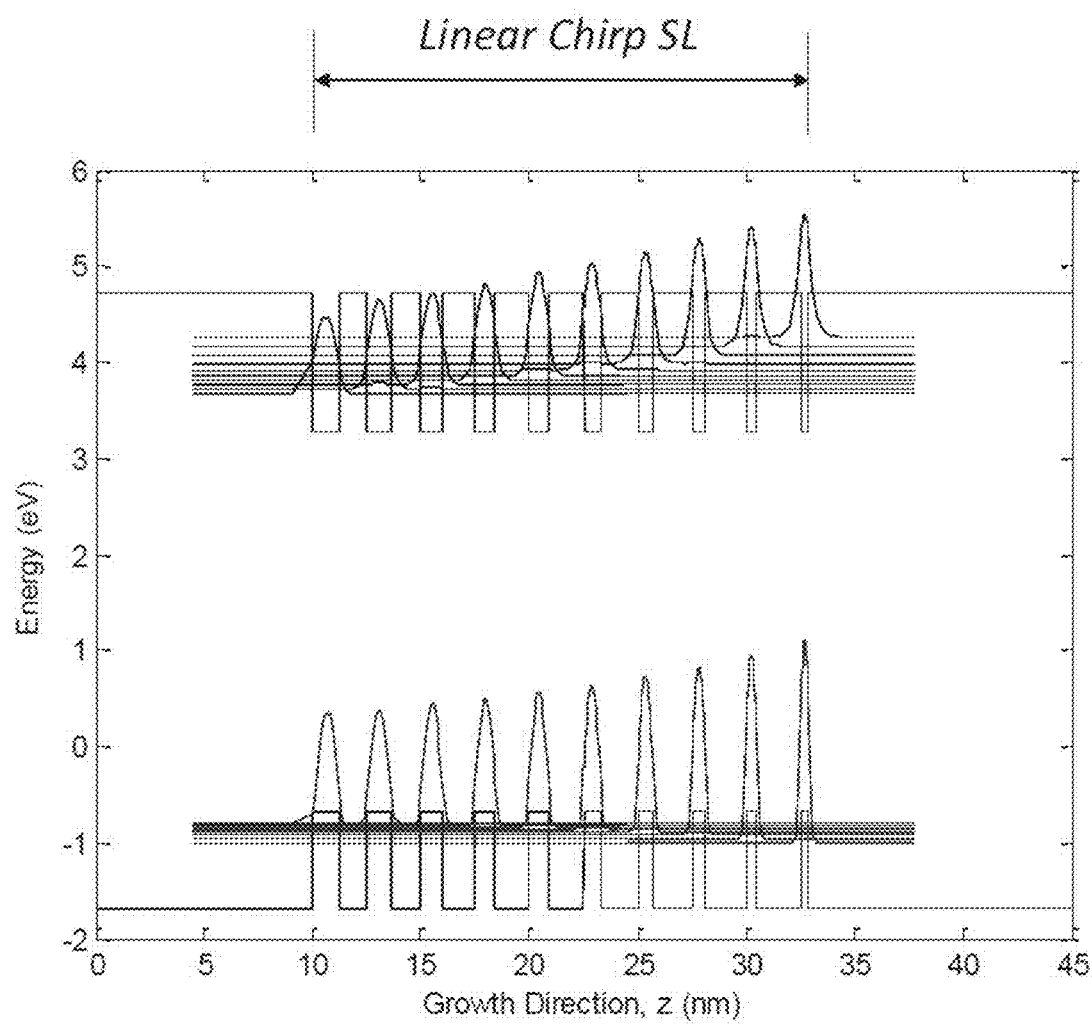
FIG. 11A illustrates an electron and heavy-hole valence quantized energy for a linearly chirped superlattice.
Figure 11B:
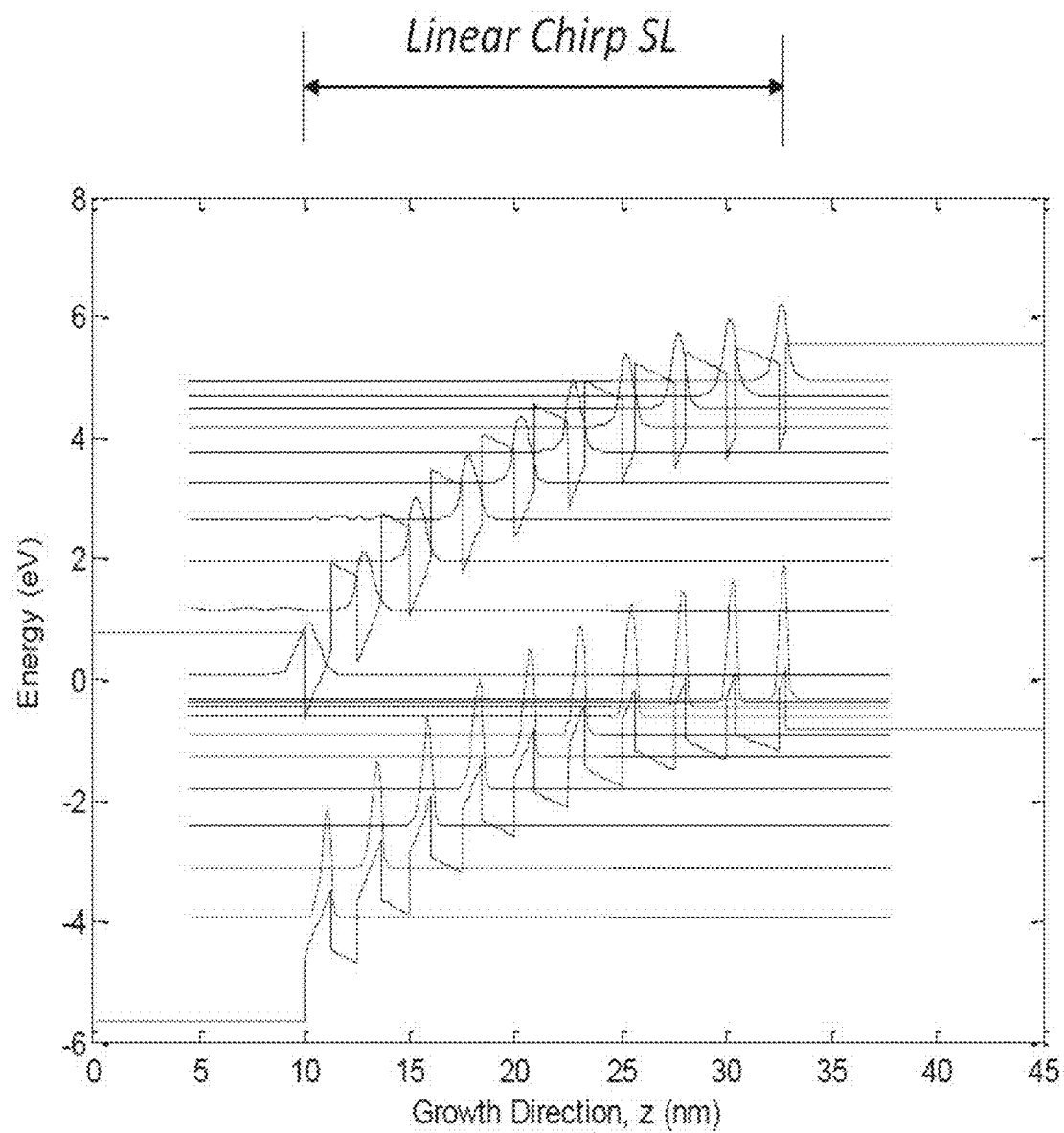
FIG. 11B illustrates a confined spatial wavefunction for a linearly chirped superlattice.

FIGS. 11A and 11B illustrate the lowest energy calculated carrier spatial wavefunctions and quantized energy levels allowed within the structure. Relatively thick AlN barriers, used in this example for clarity, show that the wavefunction tunneling is significant into the barrier for the lighter effective mass electrons compared to the heavy-holes. The general trend is for the quantized n=1 electron and hole wavefunction eigenenergies to drop further into the NBG potential well with increasing NBG material thickness.

The non-linear electric field generates a Quantum Confined Stark Effect (QCSE) across each GaN quantum well and an opposing QCSE across each barrier (AlN). The sign of the built-in electric field depends on the growth polarity of the material. The resulting wavefunction probability densities confined within each potential energy minimum due to the built-in fields are skewed spatially toward the lower potential energy interface.

It can be seen that the electron and heavy-hole wavefunction maxima are spatially separated to opposing sides of the potential minimum and is exacerbated for larger GaN layer widths. This manifests as a reduction in the electron and HH wavefunction overlap for increasing GaN thickness and creates a polarization induced transparency due to the reduced exciton oscillator strength. Conversely, thinner GaN layers improve the n=1 conduction and HH wavefunction overlap and thus creates a higher probability for an optical transition and increased emission probability. This effect is shown in FIGS. 12H & 13D.

Figure 12A:
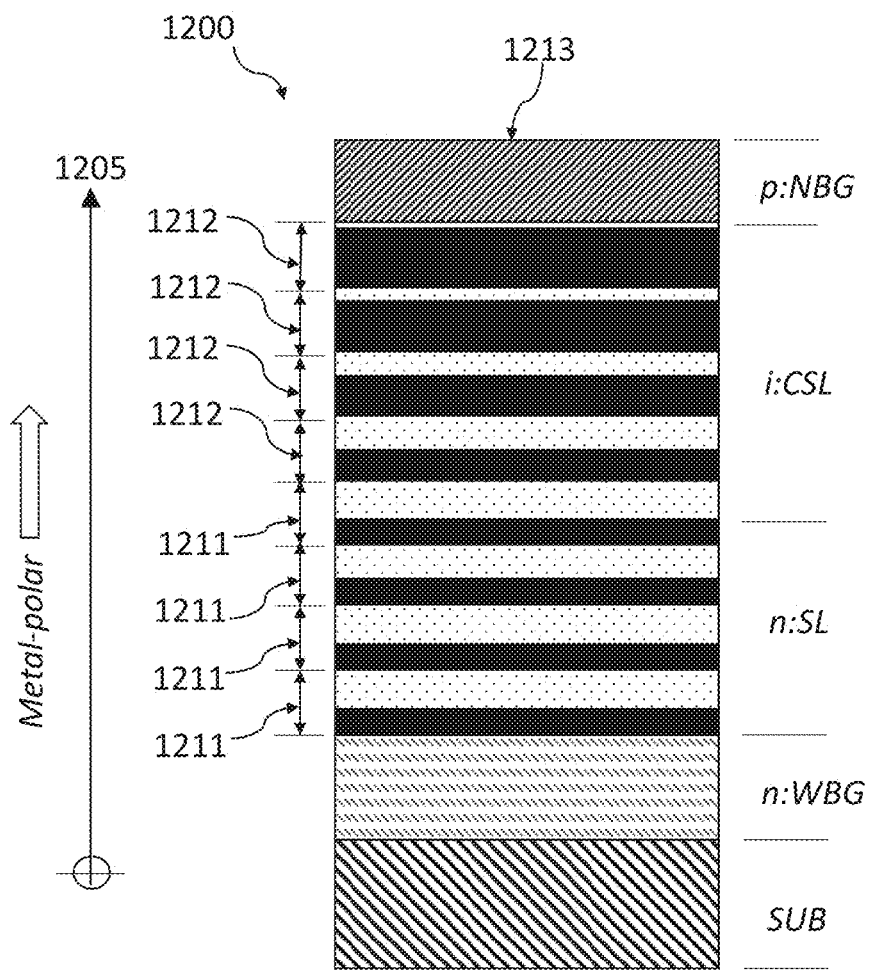
FIG. 12A illustrates a stack for generating electrical and optical portions of a p-n diode according to some embodiments.
Figure 12A:
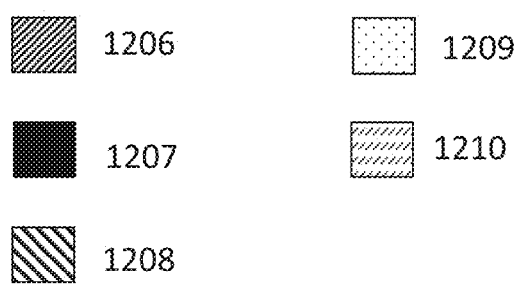

FIG. 12A shows a stack 1200 for generating electrical and optical portions of a p-n diode according to some embodiments. The stack 1200 comprises a substrate SUB. The SUB is made of a material 1208 that is conducive to the forming of wurtzite III-N compositions having a metal-polar growth orientation along growth axis 1205. A n-type WBG buffer layer (n:WBG) 1210 is deposited as a bulk-like alloy or as a fixed average composition unit cell superlattice on the SUB. Next, an n-type SL (n:SL) is formed using average alloy content $x_{ave\_n}$ on the n:SL. For example, the n:SL can be a 50 period SL formed with an $x_{ave\_n}=0.8$. Preferably, the unit cell thicknesses 1211 and layer thicknesses are selected to form an n:SL that is substantially transparent (not absorbing) to a desired emission wavelength $\lambda_{ex}$.

Next a graded SL (i:CSL) that is not intentionally impurity doped is formed. The i:CSL is used to induce a large hole concentration deep within the device that is free from substitutional impurity doping limitations. The i:CSL varies at least an average composition of a unit cell spatially along the growth axis from a WBG composition to a NBG composition. For example, the grading is selected to occur over 25 unit cells (i.e. 25 periods) with each unit cell total thickness 1212 held constant while the average Al % is varied, with the WBG composition having $x_{ave\_CSL}=0.8$ and the NBG composition having $x_{ave\_CSL}=0.0$. An optional contact layer comprising p-GaN (p:NGB) is deposited upon the completed i:CSL. It is also possible to vary the unit cell thickness of the i:CSL as a function of the growth axis so long as the average composition of the said unit cell follows the correct grading as disclosed herein.

Figure 12B:
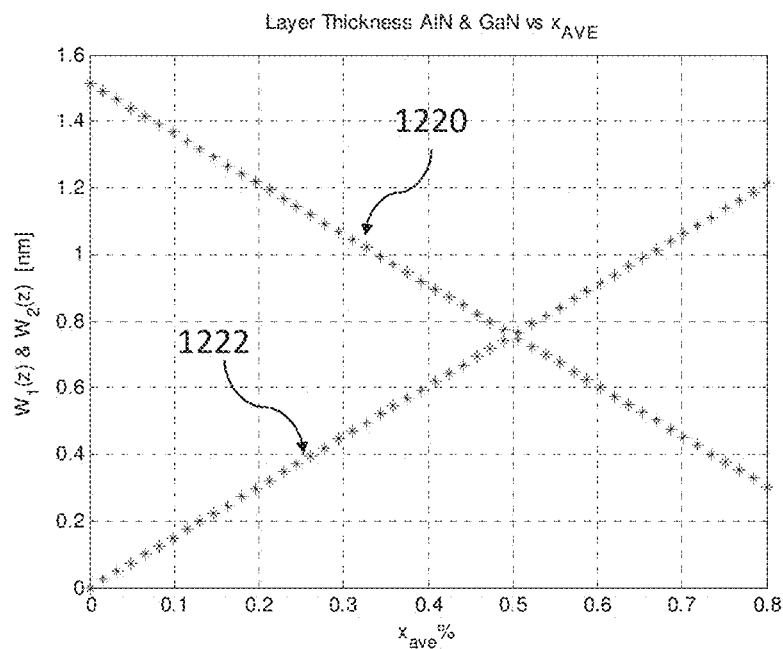
FIG. 12B illustrates thicknesses of GaN and AlN layers in the unit cell of a superlattice to achieve a desired average alloy composition.
Figure 12C:
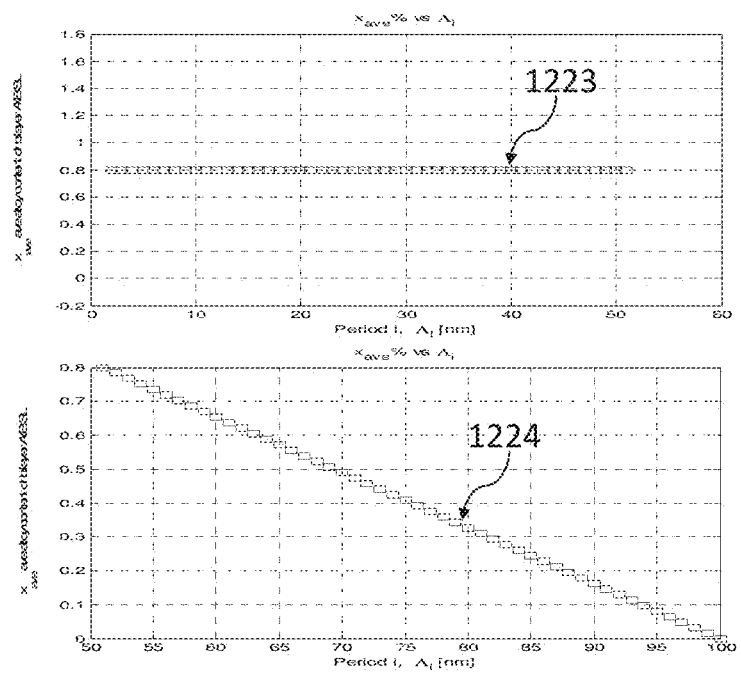
FIG. 12C illustrates the average alloy content as a function of periods along the growth axis for each of the n:SL and the i:CSL in the stack in FIG. 12A.

The i:CSL and the n:SL can be formed of bilayered unit cells comprising a layer of GaN 1207 and a layer of AlN 1209. Other choices of superlattice composition are also possible, and the composition of the unit cells can also be altered from period to period. For example, a unit cell period is selected to be equivalent to a combined thickness of 2 ML of GaN and 4 ML of AlN. FIG. 12B shows the layer thickness of GaN 1220 and AlN 1222 required to achieve an average alloy composition of bilayered unit cell $x_{ave}$. FIG. 12C also shows the average alloy variation as a function of the growth axis 1205 for each of the n:SL and i:CSL. Curve 1223 shows a constant $x_{ave\_n}=0.8$ is selected for the n:SL whereas curve 1224 shows a linear $x_{ave}(z)$ grading is selected for the i:CSL.

Figure 12D:
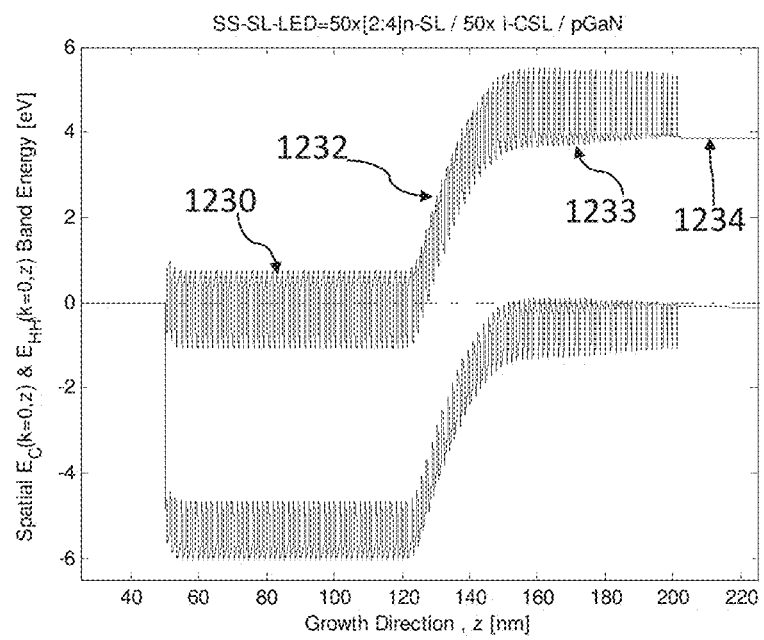
FIG. 12D shows the calculated spatial energy band structure of the conduction and heavy-hole bands of the stack in FIG. 12A.

The induced spatial energy band structure of the stack 1200 is shown in FIG. 12D. The n:SL denoted by 1230 is intentionally doped with Si impurities to a doping level of $N_D=50\times10^{18}$ cm$^{-3}$. The i:CSL shows an induced p-type portion 1233 as well as a depletion region 1232. The portion of the i:CSL contacting the p:NGB 1234 shows the heavy-hole valence band pinned to the Fermi energy. Thus the n:SL/i:CSL/p:GaN diode is formed with a further induced p-type region as shown further in FIG. 12E.

Figure 12E:
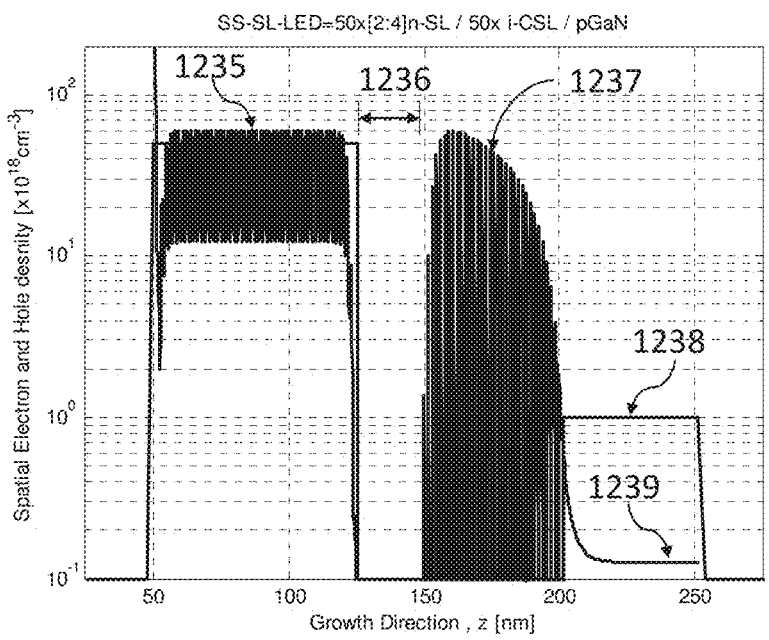
FIG. 12E shows the electron and hole carrier concentrations induced in the stack of FIG. 12A.

FIG. 12E shows the spatial carrier densities along the growth axis. The carrier densities include the intentionally doped and resulting electron concentration 1235 due to the n:SL, and the intentional p-GaN doping concentration 1239. Note the degeneracy of the valence band reduces the activated doping density relative to the areal doping in the lattice. The portion of the i:CSL that has a large induced HH concentration 1237 is shown along with the resulting depletion region 1236 defining the n-i-p diode.

Figure 12F:
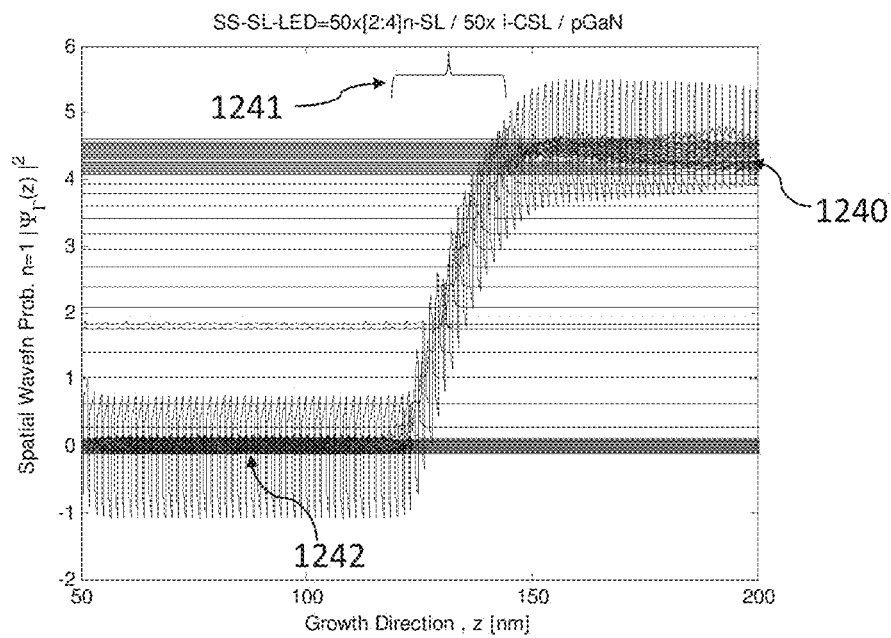
FIG. 12F shows the calculated lowest energy n=1 quantized electron spatial wavefunctions within the stack of FIG. 12A.
Figure 12G:
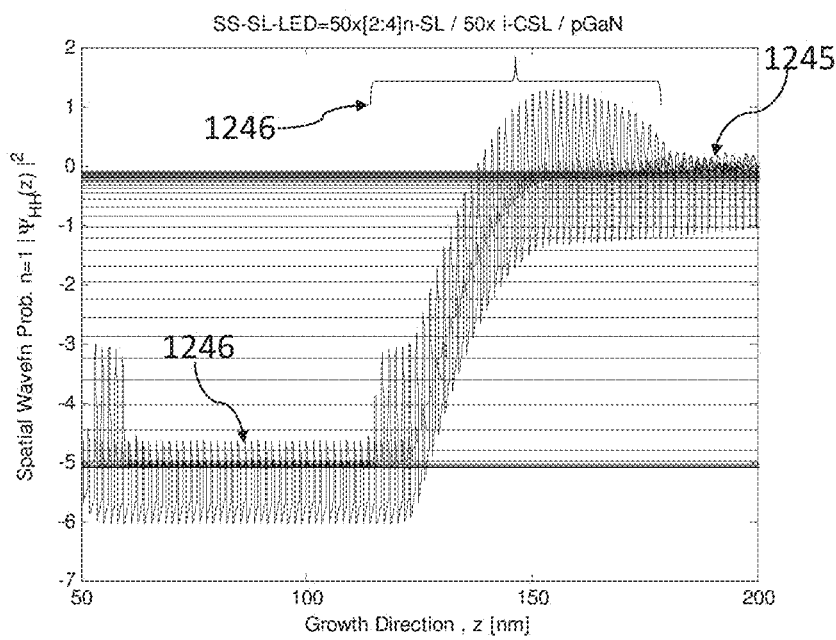
FIG. 12G shows the calculated lowest energy n=1 quantized heavy-hole spatial wavefunctions within the stack of FIG. 12A
Figure 12H:
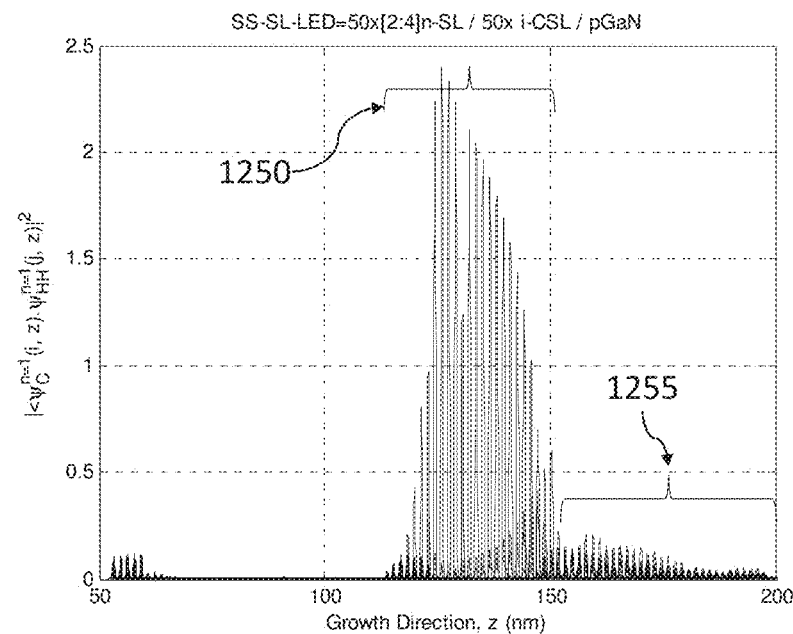
FIG. 12H shows the calculated overlap integrals between the lowest energy n=1 quantized electron and heavy-hole spatial wavefunctions within the stack of FIG. 12A.

The lowest energy band edge quantized states are sufficient to determine the majority of the electronic and optical character of the device. FIGS. 12F and 12G show the calculated n=1 states in the conduction and HH valence bands, respectively. Both the conduction and HH bands show miniband formation as indicated by the partially delocalized wavefunctions 1242 and 1246 due to the short period n:SL. The depletion region created by the induced p-type region of the i:CSL penetrates into a portion of the n:SL and effectively breaks the wavefunction coupling in regions 1241 and 1246. The confined electron and HH wavefunctions in regions 1241 and 1246 determine the recombination region of the device and thus the emission energy spectrum due to the direct transitions between the n=1 conduction states and the n=1 HH states.

Figure 12I:
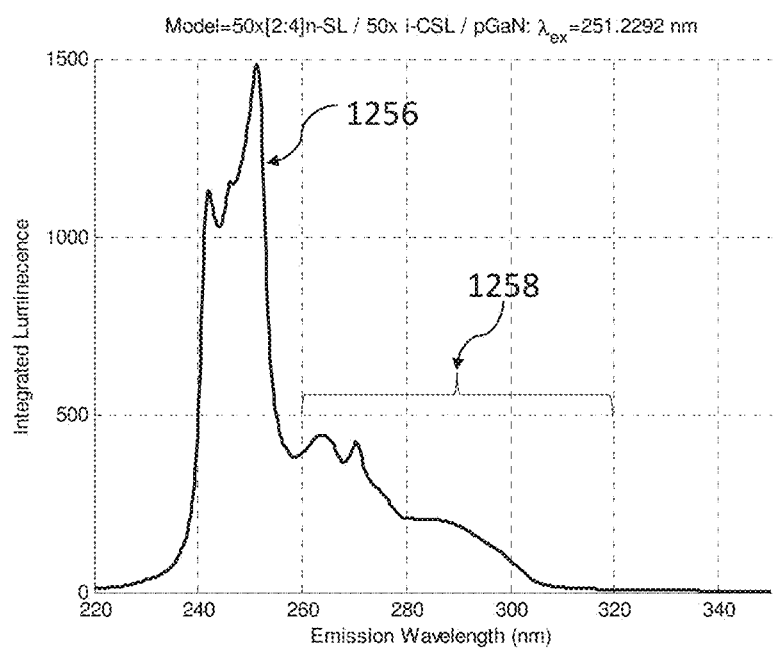
FIG. 12I shows the calculated optical emission spectrum for the stack of FIG. 12A

FIG. 12H shows the calculated spatial overlap integrals between all n=1 conduction states with n=1 HH wavefunctions. The highest oscillator strength for an optical transition occurs in the region 1250, whereas the portion of the i:CSL that has a wider GaN thickness creates only relatively poor overlap 1255. This effect is highly advantageous for creating polarization induced transparency within a p-like region. The optional p-GaN layer can also be removed to allow the higher energy photons to be retroreflected back into the structure and outcoupled through the substrate. The full emission spectrum is shown FIG. 12I showing the strong excitonic emission peak 1256 due to the depletion region created within the device and localized between the n:SL and the i:CSL. The smaller contributions 1258 are due to the i:CSL region.

Figure 13A:
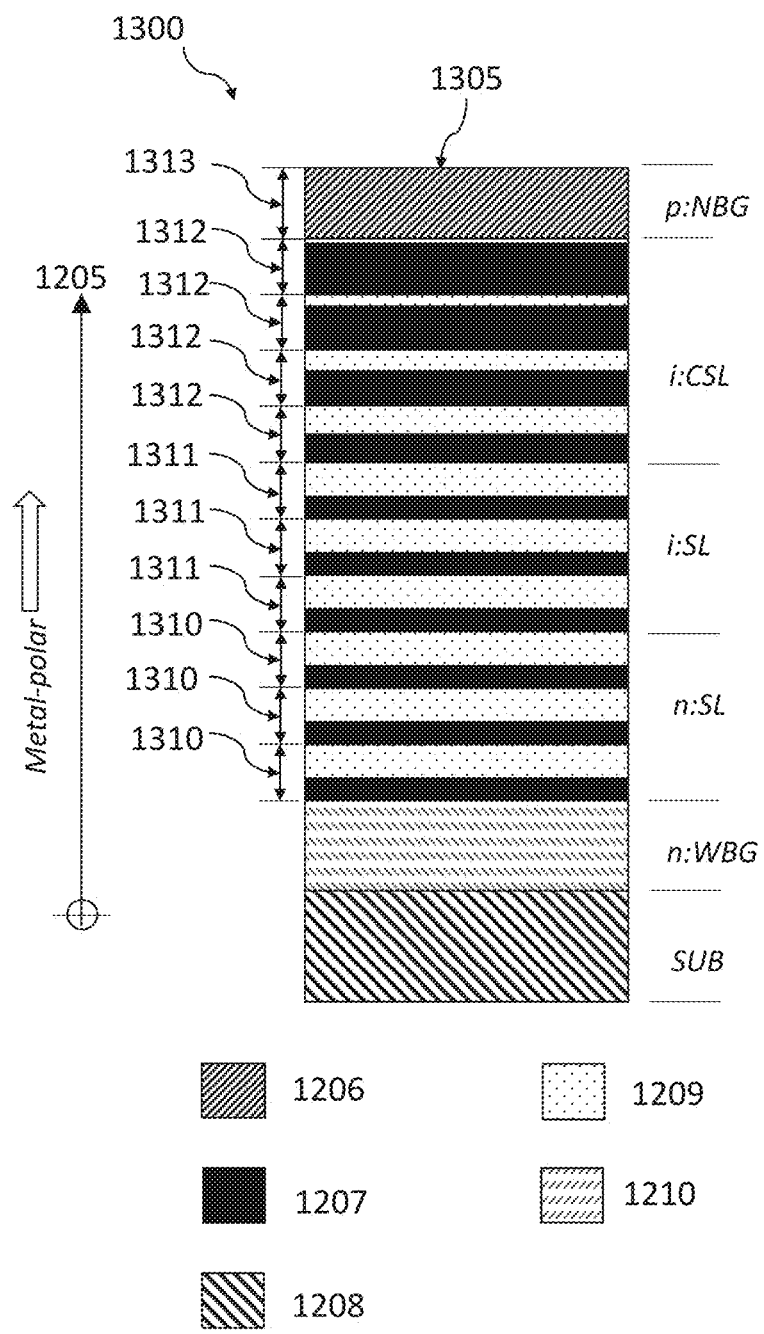
FIG. 13A illustrates a stack for generating electrical and optical portions of a p-i-n diode according to some embodiments.

FIG. 13A shows a stack 1300 for generating electrical and optical portions of a p-i-n diode according to some embodiments. The superlattices are again constructed from unit cells having binary wurtzite GaN 1207 and AlN 1209 layers and a metal-polar growth. However, stack 1300 comprises an additional i-type SL (i:SL) that is not intentionally doped. The i:SL is formed upon the n:SL. The i:SL is designed specifically to achieve an emission energy of light that is substantially smaller in energy than that which the n:SL can absorb (i.e., the absorption edge of the n:SL is designed to have an energy larger than the emission energy of the i:SL). For example, the n:SL is composed of unit cells 1310 having 1 ML GaN and 2 ML AlN with 50 repetitions. The i:SL is then selected to have an emission energy of about 246 nm by selecting a unit cell 1311 comprising 2 ML GaN and 4 ML AlN with 25 repetitions. However, more or less periods can be used in both the n:SL and i:SL constructions.

Both the n:SL and i:SL have the same average alloy composition, namely $x_{ave\_n}=2/3$ and $x_{ave\_i}=4/6=2/3$ (i.e. $x_{ave\_n}=x_{ave\_i}$). Thus polarization charges are balanced and do not induce p-type or n-type behaviour. This is particularly advantageous for creating an improved electron and hole recombination region within the device. The graded SL (i:CSL) is formed with a unit cell that is varied from a WBG average composition to a NBG average composition. The i:CSL unit cell thickness is held approximately constant and is equivalent to a 3 ML GaN and 6 ML AlN unit cell. The thickness of the layers in each successive unit cell are altered in increments of ½ML thickness in order to achieve a desired grading profile of $2/3 \leq x_{ave\_CSL(z)} \leq 0$ along the growth axis 1205. This can be achieved with as little as 18 unit cells, but less or more unit cells can also be used.

Figure 13B:
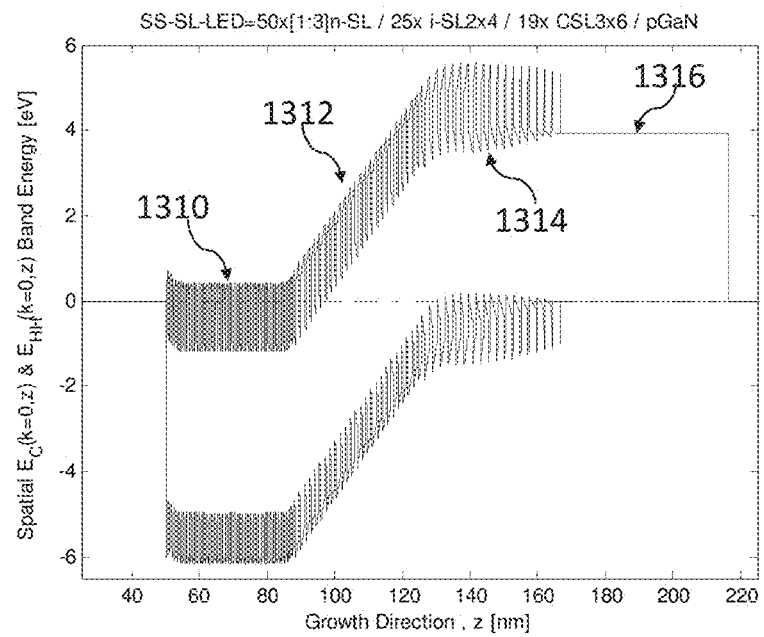
FIG. 13B shows the calculated spatial energy band structure of the conduction and heavy-hole bands of the stack in FIG. 13A.

FIG. 13B shows the spatial energy band structure within the n:SL 1310, i:SL 1312 and i:CSL 1314 along with the optional p-GaN region 1316. The i:CSL induces a pinning of the HH valence band to the Fermi energy.

Figure 13C:
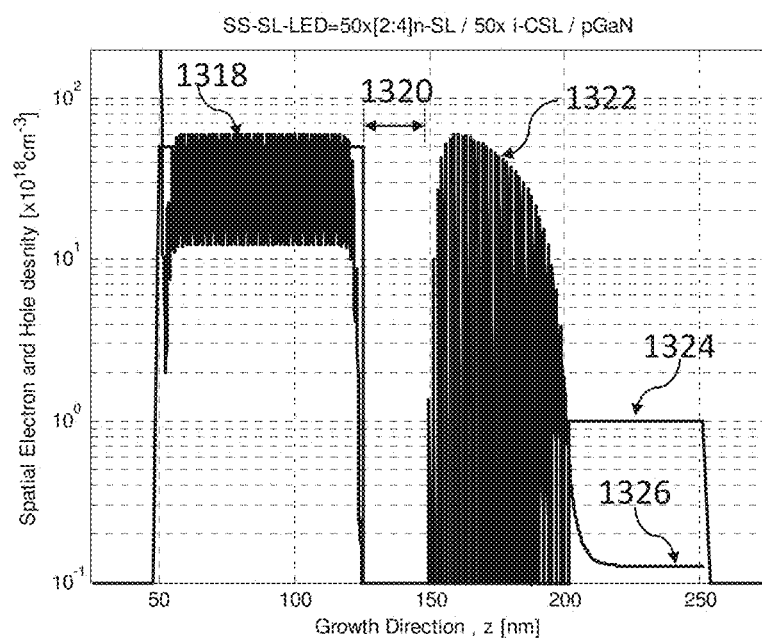
FIG. 13C shows the electron and hole carrier concentrations induced in the stack of FIG. 13A.
Figure 13D:
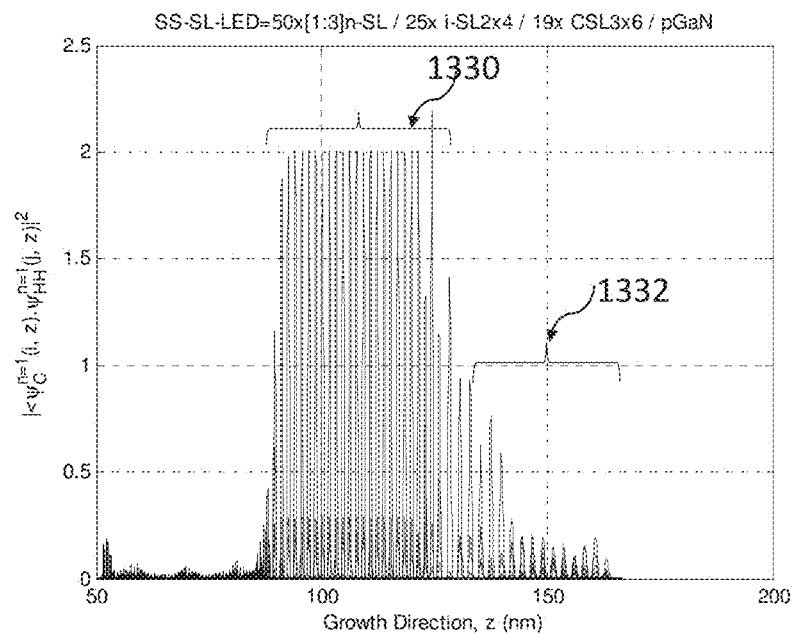
FIG. 13D shows the calculated overlap integrals between the lowest energy n=1 quantized electron and heavy-hole spatial wavefunctions within the stack of FIG. 13A.

The induced carrier concentrations in the stack 1300 are shown in FIG. 13C, where the large electron 1318 and HH 1322 carrier concentrations are spatially generated. The intentional doping concentration in the p-GaN region 1326 is shown as well as the depletion region 1320 of the device.

FIG. 13D shows the calculated spatial conduction and HH overlap integrals (i.e. oscillator strengths) for the exciton emission. The exciton emission is clearly localized in a region 1330 that overlaps the i:SL. The polarization induced transparency region 1332 due to the majority of the i:CSL comprising NBG compositions does not significantly contribute to the overlap integrals.

Figure 13E:
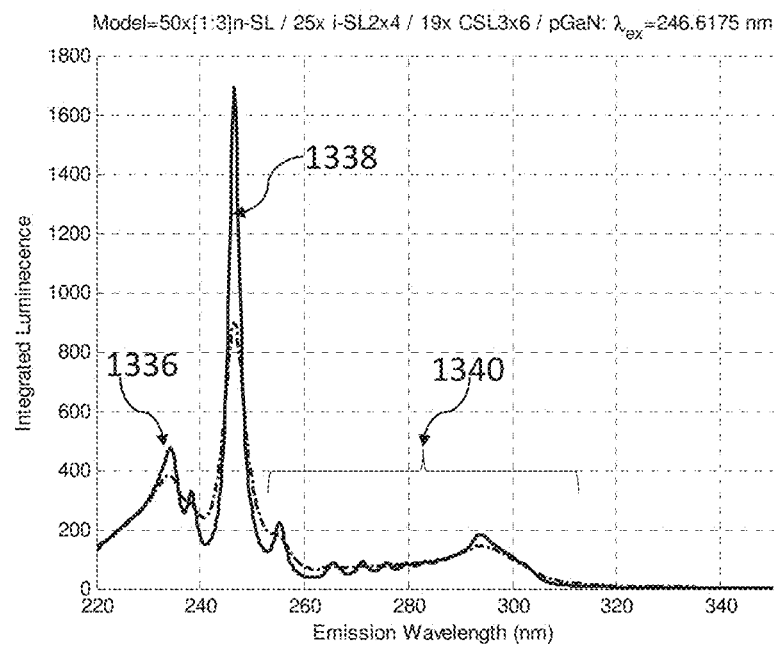
FIG. 13E shows the calculated optical emission spectrum for the stack of FIG. 13A.

FIG. 13E shows the emission spectrum of the stack 1300 where the main peak 1338 is due to the i:SL and the smaller contributions 1340 are due to the i:CSL region. The n:SL produces the feature labelled 1336 which is typically suppressed due to phase space absorption/emission quenching (i.e., all states are fully occupied and cannot participate in optical process due to phase-space absorption filling for in-plane wavevectors $k_\parallel \sim 0$).

Figure 14:
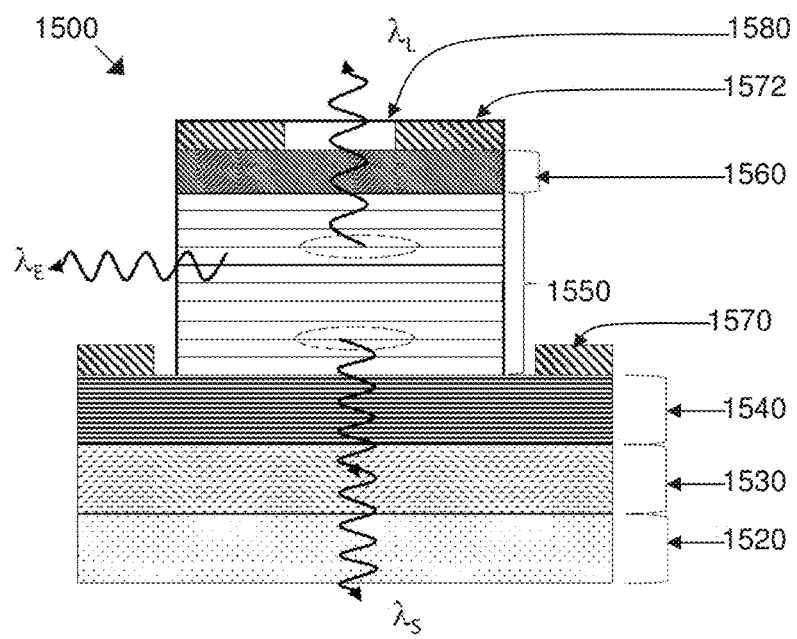
FIG. 14 illustrates an example two port LED structure.

FIG. 14 illustrates an LED structure 1400 having a substrate 1420 which is preferably a transparent substrate such as sapphire, a buffer and/or dislocation filter layer 1430, an n-type region 1440 in the form of an n-type superlattice (n:SL) of constant period and constant $x_{ave}$, a gradient region 1450 in the form of an i-type superlattice (i:SL), a p-type superlattice (p:SL) or bulk type contact region 1460, metal contacts 1470 and 1472, and an optical window 1480.

Light $\lambda_L$ can be emitted from the optical window 1480 and light $\lambda_S$ can be emitted through the substrate 1420. Furthermore, light can escape the structure via edge emission vectors $\lambda_E$. For a linearly chirped gradient region 1450 grown on a metal-polar orientation along the growth axis (z) the gradient region 1450 would emit longer wavelength light $\lambda_L$ through the optical window, whereas shorter wavelength light $\lambda_S$ would be emitted through the substrate. This is a direct result of the 'optical diode' effect for emission of light within a spatially varying effective band gap region provided by the gradient region 1450, which can be particularly useful for DUV LED applications.

Another gradient pattern growth sequence is to vary period thickness as a function distance along the growth axis, while keeping the $x_{ave}$ of bilayered pairs constant. Such structures can be used to form tuneable optical properties of an n-type and p-type region separately to the recombination within an i-type region. That is, by keeping $x_{ave}$ constant, but varying the period of the superlattice, it is possible to tune the optical properties of an LED stack of the form:

$$[n{:}SLx_{ave1},\Lambda_1]/[i{:}SLx_{ave2},\Lambda_2]/[p{:}SLx_{ave3},\Lambda_3]$$

where the effective Al % of each superlattice is held constant throughout the p-n structure so that $x_{ave1}=x_{ave2}=x_{ave3}$=constant, and is independent of grown direction (z). This case would not create an induced p-type or n-type region as average alloy composition is conserved. The period of the superlattice repeating units cells, for example $(\Lambda_1=\Lambda_3)<\Lambda_2$ can be constructed so that $x_{ave1}=x_{ave2}=x_{ave3}$ and thus the i:SL has a quantized energy transition between the n=1 electron and heavy-hole valence band that is smaller in energy than the corresponding n=1 transition of at least one of the p:SL and n:SL. The advantage is the effective lattice matching of the in-plane lattice constant of the superlattice unit cell (e.g., bilayered AlN/GaN pairs), which mitigates strain accumulation and reduces defect density due to misfit dislocations.

An extension to the above example is a quasi continuous variation in period of the i:SL so as to form a linearly chirped band structure suitable for carrier miniband injection and recombination to form broadband luminescent devices. Consider the LED structure of FIG. 14 showing an:

$$[n{:}SLx_{ave1}=\text{const},\Lambda_1=\text{const}]/[i{:}SLx_{ave2}(z),\Lambda_2(z)]/[p\text{-GaN}]$$

The composition of the i:SL region is varied along the growth axis with average alloy composition controlled by the ratio of the thicknesses of the different composition layers comprising the unit cell. For the case of two binary compositions of GaN and AlN the average Al mole fraction of the unit cell is defined herein as $x_{ave}=L_{AlN}/(L_{GaN}+L_{AlN})$, representing an equivalent bulk-like ordered alloy of $Al_{xave}Ga_{1-xave}N$. The unit cell thickness from period-toperiod $\Lambda_{SL}=(L_{GaN}+L_{AlN})$ can also be varied. In such a case, the average alloy composition of each unit cell conforms to the required gradient or trend along the growth axis to achieve an induced n-type or p-type region or to balance the polarization and prevent band edge warping.

Figure 15:
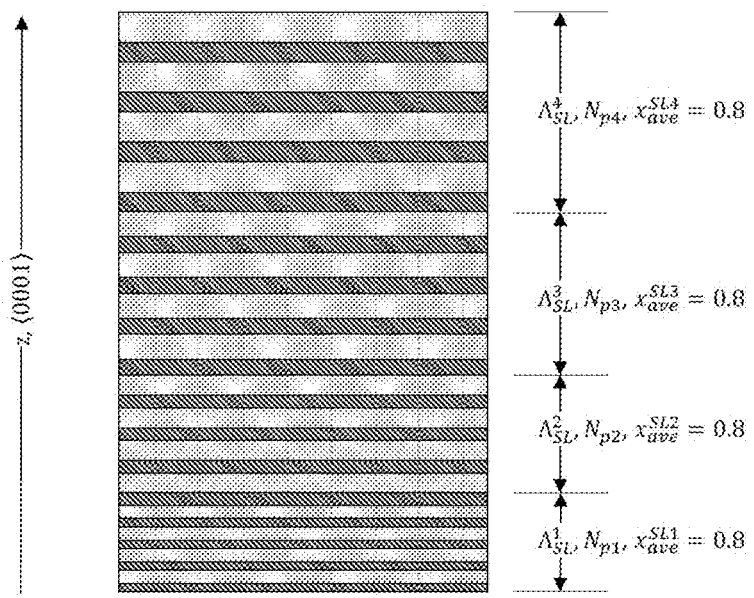
FIG. 15 illustrates a gradient pattern growth sequence for a chirped period and constant $x_{ave}$ superlattice.

FIG. 15 illustrates a further gradient pattern growth sequence for a gradient region 1500 with a chirped period and constant $x_{ave}$ superlattice structure. Each of the sections $(\Lambda^1_{SL}-\Lambda^4_{SL})$ comprise $N_p=25$ repetitions with four sequentially stacked superlattices with incrementally varied period. The average alloy content of each superlattice is kept constant. However, the period of the unit cell in each stack is varied by varying the thickness.

Many substrates have been explored for achieving wurtzitic III-N epitaxy, namely, (i) native substrates and (ii) non-native substrates. At present bulk native GaN and bulk native AlN substrates exist, however, they are of extremely high cost and available only as small wafer diameters which severely limits widespread penetration into high volume applications such as, for example, LEDs and power transistors.

Non-native substrates are the most prevalent for III-N epitaxy and offer other advantages beyond simply cost reduction and large wafer diameters. The most popular non-native substrates for III-N epitaxy are sapphire and silicon. Many other non-native substrates exist such as, for example, MgO, CaF2, and LiGaO.

Sapphire offers a compelling commercial and technological utility for high Al % III-N epitaxy due to the mechanical hardness, deep UV optical transparency, an extremely wide band gap, and its insulating properties. Sapphire is readily grown using bulk crystal growth methods such as CZ and is manufacturable as extremely high quality structural quality single crystal wafers, available in predominately, r-plane, c-plane, m-plane, and a-plane. C-plane sapphire is an important template surface compatible with III-N epitaxy.

Even though much work has been developed for wz-III-N/c-plane $Al_2O_3$, there still exists a large opportunity for further improving the epitaxial quality of III-N on these metal-oxide surfaces. Many attempts have been demonstrated for semipolar and non-polar III-N epitaxy on r-plane, a-plane, and m-plane sapphire with limited improvement over those found using hexagonal c-plane sapphire.

For the applications discussed herein, there is a preferred method for preparing c-plane sapphire surface for achieving high quality metal-polar or nitrogen-polar III-N films. Sapphire, unlike wurtzite and zinc-blende crystals, has a more complex crystal structure. Sapphire is represented by a complex 12 unit cell comprising of oxygen planes interposed with buckled bilayers of Al atoms. Furthermore, c-plane sapphire exhibits a mechanical hardness much higher than r-plane sapphire and thus polishing damage or polishing induced work hardening can readily impede production of atomically pristine surface species. Even though chemical cleaning can be used to produce a contaminant free surface, and the bulk sapphire substrate shows excellent single crystal quality, the surface investigated by reflection high energy electron diffraction (RHEED) exhibits a signature of c-plane sapphire which is always indicative of an atomically rough and non-homogeneous surface. Surface steps in sapphire also readily expose mixed oxygen and atomic crystalline regions which directly affect the initiating III-N polarity during epitaxy, and typically results in polarity inversion domains (PIDs).

The first surface of the initiating template may be terminated in a substantially atomically flat and homogeneous surface termination species. For example, a bulk Si(111) oriented surface enables improvements in epitaxial polarity control by virtue of the homogeneous substrate composition, namely, Si atoms. By careful initial epitaxial film deposition to the Si surface it is possible to induce either Al-polar or N-polar AlN epitaxial growth.

Figure 16:
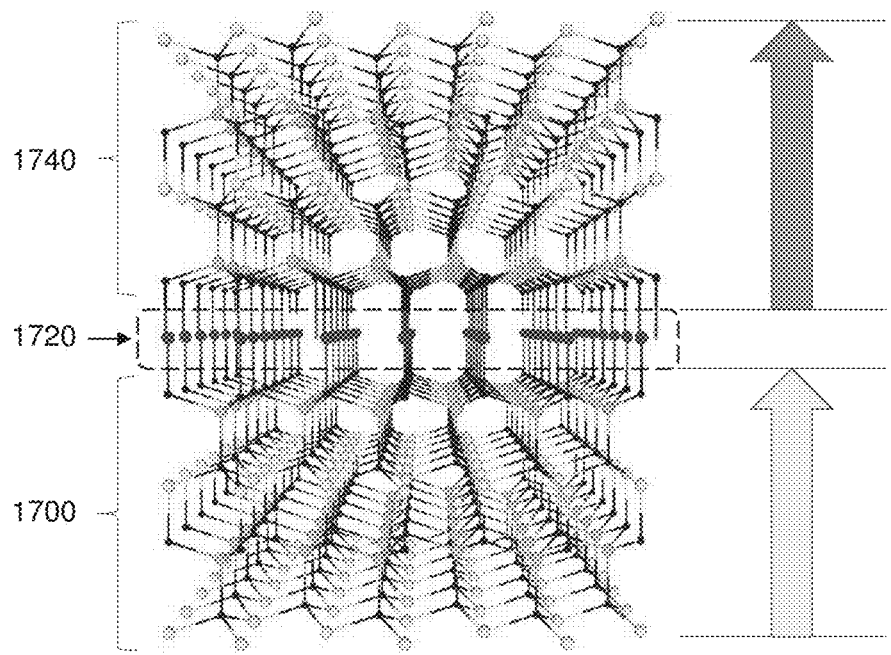
FIG. 16 illustrates polarization type flipping of a wurtzite ordered AlN/GaN superlattice using an interlayer chosen from atomic species of type X2+ or X4+.

FIG. 16 illustrates an intentionally flipped, but otherwise laterally homogeneous, polarity type of a III-N complex structure comprising a nitrogen polar region 1600, a polarity flip plane 1620, and a metal polar region 1640. The total structure may be engineered to contain a plurality of laterally disposed regions within the epitaxial growth sequence of substantially different polarity-type slabs. That is, a first polarity wz-III-N region is grown upon an initiating template. Then the final surface of the first polarity region is modified or engineered to result in an opposite polarity-type region for a second polarity wz-III-N region. A plurality of polarization-type regions can thus be formed by effectively flipping the polarity of each of the III-N distinctive slabs.

Polarity-type inversion of a final wz-III-N region surface is possible using a heavily saturated surface coverage of a surfactant type adatom. Geometric frustration is used to advantageously reconstruct the resulting surface which is favourable for achieving the desired polarity-type for the subsequently deposited III-N surface. Such polarity inversion of multilayered epitaxial structures exhibiting homogeneous polarity-type within a 2D III-N slab are advantageous for creating new device structures with improved performance over unipolarity-type epitaxial devices. For example, polarity flipping of surface layers can be used advantageously to lower Schottky barrier limitation of metal ohmic contacts to polar wz-III-N materials. The polarity-type flipped bilayer acts as a degenerately doped tunnel junction and improves the performance of III-N devices.

Polarization-type flipping structures can be extended to more complex structures forming inversion modulated structures which may further be periodic. Such structures can be used to either enhance the polar properties of devices or substantially reduce the in-built polarization fields. This presents a new method for producing non-polar materials using wurtzite films grown along the c-axis.

Figure 17:
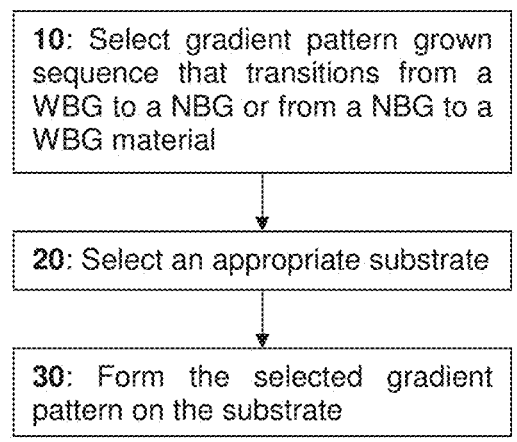
FIG. 17 illustrates a flow diagram of a method of forming a semiconductor structure.

FIG. 17 illustrates a broad flow diagram for forming semiconductor structures having a gradient region. First, a gradient pattern growth sequence is selected (step 10), then an appropriate substrate is selected (step 20), and finally the selected gradient pattern is formed on the substrate (step 30). The gradient pattern growth sequence is selected (step 10) such that it transitions from a WBG to a NBG or from a NBG to a WBG material along the grown axis (z). Additional layers, such as a buffer or dislocation filter region, may also be grown depending on the desired structure.

Figure 18A:
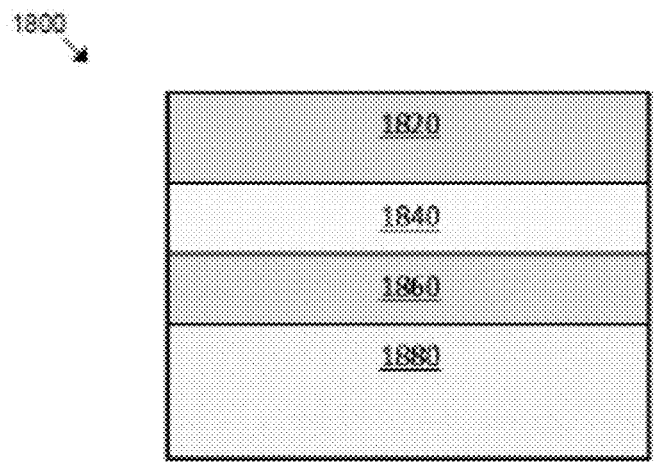
FIG. 18A illustrates a semiconductor structure.

FIG. 18A illustrates a semiconductor structure 1800 having an optional p-type GaN region in the form of a p-GaN contact region 1820, a p-type superlattice (p:SL) region 1840, an i-type superlattice (i:SL) region 1860, and an n-type superlattice (n:SL) region 1880. Each of the p:SL region 1840, the i:SL region 1860 and/or the n:SL region 1880 can be in the form of a SPSL.

The heterointerface between the i:SL region 1860 and the p:SL region 1840 or the p-GaN contact region 1820 is of particular concern because the electron mobility and injection efficiency is much higher than for holes, resulting in electron overshoot through the i:SL region 1860 and hence higher recombination near the i-p interface. This is confirmed experimentally by an optical emission feature at about 360 nm. Additionally, the high concentration of Mg dopants in the p:SL region 1840 can also act as non-radiative recombination sites. It has been found to be beneficial to shift the recombination towards the centre of the active region away from all non-radiative recombination sites by choosing specific superlattice compositions and grading/chirping superlattices to use the polarisation charges to modify the bandstructure.

Furthermore, electron penetration in prior art LED devices based on majority bulk-like and quantum well constructions is high, and is typically reduced by the introduction of electron blocking potential barriers on the p-side of the device. Electron blocking in the present method is achieved automatically by the conduction minibands and superstates above the AlN conduction edge due to the superlattice potential. The superlattice potential acts as an electron energy filter for transport across the device along the growth axis.

Figure 18B:
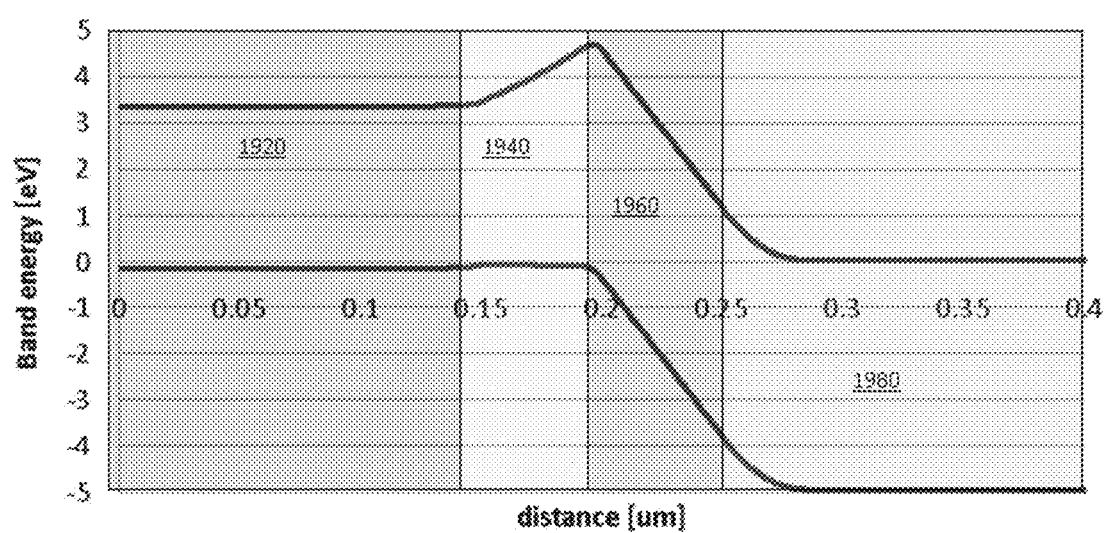
FIG. 18B illustrates a band energy structure for a device according to the semiconductor structure of FIG. 18A.

FIG. 18B illustrates an energy band structure for a semiconductor device 1800. The spatial energy band diagrams of FIGS. 18B-H represent the superlattice regions as their equivalent n=1 quantized eigenenergy transition and thus represents an equivalent ordered alloy of the SL.

Complex semiconductor structures formed of two or more contiguous semiconductor structures and/or semiconductor superlattices have been described above. In some embodiments, a first of the two or more contiguous semiconductor structures and/or semiconductor superlattices can have a larger change in composition along the growth axis and a second of the two or more contiguous semiconductor structures and/or semiconductor superlattices can have a smaller change in composition along the growth axis. For example, the first of the two or more contiguous semiconductor structures and/or semiconductor superlattices induces a heavy p-type conductivity, and the second of the two or more contiguous semiconductor structures and/or semiconductor superlattices induces a light p-type conductivity FIG. 18B shows the p:SL region 1840 is chirped or graded with a large change in composition (e.g. from $x_{ave}$=0.6 to 0) that results in heavy p-type polarisation doping of the entire p:SL region 1840, the i:SL region 1860 is chirped such that the composition decreases from bottom to top (e.g. from a composition $x_{ave}$=0.66 to 0.6) that induces light p-type bulk polarisation doping over the intrinsic region to compensate for low hole injection efficiency; and the n:SL region 1880 has a high Al content (e.g. a 1 ML GaN:2 ML AlN SL with a uniform composition of $x_{ave}$=0.66).

There are no abrupt changes in composition at any of the interfaces between regions which eliminates any polarisation induced sheet charges, eliminates barriers due to band offsets, and can also result in higher quality interfaces since there are no abrupt changes in lattice constant. The polarisation doping density in the p:SL and i:SL regions can be changed either by changing the total thickness of the region, or by changing the composition at their interface. For example, changing the composition at the i:SL/p:SL interface to 0.5 (from 0.6) will increase the p-type doping in the i:SL region and decrease it in the p:SL region. Decreasing the thickness of the p:SL region (to 25 nm for example) will increase the doping density in the p:SL region without changing the i:SL region.

Figure 18C:
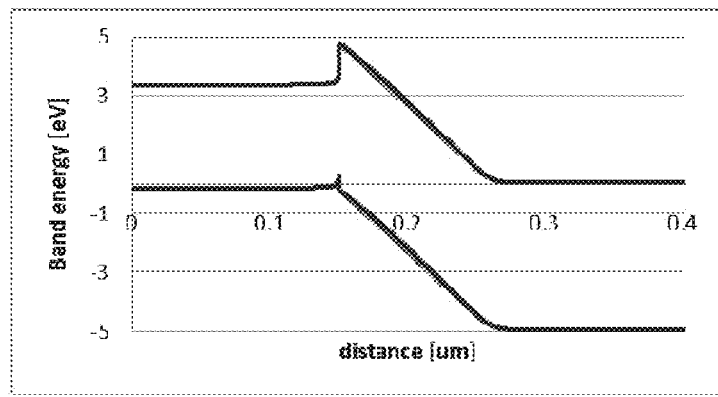
FIG. 18C illustrates a band energy structure for another device according to the semiconductor structure of FIG. 18A.

FIG. 18C illustrates an energy band structure for a semiconductor device 1800 wherein the p:SL region 1840 is uniform (e.g. $x_{ave}$=0.66), the i:SL region 1860 is uniform (e.g. $x_{ave}$=0.66), and the n:SL region 1880 is uniform (e.g. $x_{ave}$=0.66). Since all the superlattice regions have the same composition there are no polarisation effects, except for at the p:SL/p-GaN interface. A benefit of this design is that the p:SL and i:SL regions are lattice matched (i.e., the in-plane lattice constants of the unit cells comprising the strained layers are equal) and thus there are fewer defects at this interface to act as non-radiative recombination sites. Compared with strong p-type polarisation doping at the p:SL/p-GaN interface, the doping in the p:SL region has relatively little effect, as shown in FIG. 18C.

Figure 18D:
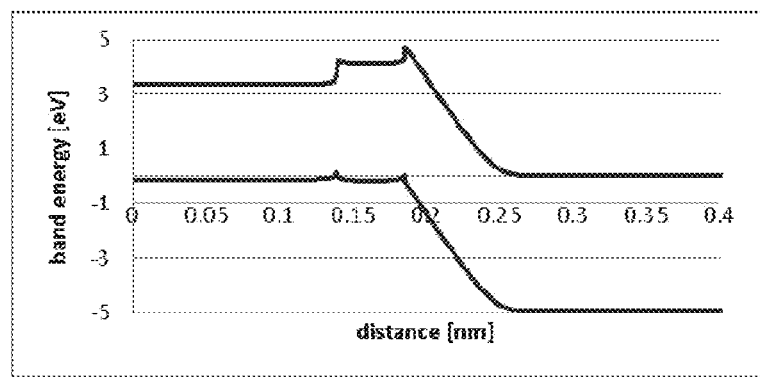
FIG. 18D illustrates a band energy structure for a device according to the semiconductor structure of FIG. 18A.

FIG. 18D illustrates an energy band structure for a semiconductor device 1800 wherein the p:SL region 1840 is uniform (e.g. $x_{ave}$=0.2), the i:SL region 1860 is uniform (e.g. $x_{ave}$=0.66), and the n:SL region 1880 is uniform (e.g. $x_{ave}$=0.66). The composition of the p:SL region 1840 is lower than the i:SL region 1860 (e.g. a 2 ML GaN:4 ML AlN i:SL and 6 ML GaN:2 ML AlN p:SL), resulting in p-type polarisation doping of the i:SL/p:SL and p:SL/p-GaN interfaces which pins the valence band above the Fermi energy level at either side of the p:SL region 1840 as shown in FIG. 18D. This causes a hole reservoir to form at the i:SL/p:SL interface. There is still some change in the in-plane lattice constant between these unit cells, unlike in the form illustrated in FIG. 18C, but the p-type polarisation doping of the p:SL region 1840 can be more beneficial than a fully lattice matched p:SL region 1840. The case above will have the p:SL in a state of compression.

Figure 18E:
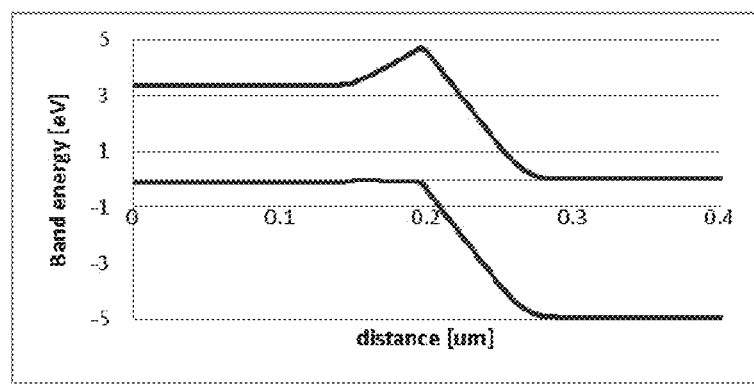
FIG. 18E illustrates a band energy structure for a device according to the semiconductor structure of FIG. 18A.

FIG. 18E illustrates an energy band structure for a semiconductor device 1800 wherein the p:SL region 1840 is chirped (e.g. $x_{ave}$=0.66-0), the i:SL region 1860 is uniform (e.g. $x_{ave}$=0.66), and the n:SL region 1880 is uniform (e.g. $x_{ave}$=0.66). Chirping or grading of the p:SL region 1840 between the i:SL 1860 region and the p-type GaN region 1820 causes bulk p-type polarisation doping of the p:SL region 1840, rather than sheet charges at each of the interfaces which increase the p-type conductivity through the p:SL region 1840 and improve the hole injection. It also has the benefit of eliminating band discontinuities at the i:SL/p:SL and p:SL/p:GaN interfaces which further increases hole injection efficiency. This can reduce the dislocation density at the i:SL/p:SL heterointerface, though the entire p:SL region 1840 since there is no abrupt change in lattice constant.

P-type polarisation doping in the p:SL region 1840 is very high (~5×10$^{18}$ cm$^3$) and that the bandstructure and hole concentrations are almost identical whether the p:SL region 1840 is intentionally doped with Mg or not. Thus, a variation on this design removes the intentional Mg doping in the chirped p:SL region 1840 and it is grown essentially as an intrinsic or not-intentionally doped region. To avoid confusion, this region is called an induced p:SL region since it is still polarisation doped p-type. The polarisation induced doping density is dependent on the change in composition and the distance over which the region is graded. So, if the composition change is fixed by the regions on either side, then the doping density can be increased by reducing the thickness of the graded region. This design has the benefit of removing the Mg impurity dopants from near the recombination region which can increase mobility and reduce non-radiative recombination. In general, Mg doping of a p:SL does not achieve as high structural quality as n:SL and i:SL, since the p:SL must be grown nitrogen-rich to allow Mg dopants to incorporate substitutionally and results in atomically rough layers. If the p:SL region 1840 can be grown without requiring Mg then its structural quality can be improved and thus increase advantageously the desired device performance.

Figure 18F:
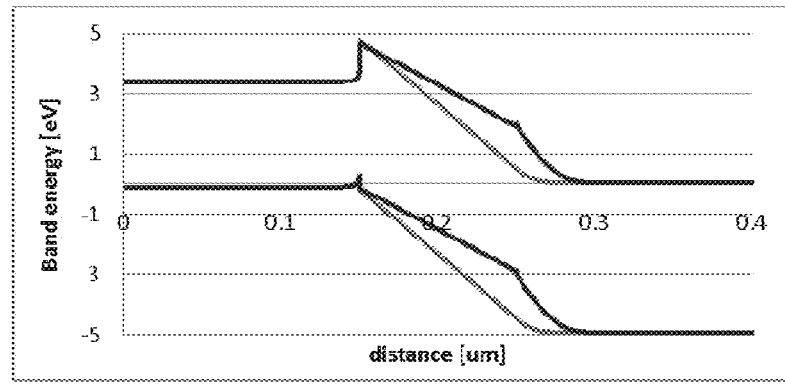
FIG. 18F illustrates a band energy structure for a device according to the semiconductor structure of FIG. 18A.

FIG. 18F illustrates an energy band structure for a semiconductor device 1800 wherein the p:SL region 1840 is uniform (e.g. $x_{ave}$=0.6), the i:SL region 1860 is uniform (e.g. $x_{ave}$=0.6), and the n:SL region 1880 is uniform (e.g. $x_{ave}$=0.66). It is compared with a lattice matched structure as illustrated in FIG. 18C. The i:SL region 1860 composition is chosen to be lower than the n:SL region 1880. The lower i:SL region 1860 composition causes p-type polarisation doping of the n:SL/i:SL interface which raises the energy bands in the intrinsic region and increases the intrinsic region hole concentration as shown in FIG. 18F. This is a simplification of chirped i:SL region structures but achieves a similar result of increasing the hole concentration in the intrinsic region. This enables a simpler growth as the layers are all uniform.

Figure 18G:
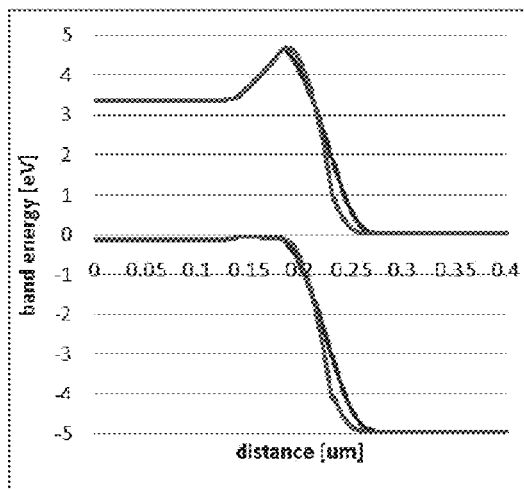
FIG. 18G illustrates a band energy structure for a device according to the semiconductor structure of FIG. 18A.
Figure 18H:
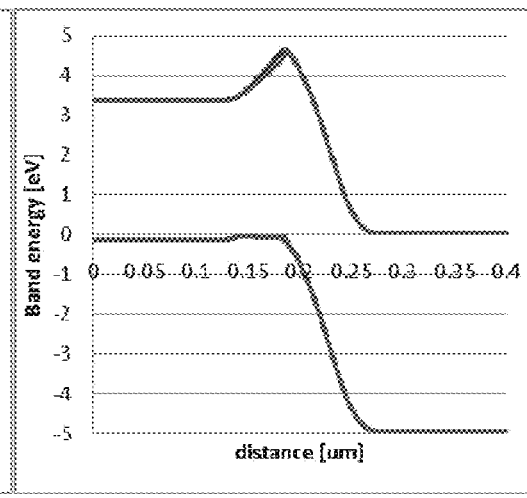
FIG. 18H illustrates a band energy structure for a device according to the semiconductor structure of FIG. 18A.

FIGS. 18G and 18H illustrate band energy structures for a semiconductor device 1800 wherein the p:SL region 1840 is chirped (e.g. $x_{ave}$=0.5-0.1), the i:SL region 1860 is chirped (e.g. $x_{ave}$=0.7-0.6), and the n:SL region 1880 is uniform (e.g. x=0.66). FIG. 18G has 2D polarisation sheet charges intentionally introduced at the n:SL/i:SL interface and FIG. 18H 2D polarisation sheet charges intentionally introduced at the i:SL/p:SL interface. A small composition change at one or more of the interfaces is introduced to induce sheet polarisation charges. For example, if the top of the i:SL region 1860 has a composition of 0.6 and the bottom of the p:SL region 1840 has a composition of 0.5, the interface will be p-type polarisation doped which can induce a two dimensional hole gas (2DHG). Likewise, if the bottom of the i:SL region 1860 has a composition of 0.7 on a 66% n:SL region 1880 (i.e. $x_{ave}$=0.66) a small n-type sheet charge will be induced. This heavy sheet doping can be useful to provide reservoirs of carriers to improve injection efficiency and to reduce carrier overshoot. It can also improve current spreading due to high lateral mobility in the 2DHG.

Other variations of the semiconductor structure 1800 can be implemented as well. For example, a uniform p:SL region 1840 can be grown and only the i:SL region chirped to lightly induce p-type polarisation, for example from $x_{ave}$=0.66 to $x_{ave}$=0.55. A chirp in the opposite direction (i.e. from high Ga content to low Ga content) can induce n-type polarisation doping instead of p-type. This may be used at the top of the n:SL region 1880 to provide a very heavily doped layer to act as an electron reservoir. An n-type polarisation chirp may also be useful to heavy dope a layer buried in the n:SL region 1880 for a lateral current spreading layer, or to provide a highly doped region for ohmic contact formation.

The p-GaN is considered optional, and contact can be directly to the p:SL region 1840. This can significantly increase the light extraction efficiency if the p:SL region 1840 is chosen to be transparent at the operating wavelength and the p-contact is reflective. For chirped p:SL, the grading of the average alloy composition can be simply terminated at a composition which is still sufficiently transparent, for example $x_{ave}$=0.4, and contacted directly. However, this could reduce the composition range over which the chirp can be performed and thus reduce the potential polarisation doping.

The invention advantageously provides semiconductor structures that have broad applications, particularly in relation to DUV LEDs. For example, the invention advantageously overcomes, or at least reduces, many of the constraints that limit commercial development of DUV LEDs.

Although the invention has primarily been described with respect to diodes, and LEDs which are a preferred embodiment of the invention, it will be appreciated that, where the context permits, other semiconductor structures and devices could be constructed.

In this specification, the term "superlattice" refers to a layered structure comprising a plurality of repeating unit cells including two or more layers, where the thickness of the layers in the unit cells is small enough that there is significant wavefunction penetration between corresponding layers of adjacent unit cells such that quantum tunneling of electrons and/or holes can readily occur.

In this specification, adjectives such as first and second, left and right, top and bottom, and the like may be used solely to distinguish one element or action from another element or action without necessarily requiring or implying any actual such relationship or order. Where the context permits, reference to an integer or a component or step (or the like) is not to be interpreted as being limited to only one of that integer, component, or step, but rather could be one or more of that integer, component, or step etc.

The above description of various embodiments of the present invention is provided for purposes of description to one of ordinary skill in the related art. It is not intended to be exhaustive or to limit the invention to a single disclosed embodiment. As mentioned above, numerous alternatives and variations to the present invention will be apparent to those skilled in the art of the above teaching. Accordingly, while some alternative embodiments have been discussed specifically, other embodiments will be apparent or relatively easily developed by those of ordinary skill in the art. The invention is intended to embrace all alternatives, modifications, and variations of the present invention that have been discussed herein, and other embodiments that fall within the spirit and scope of the above described invention.

In this specification, the terms 'comprises', 'comprising', 'includes', 'including', or similar terms are intended to mean a non-exclusive inclusion, such that a method, system or apparatus that comprises a list of elements does not include those elements solely, but may well include other elements not listed.

The reference to any prior art in this specification is not, and should not be taken as, an acknowledgement or any form of suggestion that the prior art forms part of the common general knowledge.

What is claimed is:

1. A method of forming a light emitting diode (LED) structure, the method comprising:
   growing along a growth axis, between a wider band gap (WBG) n-type region and a narrower band gap (NBG) p-type region, a semiconductor structure having a polar crystal structure in which a spontaneous polarization axis is parallel to the growth axis, the semiconductor structure comprising a semiconductor that changes in composition monotonically from a wider band gap (WBG) material adjacent the WBG n-type region to a narrower band gap (NBG) material adjacent the NBG p-type region.

2. A method of forming a light emitting diode (LED) structure, the method comprising:
   growing along a growth axis, between a wider band gap (WBG) n-type region and a narrower band gap (NBG) p-type region, a superlattice comprising a plurality of unit cells each comprising at least two distinct layers formed of a substantially single crystal semiconductor, the superlattice having a polar crystal structure in which a spontaneous polarization axis is parallel to the growth axis, and the unit cells changing in average composition monotonically from an average composition corresponding to a wider band gap (WBG) material in a unit cell adjacent the WBG n-type region to an average composition corresponding to a narrower band gap (NBG) material in a unit cell adjacent the NBG p-type region.

3. The method of claim 2, wherein a buffer or dislocation filter region is grown on a substrate preceding the WBG n-type region or NBG p-type region.

4. The method of claim 3, wherein:
   the substrate is selected as a sapphire ($Al_2O_3$) substrate or an aluminium nitride (AlN) substrate if the WBG n-type region is grown before the NBG p-type region; or
   the substrate is selected as a silicon substrate or a gallium nitride (GaN) substrate if the NBG p-type region is grown before the WBG n-type region.

* * * * *